United States Patent
Mitsuyoshi et al.

(10) Patent No.: US 8,851,821 B2
(45) Date of Patent: Oct. 7, 2014

(54) SUBSTRATE PROCESSING APPARATUS AND SUBSTRATE CONVEYING APPARATUS FOR USE IN THE SAME

(75) Inventors: Ichiro Mitsuyoshi, Kyoto (JP); Ryo Muramoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 703 days.

(21) Appl. No.: 12/557,097

(22) Filed: Sep. 10, 2009

(65) Prior Publication Data

US 2010/0068014 A1 Mar. 18, 2010

(30) Foreign Application Priority Data

Sep. 12, 2008 (JP) .................................. 2008-234273
Sep. 12, 2008 (JP) .................................. 2008-234274
Jul. 14, 2009 (JP) .................................. 2009-165681

(51) Int. Cl.

| H01L 21/677 | (2006.01) |
|---|---|
| B65G 49/06 | (2006.01) |
| H01L 21/673 | (2006.01) |
| H01L 21/687 | (2006.01) |

(52) U.S. Cl.
CPC ........ H01L 21/67781 (2013.01); B65G 49/061 (2013.01); B65G 49/067 (2013.01); H01L 21/67313 (2013.01); H01L 21/67766 (2013.01); H01L 21/68707 (2013.01); Y10S 414/138 (2013.01)
USPC .................. 414/416.08; 414/416.11; 414/938

(58) Field of Classification Search
USPC ........... 414/416.02, 416.08, 416.11, 404, 938
See application file for complete search history.

(56) References Cited

U.S. PATENT DOCUMENTS

| 5,562,387 | A | 10/1996 | Ishii et al. |
|---|---|---|---|
| 5,655,871 | A | 8/1997 | Ishii et al. |
| 6,009,890 | A | 1/2000 | Kaneko et al. |
| 6,345,947 | B1 * | 2/2002 | Egashira .................. 414/225.01 |
| 7,404,409 | B2 * | 7/2008 | Kamikawa .................... 134/125 |
| 8,002,511 | B2 * | 8/2011 | Kamikawa et al. ...... 414/416.02 |
| 8,033,288 | B2 * | 10/2011 | Shiomi et al. ................... 134/66 |
| 2001/0049204 | A1 | 12/2001 | Kuroda |
| 2002/0081181 | A1 | 6/2002 | Yokomori et al. |
| 2003/0164179 | A1 | 9/2003 | Kamikawa et al. |
| 2004/0052626 | A1 | 3/2004 | Oem et al. |
| 2006/0137721 | A1 | 6/2006 | Kuroda |

(Continued)

FOREIGN PATENT DOCUMENTS

| JP | 6-177224 | 6/1994 |
|---|---|---|
| JP | 7-106402 | 4/1995 |

(Continued)

*Primary Examiner* — Jonathan Snelting
(74) *Attorney, Agent, or Firm* — Ostrolenk Faber LLP

(57) ABSTRACT

A substrate processing apparatus includes a substrate processing section that processes a plurality of substrates assuming a vertical posture in a batch manner; a first traversing mechanism that laterally moves a first traverse holding portion along a first traversing path between a substrate transfer position and a substrate delivery position; a second traversing mechanism that laterally moves a second traverse holding portion along a second traversing path disposed below the first traversing path between the substrate transfer position and the substrate delivery position; an elevation mechanism that raises and lowers an elevation holding portion in the substrate transfer position; and a main transfer mechanism that conveys a plurality of substrates assuming a vertical posture in a batch manner between the substrate delivery position and the substrate processing section, the first and second traverse holding portions, and the elevation holding portion each holds a plurality of substrates assuming a vertical posture in a batch manner.

13 Claims, 33 Drawing Sheets

(56) References Cited

U.S. PATENT DOCUMENTS

| | | |
|---|---|---|
| 2006/0137726 A1 | 6/2006 | Sano et al. |
| 2007/0238062 A1 | 10/2007 | Asari et al. |
| 2007/0243048 A1 | 10/2007 | Bachrach |
| 2008/0216880 A1 | 9/2008 | Shiomi et al. |

FOREIGN PATENT DOCUMENTS

| | | |
|---|---|---|
| JP | 10-144764 | 5/1998 |
| JP | 11-165863 | 6/1999 |
| JP | 11-214470 | 8/1999 |
| JP | 11-354604 | 12/1999 |
| JP | 2001-274232 | 10/2001 |
| JP | 2002-198414 | 7/2002 |
| JP | 2003-257923 | 9/2003 |
| JP | 2004-88115 | 3/2004 |
| JP | 2004-106167 | 4/2004 |
| JP | 2004-281821 | 10/2004 |
| JP | 2007-251087 | 9/2007 |
| JP | 2008-103734 | 5/2008 |
| JP | 2011-238945 | 11/2011 |

* cited by examiner

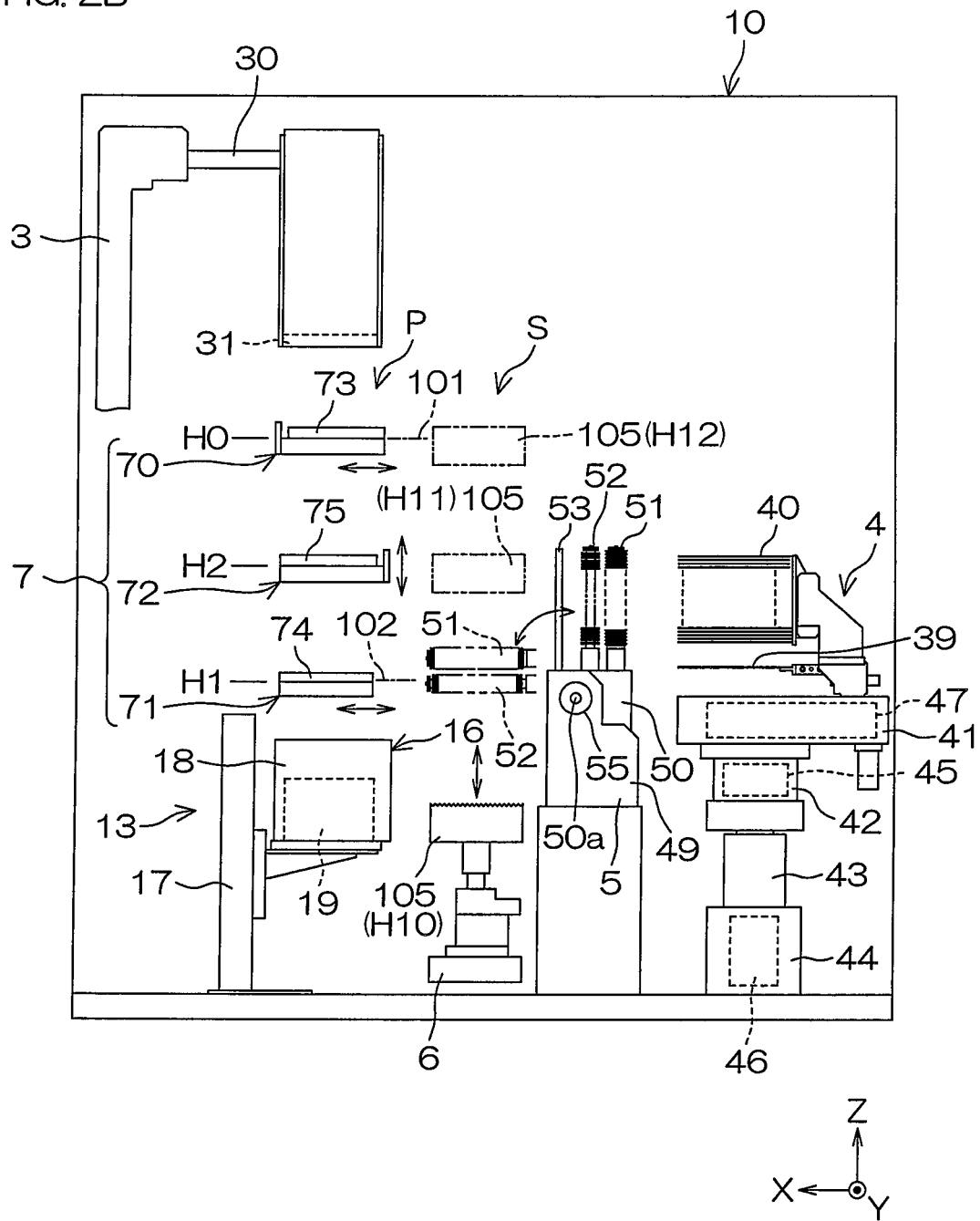

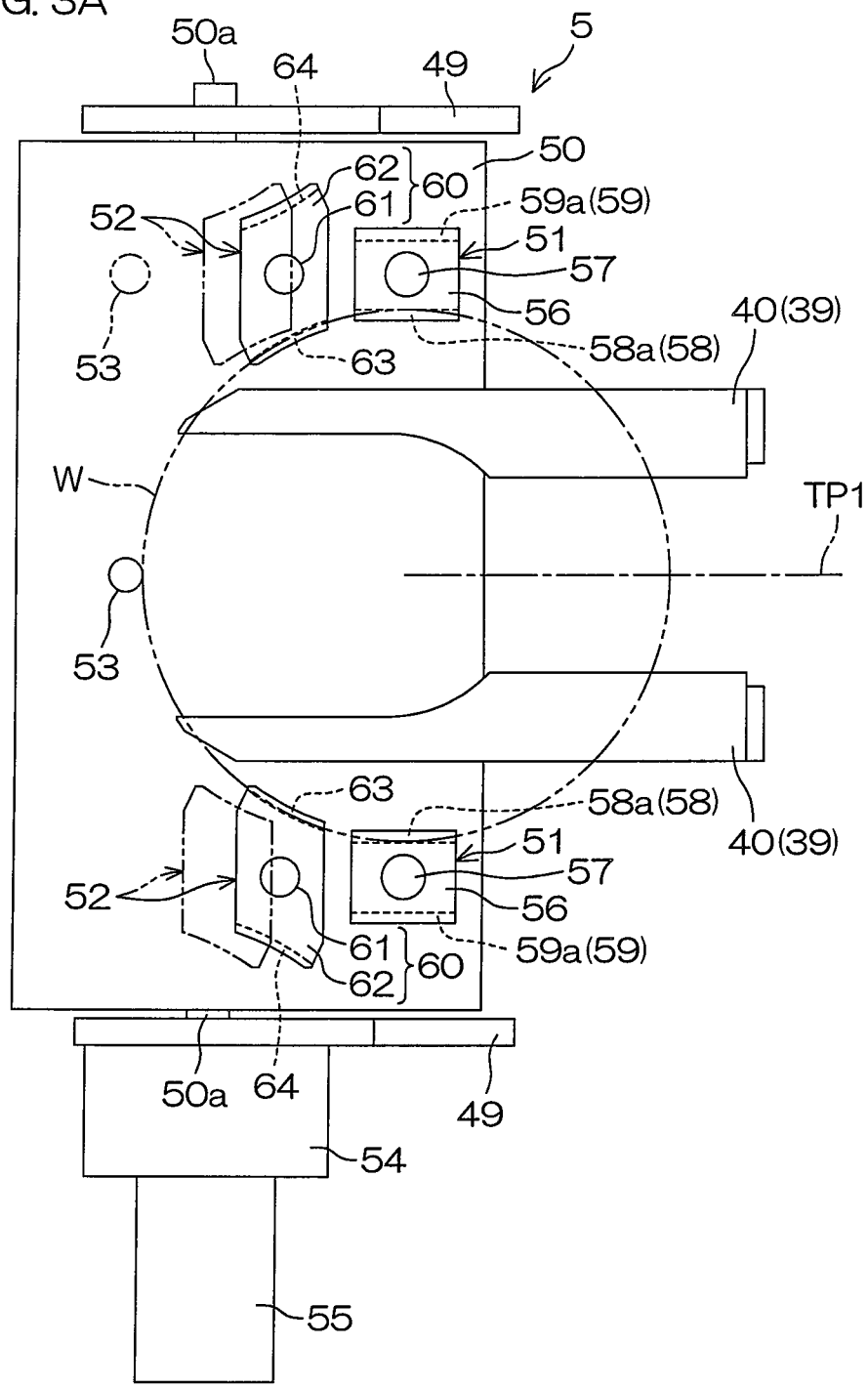

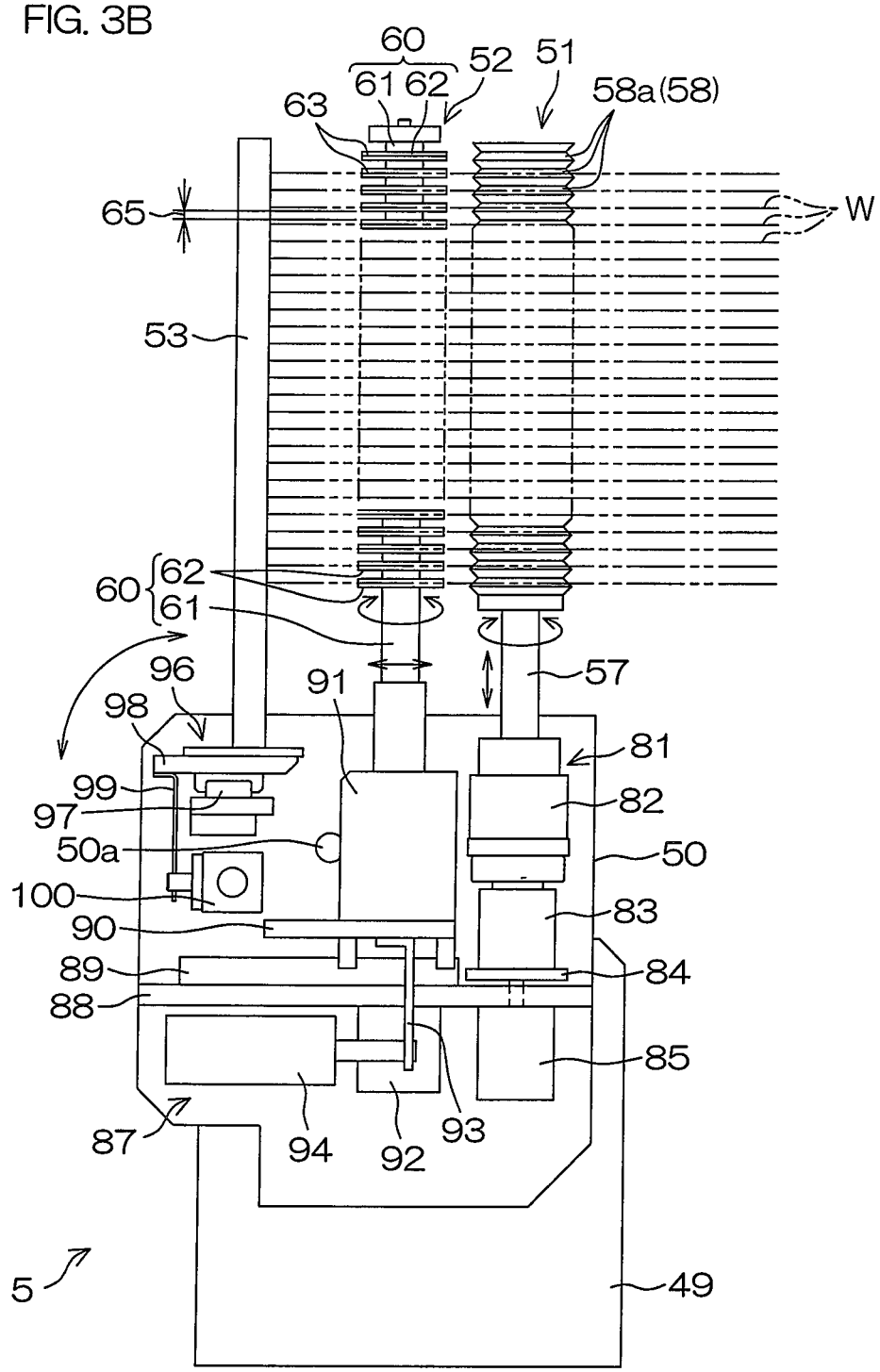

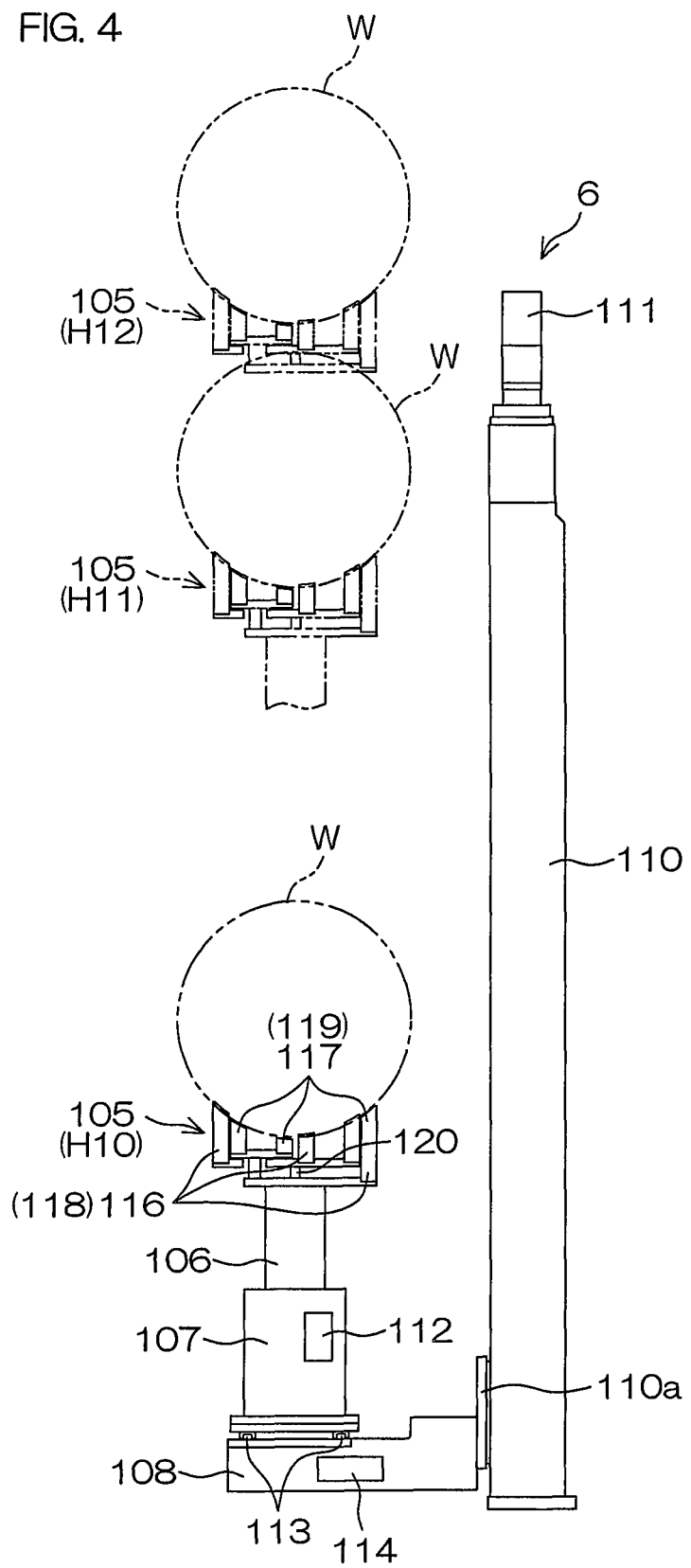

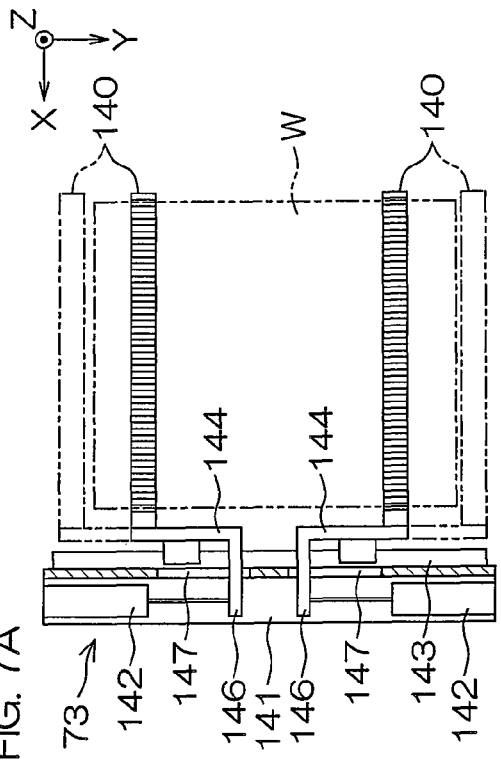
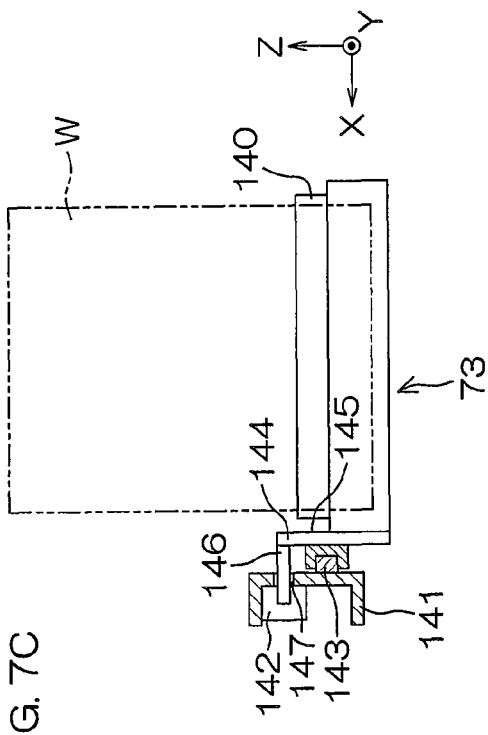
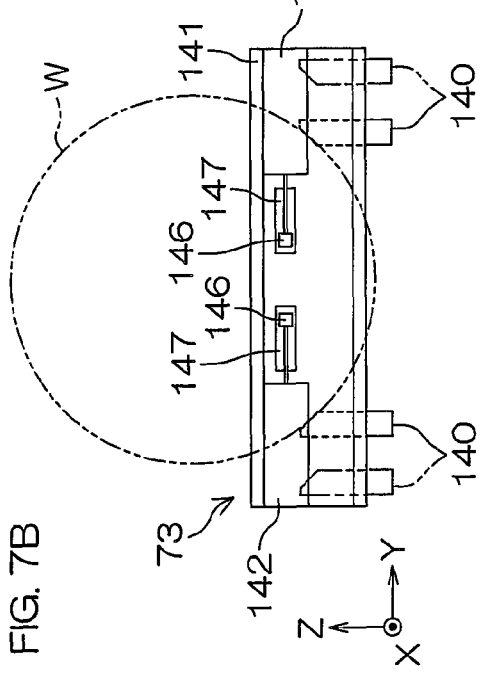

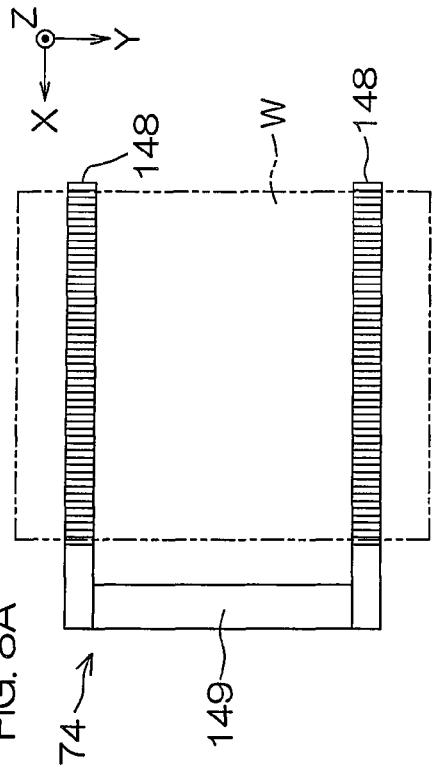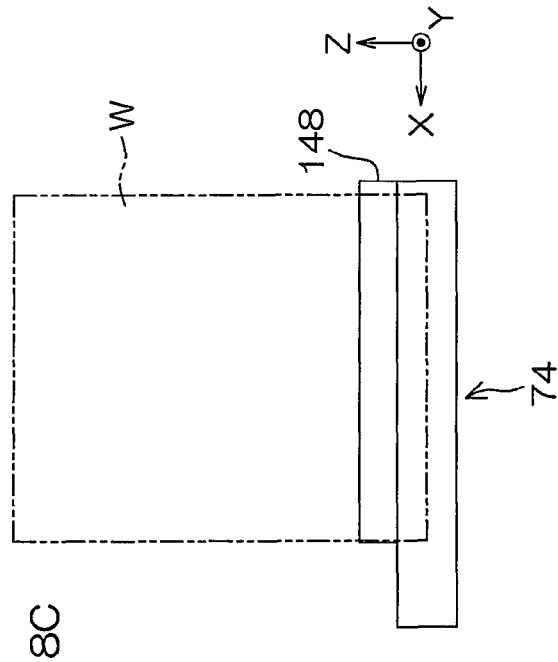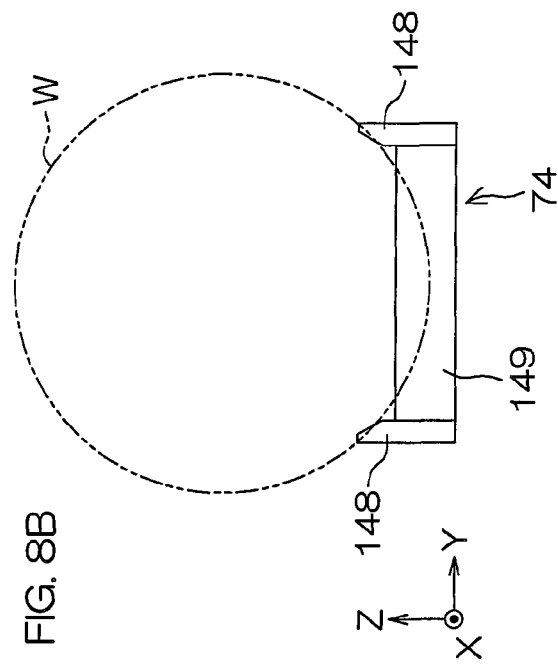

FIG. 11C
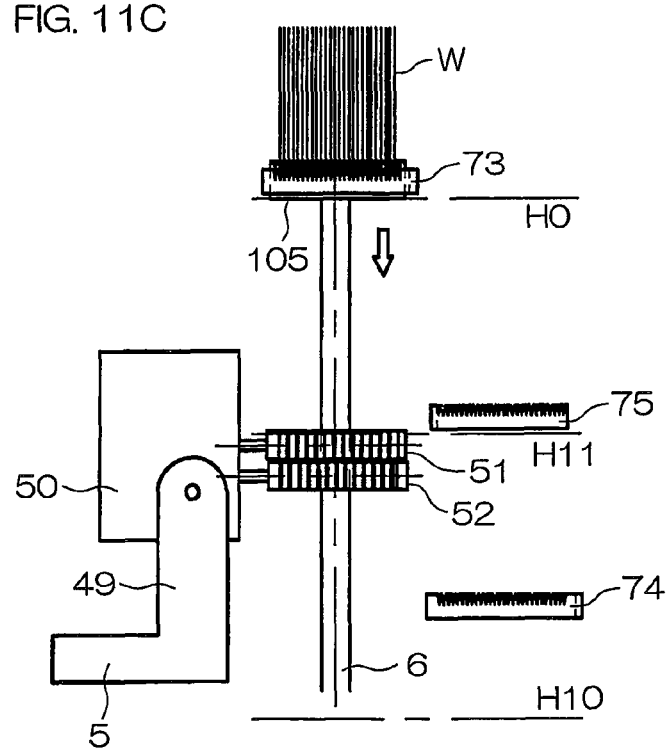
FIG. 11D
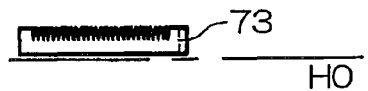
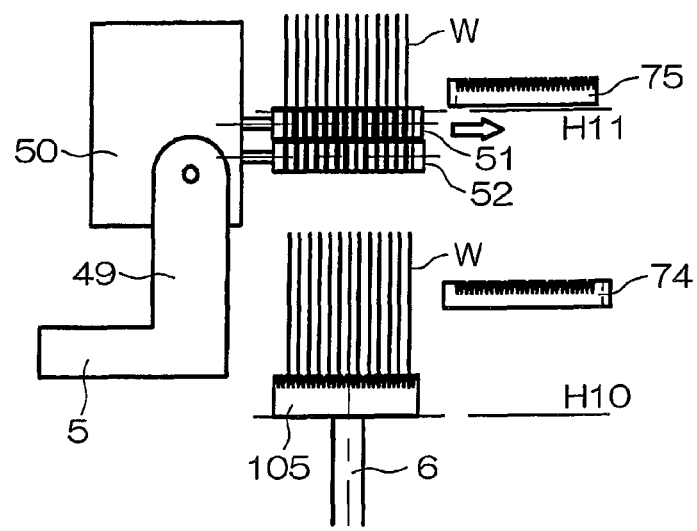

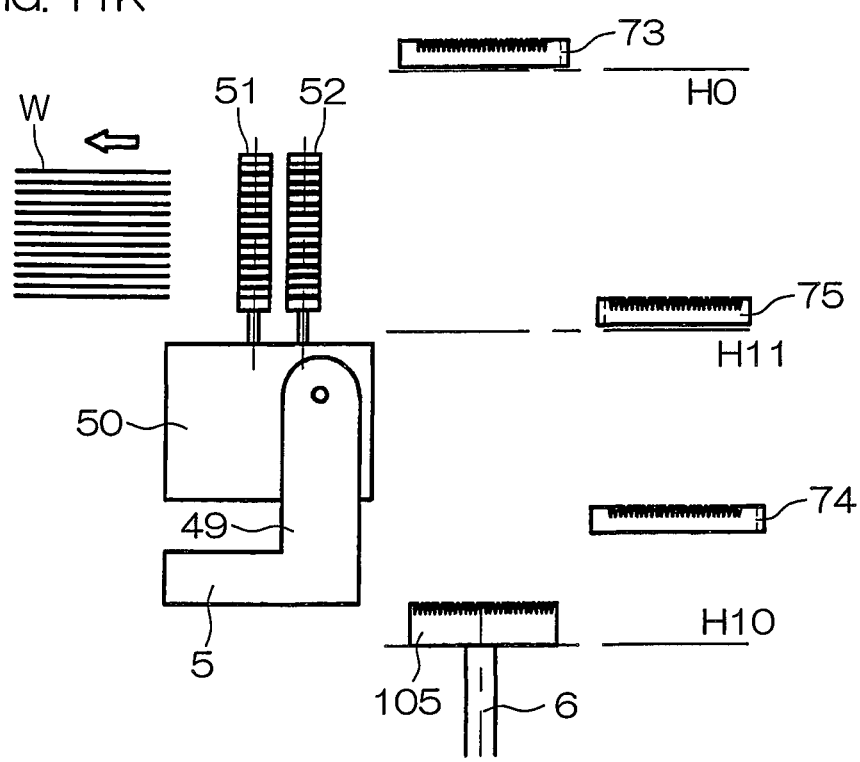

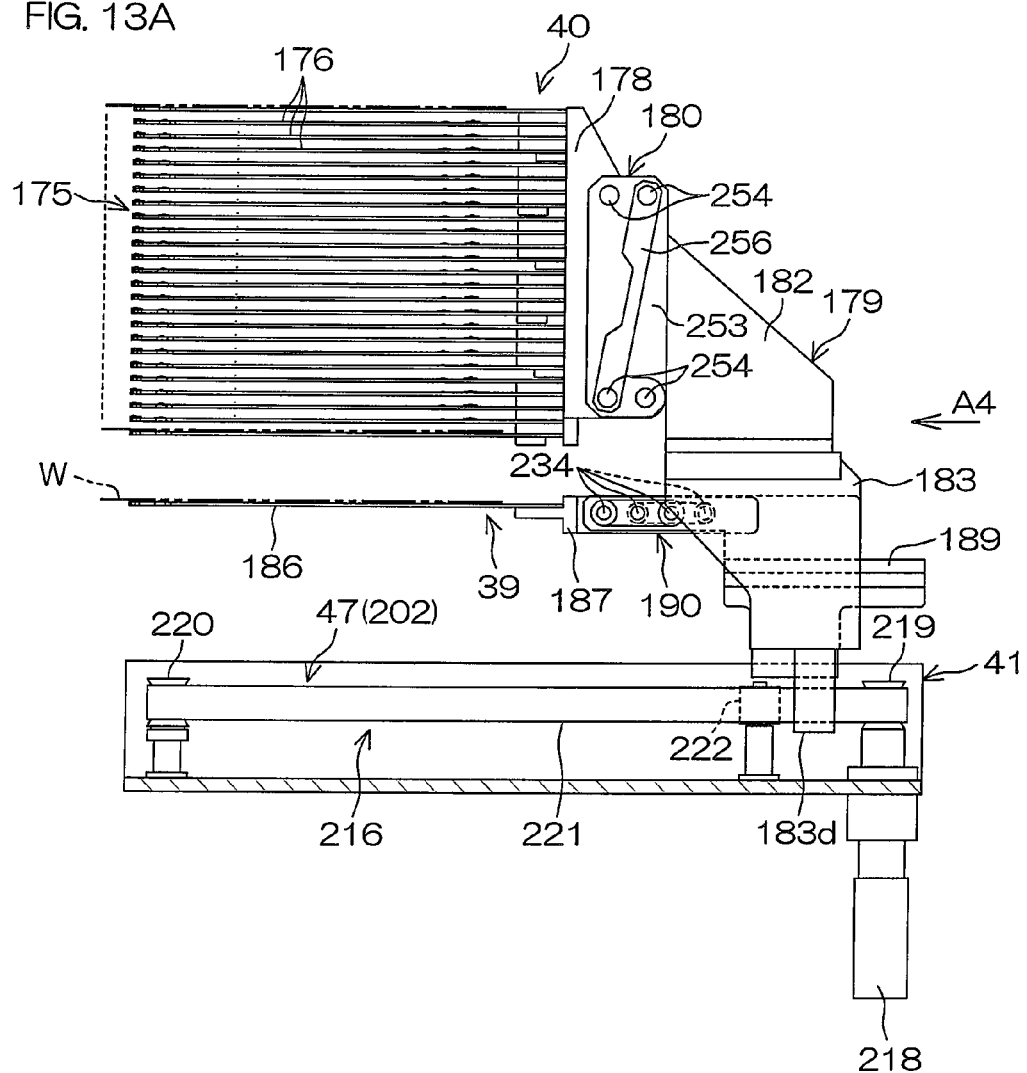

SUBSTRATE PROCESSING APPARATUS AND SUBSTRATE CONVEYING APPARATUS FOR USE IN THE SAME

BACKGROUND OF THE INVENTION

1. Field of the Invention

This invention relates to a substrate processing apparatus that applies processing onto a plurality of substrates in a batch manner and a substrate conveying apparatus installed in such a substrate processing apparatus. Examples of substrates to be processed or to be conveyed include semiconductor wafers, substrates for liquid crystal displays, substrates for plasma displays, substrates for FEDs (Field Emission Displays), substrates for optical disks, substrates for magnetic disks, substrates for magnet-optical disks, and substrates for photomasks.

2. Description of Related Art

A batch type substrate processing apparatus that applies processing onto a plurality of substrates in a batch manner has been used as a substrate processing apparatus that applies processing using a chemical solution onto substrates such as semiconductor wafers. An example of such a batch type apparatus is disclosed in Japanese Unexamined Patent Application Publication No. H11-354604 (1999). This substrate processing apparatus includes a carrier disposing unit, a horizontally transferring robot, a posture changing mechanism, a pusher, a main transfer mechanism, and a substrate processing unit.

The carrier disposing unit provides a place for a carrier to be placed. A carrier holds a plurality of substrates piled in a vertical direction each of which assumes a horizontal posture.

The horizontally transferring robot is a vertical articulated arm type conveying robot, and is formed so as to extend and contract an articulated arm and to rotate the articulated arm around a vertical axis line. Accordingly, the horizontally transferring robot directs the articulated arm toward the carrier, and transfers the substrates piled in the vertical direction each of which assumes a horizontal posture into and from the carrier. Furthermore, the horizontally transferring robot directs the articulated arm toward the posture changing mechanism, and delivers the substrates piled in the vertical direction each of which assumes a horizontal posture to and from the posture changing mechanism.

The horizontally transferring robot has a batch hand and a one-by-one hand that are detachable from the articulated arm. The batch hand is used to transfer a plurality of substrates in a batch manner, whereas the one-by-one hand is used to transfer substrates one by one. The hands are exchanged for each other by allowing the horizontally transferring robot to access a hand exchange unit. The hand exchange unit has three hand holders that hold the batch hand, the one-by-one hand used for not-yet-processed substrates, and the one-by-one hand used for processed substrates, respectively. For example, when the batch hand is detached therefrom, and, instead, the one-by-one hand is attached thereto, the horizontally transferring robot operates to store the batch hand in the batch hand holder and to attach the one-by-one hand placed in the one-by-one hand holder to the articulated arm. Therefore, it is possible to automatically exchange the hands for each other without requiring manpower.

The posture changing mechanism is used to change the posture of the substrates piled together in a batch manner from a horizontal posture to a vertical posture or vice versa.

The pusher has a holder capable of moving in upward, downward, and horizontal directions, and delivers the substrates assuming a vertical posture in a batch manner to and from the posture changing mechanism, and delivers the substrates assuming a vertical posture in a batch manner to and from the main transfer mechanism. The holder holds the substrates with a pitch which is half as large as that of the substrates held by the posture changing mechanism. For example, twenty-five substrates are delivered from the posture changing mechanism to the holder, and then the holder is moved by a slight distance in a horizontal direction along a direction in which the substrates are piled. In this state, another twenty-five substrates are delivered from the posture changing mechanism to the holder. The twenty-five substrates that have been delivered later are allowed to enter the spaces between the twenty-five substrates that have been delivered earlier, and, as a result, a batch of substrates the number of which is fifty in total are formed on the holder. The process of forming a batch by gathering groups of substrates together in this way is called "batch organization." When the substrates are delivered from the pusher to the posture changing mechanism, twenty-five of the fifty substrates held by the holder are delivered to the posture changing mechanism, are then changed to assume a horizontal posture, and are delivered to the horizontally transferring robot. Thereafter, the remaining twenty-five substrates held by the holder are delivered to the posture changing mechanism, are then changed to assume a horizontal posture, and are expelled by the horizontally transferring robot. The fifty substrates are thus separated into two substrate groups each of which has twenty-five substrates. The process of separating a plurality of substrates forming a batch into a plurality of substrate groups in this way is called "batch disorganization."

The main transfer mechanism has a substrate chuck that holds a plurality of substrates forming a batch in a vertical posture, and transfers the substrates forming a batch to and from the substrate processing unit by moving the substrate chuck in a horizontal direction. To wash the substrate chuck, a chuck washing unit is disposed, for example, under a position in which substrate delivery is performed between the pusher and the main transfer mechanism.

The substrate processing unit has a plurality of processing portions disposed along a direction along which the main transfer mechanism is moved. A chemical bath, a water washing bath, and a drying portion are included in the processing portions. The chemical bath is used to immerse a plurality of substrates assuming a vertical posture in a chemical stored in the bath and to apply chemical processing onto the substrates in a batch manner. The water washing bath is used to immerse a plurality of substrates assuming a vertical posture in deionized water stored in the bath and to apply water-washing (rinsing) processing onto the substrates in a batch manner. The drying portion may apply organic-solvent (e.g., isopropyl alcohol) supply processing or liquid-shaking-off processing onto the substrates in a batch manner, for example.

The substrate processing apparatus according to the prior art mentioned above has a single substrate-conveying-path system from the pusher to the main transfer mechanism. Therefore, when not-yet-processed substrates are sent to the main transfer mechanism, already-processed substrates cannot be expelled from the main transfer mechanism to the pusher, and, when already-processed substrates are expelled therefrom, not-yet-processed substrates cannot be sent thereto. Additionally, when the not-yet-processed substrates are sent to the main transfer mechanism, a batch organization operation is required on the holder of the pusher. Therefore, there is a case in which the main transfer mechanism is compelled to remain on standby for a long time until the already-processed substrates are expelled therefrom.

A possible solution may be to provide another pusher so that one pusher is used for forward-path conveyance from the posture changing mechanism to the main transfer mechanism whereas the other pusher is used for return-path conveyance from the main transfer mechanism to the posture changing mechanism. However, a structure formed according to this possible solution inevitably cause an increase in the footprint of the apparatus.

SUMMARY OF THE INVENTION

An object of the present invention is to provide a substrate processing apparatus capable of improving a substrate processing speed while controlling the footprint of the apparatus.

Another object of the present invention is to provide a substrate conveying apparatus capable of shortening a time required for switching between batch conveyance in which a plurality of substrates are conveyed in a batch manner and one-by-one conveyance in which a substrate is conveyed one at a time and yet capable of simplifying the structure of the apparatus. Still another object of the present invention is to provide a substrate processing apparatus provided with such a substrate conveying apparatus.

The substrate processing apparatus according to an aspect of the present invention includes a substrate processing section that processes a plurality of substrates assuming a vertical posture in a batch manner; a first traversing mechanism that laterally moves a first traverse holding portion along a first traversing path between a substrate transfer position and a substrate delivery position, the first traverse holding portion holding a plurality of substrates assuming a vertical posture in a batch manner; a second traversing mechanism that laterally moves a second traverse holding portion along a second traversing path disposed below the first traversing path between the substrate transfer position and the substrate delivery position, the second traverse holding portion holding a plurality of substrates assuming a vertical posture in a batch manner; an elevation mechanism that raises and lowers an elevation holding portion in the substrate transfer position, the elevation holding portion holding a plurality of substrates assuming a vertical posture in a batch manner; and a main transfer mechanism that conveys a plurality of substrates assuming a vertical posture in a batch manner between the substrate delivery position and the substrate processing section.

According to this structure, substrate conveyance between the substrate transfer position and the substrate delivery position is performed by the first traversing mechanism and the second traversing mechanism while following the first and second traversing paths disposed to lie on each other in the up- and down direction. In other words, substrate conveyance between the substrate transfer position and the substrate delivery position can be performed through the two different conveying paths. Accordingly, substrate conveyance from the substrate transfer position to the substrate delivery position can be performed by one of the first traversing mechanism and the second traversing mechanism, whereas substrate conveyance from the substrate delivery position to the substrate transfer position can be performed by the other traversing mechanism.

For example, processed substrates that have been processed by the substrate processing section are conveyed to the substrate delivery position by the main transfer mechanism, and are delivered to the first traverse holding portion in this substrate delivery position. The first traverse holding portion moves laterally to the substrate transfer position while following the first traversing path. The substrates held by the first traverse holding portion are transferred to the elevation holding portion by allowing the elevation holding portion of the elevation mechanism to move upwardly and downwardly in this substrate transfer position.

On the other hand, when unprocessed substrates (substrates before processing) are carried in, the second traverse holding portion is moved to the substrate transfer position. Thereafter, unprocessed substrates held by the elevation holding portion beforehand are transferred to the second traverse holding portion by the up-and-down movement of the elevation holding portion. Thereafter, the second traverse holding portion moves laterally from the transfer position to the substrate delivery position. Thereafter, in this substrate delivery position, the substrates held by the second traverse holding portion are delivered to the main transfer mechanism, and the main transfer mechanism conveys the substrates to the substrate processing section.

Therefore, the main transfer mechanism can be operated to expel already-processed substrates to the first traverse holding portion, and then receive unprocessed substrates from the second traverse holding portion, and hence can expel the processed substrates without waiting for the completion of conveyance of the unprocessed substrates to the substrate delivery position. As a result, it becomes possible to prevent stagnation in substrate conveyance and, therefore, to improve the substrate processing speed.

In addition to this, the first and second traversing mechanisms laterally move the first and second traverse holding portions, respectively, while following the first and second traversing paths disposed in the up-and-down direction. Therefore, the footprint of the apparatus can be restricted in spite of the fact that the two different conveying paths are provided.

Preferably, the first traversing mechanism is used only to carry out processed substrates, and the second traversing mechanism is used only to carry in unprocessed substrates. Accordingly, processed substrates can be conveyed while following the upper path, and hence the processed substrates can be held in a clean state.

Preferably, the substrate processing apparatus further includes a posture changing mechanism, which changes a plurality of substrates assuming a horizontal posture from the horizontal posture to a vertical posture in a batch manner and then delivers the plurality of substrates to the elevation mechanism located in the substrate transfer position, and which receives a plurality of substrates held in a vertical posture by the elevation mechanism located in the substrate transfer position in a batch manner and then changes the plurality of substrates from the vertical posture to a horizontal posture.

Preferably, in this structure, the substrate processing apparatus further includes a pod holding portion that holds a pod containing a plurality of substrates assuming a horizontal posture, and a carry-in-and-out mechanism that transfers a plurality of substrates assuming a horizontal posture into and from the pod held by the pod holding portion in a batch manner and that delivers the plurality of substrates assuming the horizontal posture to and from the posture changing mechanism in a batch manner.

According to this structure, a plurality of substrates can be taken out in a batch manner from a pod capable of containing a plurality of substrates in a horizontal posture and can be processed. Additionally, a plurality of substrates that have been processed can be contained in the pod.

Preferably, a first substrate conveying path between the carry-in-and-out mechanism and the elevation mechanism and a second substrate conveying path between the elevation mechanism and the substrate delivery position intersect with each other at a predetermined angle. Preferably, in this case, the elevation mechanism is disposed at an intersection of the first substrate conveying path and the second substrate conveying path.

According to this structure, the installation space of the carry-in-and-out mechanism can be more easily secured than a structure in which the first substrate conveying path and the second substrate conveying path are laid in a line. As a result, the footprint of the apparatus can be reduced. Additionally, a positional adjustment to the carry-in-and-out mechanism, the posture changing mechanism, the elevation mechanism, and the substrate delivery position can be easily performed. In other words, alignment of these components can be done by aligning the carry-in-and-out mechanism and the posture changing mechanism along the first substrate conveying path, by aligning the elevation mechanism and the substrate delivery mechanism along the second substrate conveying path, and by disposing the elevation mechanism at the intersection of the first and second substrate conveying paths. This alignment can be performed much more easily than in a case in which the carry-in-and-out mechanism, the posture changing mechanism, the elevation mechanism, and the substrate delivery position are aligned on the same straight line.

The carry-in-and-out mechanism may include a batch hand that holds a plurality of substrates assuming a horizontal posture, a hand advancing-retreating mechanism that advances and retreats the batch hand in a horizontal direction, and a rotation mechanism that rotates the batch hand around a vertical axis line. In this case, a hand advance-retreat direction taken when the batch hand accesses the pod held by the pod holding portion may be a horizontal direction perpendicular to the second substrate conveying path.

According to this structure, a plurality of substrates assuming a horizontal posture can be taken out from the pod in a batch manner by advancing and retreating the batch hand, and then these substrates can be delivered to the posture changing mechanism by rotating the batch hand. Additionally, a plurality of substrates assuming a horizontal posture can be received in a batch manner from the posture changing mechanism by use of the batch hand, and then these substrates can be contained in the pod in a batch manner by rotating the batch hand and by advancing and retreating the batch hand. The first and second substrate conveying paths intersect with each other at a predetermined angle, and hence the installation space of the carry-in-and-out mechanism can be easily secured while securing the stroke for the batch hand to access the pod. Therefore, this is advantageous to a reduction in the footprint of the apparatus.

Preferably, the elevation mechanism includes a rotation driving mechanism that rotates the elevation holding portion around a vertical axis line between a first posture in which a plurality of substrates assuming a vertical posture are held along the first substrate conveying path and a second posture in which a plurality of substrates assuming a vertical posture are held along the second substrate conveying path. Accordingly, the elevation holding portion can perform substrate delivery between the first and second traversing mechanisms and the posture changing mechanism.

Preferably, the elevation mechanism delivers a plurality of substrates assuming a vertical posture from the elevation holding portion to the second traverse holding portion in a batch manner by raising and lowering the elevation holding portion in an up-down direction, and allows the elevation holding portion to receive the plurality of substrates assuming a vertical posture that are held by the first traverse holding portion in a batch manner by raising and lowering the elevation holding portion in the up-down direction. Accordingly, the second traverse holding portion can be used to carry in substrates, whereas the first traverse holding portion can be used to carry out substrates. Foreign substances can be prevented from falling down from unprocessed substrates to processed substrates by using the first traverse holding portion disposed above the second traverse holding portion in order to carry out the processed substrates.

Preferably, the substrate processing apparatus further includes an intermediary mechanism that raises and lowers an intermediary holding portion that holds a plurality of substrates in a batch manner in the substrate delivery position.

According to this structure, substrates can be delivered to and from the first traverse holding portion and/or to and from the second traverse holding portion by raising and lowering the intermediary holding portion.

Preferably, for example, the intermediary mechanism delivers a plurality of substrates to and from the second traverse holding portion in a batch manner by raising and lowering the intermediary holding portion in the substrate delivery position.

Accordingly, for example, the second traverse holding portion can convey unprocessed substrates from the substrate transfer position to the substrate delivery position, and then can deliver the unprocessed substrates to the intermediary holding portion. Accordingly, it becomes possible for the second traverse holding portion to be operated to receive the following unprocessed substrates from the elevation mechanism. Therefore, the unprocessed substrates can remain on standby in the intermediary holding portion until the unprocessed substrates are received by the main transfer mechanism, and hence a waiting time until the second traverse holding portion operates to carry in the following unprocessed substrates can be shortened. As a result, the substrate processing speed can be made even higher.

Preferably, in this case, the main transfer mechanism delivers a plurality of substrates to and from the first traverse holding portion and to and from the intermediary holding portion in the substrate delivery position in a batch manner.

Accordingly, for example, the main transfer mechanism can be operated to expel processed substrates to the first traverse holding portion and to receive unprocessed substrates from the intermediary holding portion. In this case, the intermediary holding portion can function as a buffer (waiting place) to tentatively hold unprocessed substrates during a period from the carrying-in of the unprocessed substrates into the substrate delivery position by means of the second traverse holding portion until the delivery of these unprocessed substrates to the main transfer mechanism. As a result, for example, if there is a change in time intervals of the carrying-in of the substrates resulting from a change in substrate processing conditions, the intermediary holding portion can absorb the change in time intervals. Therefore, stagnation in the carrying-in of substrates can be restricted, and hence the substrate processing speed can be made even higher.

Preferably, the substrate processing apparatus further includes a substrate-direction aligning mechanism that is disposed below the second traversing path in the substrate delivery position and that aligns directions of a plurality of substrates.

According to this structure, the substrate-direction aligning mechanism is disposed in the substrate delivery position, and hence the substrate-direction aligning mechanism can be provided without increasing the footprint of the apparatus.

The substrate-direction aligning mechanism may apply substrate-direction aligning processing onto the substrates being held by the second traverse holding portion in the substrate delivery position. The substrate-direction aligning processing denotes processing in which, if each circular substrate, such as a semiconductor wafer, has a cutout (notch or orientation-flat) showing a crystal orientation or the like, these cutouts are aligned.

Preferably, the first traverse holding portion includes a pair of substrate guides parallel to each other, and a guide opening-and-closing unit arranged to change an interval between the pair of substrate guides between an open state in which the interval therebetween is wider than a width of the substrate and a closed state in which the interval therebetween is narrower than the width of the substrate and is wider than a width of the elevation holding portion. When the elevation holding portion rises while passing through the space between the pair of substrate guides holding substrate in the closed state, these substrates can be delivered from the substrate guides to the elevation holding portion. If the substrates are delivered to the elevation holding portion, and then the pair of substrate guides are brought into the open state, the elevation holding portion and the substrates held by this elevation holding portion can be lowered while passing through the space between the pair of substrate guides. The substrates can be delivered from the first traverse holding portion to the elevation holding portion in this way.

The substrate conveying apparatus according to another aspect of the present invention includes a batch hand that holds a plurality of substrates piled together in a batch manner, a batch-hand advancing-retreating mechanism that advances and retreats the batch hand, a one-by-one hand that holds a single substrate, a one-by-one-hand advancing-retreating mechanism that advances and retreats the one-by-one hand, a holding base that holds the batch-hand advancing-retreating mechanism and the one-by-one-hand advancing-retreating mechanism, an elevation mechanism that moves the holding base upwardly and downwardly, and a rotation mechanism that rotates the holding base around a rotation axis line extending in a vertical direction.

In the structure according to the prior art disclosed in Japanese Unexamined Patent Application Publication No. H11-354604 (1999) mentioned above, a hand other than a hand being used is kept in the hand exchange unit, and hence there is a need to provide a space for the hand exchange unit. In addition to this, a horizontally conveying robot is required to access the hand exchange unit whenever the hand is exchanged for another, and hence a time to access this unit is needed, and a time for a hand exchange is needed. Therefore, when processing that requires a hand exchange is performed, the substrate processing speed detracts greatly.

Still additionally, in order to access the hand exchange unit and to achieve an automatic hand exchange, a vertical articulated arm type robot is used as the horizontally conveying robot. However, disadvantageously, the vertical articulated arm type robot has an intricate structure, and becomes costly in accordance with this structure, and costs are raised.

Moreover, a plurality of driving shafts are required to be synchronously driven in order to move substrates in the horizontal direction by means of the vertical articulated arm type robot. Therefore, there is a fear that vibrations may occur in the hand, and a conveyance failure may occur when the substrates are conveyed at high speed. Therefore, disadvantageously, it is difficult to improve the substrate conveying speed, and, accordingly, it is difficult to improve the productivity of the substrate processing apparatus.

On the other hand, in the substrate conveying apparatus according to the present invention that has the above-mentioned structure, the batch-hand advancing-retreating mechanism that advances and retreats the batch hand and the one-by-one-hand advancing-retreating mechanism that advances and retreats the one-by-one hand are held by the holding base shared by the two mechanisms. Furthermore, the holding base shared thereby is moved upwardly and downwardly by the elevation mechanism, and is rotated around the vertical axis line by the rotation mechanism. Therefore, substrates can be conveyed to and from a substrate-conveyed place by advancing and retreating the batch hand or the one-by-one hand to and from the substrate-conveyed place in a state of allowing the batch hand or the one-by-one hand to face the substrate-conveyed place. The batch-hand advancing-retreating mechanism and the one-by-one-hand advancing-retreating mechanism are provided individually, and hence the batch hand and the one-by-one hand can be advanced and retreated independently of each other.

There is no need to perform a hand exchange as mentioned above, and hence switching between batch conveyance of a plurality of substrates by use of the batch hand and one-by-one conveyance of a single substrate by use of the one-by-one hand can be achieved by selecting either the operation of the batch-hand advancing-retreating mechanism or the operation of the one-by-one-hand advancing-retreating mechanism. Therefore, unlike the conventional technique mentioned above, the apparatus of the present invention does not need a long time for switching between batch conveyance and one-by-one conveyance. Accordingly, substrate conveyance can be efficiently performed even if switching between batch conveyance and one-by-one conveyance is needed.

Additionally, there is no need to perform a hand exchange as mentioned above, and hence a vertical articulated arm type robot having an intricate structure is not needed although the prior art needs this robot. Therefore, what is required is to provide the elevation mechanism that raises and lowers the holding base and the rotation mechanism that rotates the holding base, and to provide the holding base with the batch-hand advancing-retreating mechanism and the one-by-one-hand advancing-retreating mechanism. Therefore, the structure is simpler than that of the prior art mentioned above, and hence costs can be greatly reduced. Moreover, substrates can be moved in the horizontal direction by rotating the holding base and by advancing and retreating the hand, and a plurality of driving shafts are not required to be synchronously driven unlike the vertical articulated arm type robot. Therefore, the substrate conveyance speed can be improved.

Additionally, since there is no need to use a hand exchange unit, the footprint of the apparatus can be reduced, and costs can also be reduced.

Preferably, the advance-retreat direction of the batch hand and the advance-retreat direction of the one-by-one hand are parallel to each other although these directions may differ from each other.

Preferably, when the batch hand and the one-by-one hand are in retreat positions, respectively, the batch hand and the one-by-one hand are disposed to lie on each other in an up-down direction. According to this structure, the rotating radius can be reduced in the state of having retreated the batch hand and the one-by-one hand, and hence the installation space of the substrate conveying apparatus can be reduced.

Preferably, the one-by-one hand includes two hand elements disposed apart in a horizontal direction, and each of the two hand elements has a first substrate supporting portion and a second substrate supporting portion that differ in height from each other. Preferably, in this case, the substrate conveying apparatus further includes a hand opening-closing mechanism that opens and closes the two hand elements by driving the two hand elements in the horizontal direction, and the one-by-one hand holds a substrate at a first height by means of the first substrate supporting portion of the two hand elements in a state in which the two hand elements are opened, and holds a substrate at a second height by means of the second substrate supporting portion of the two hand elements in a state in which the two hand elements are closed.

According to this structure, a state in which a substrate is supported by the first substrate supporting portion and a state in which a substrate is supported by the second substrate supporting portion can be selected by opening and closing the two hand elements by the hand opening-closing mechanism. Because the first and second substrate supporting portions differ in height from each other, a substrate can be prevented from coming into contact with one of the substrate supporting portions when this substrate is supported by the other substrate supporting portion. Therefore, a substrate can be supported by properly using the first and second substrate supporting portions.

For example, one of the first and second substrate supporting portions can be used to support unprocessed substrates, whereas the other substrate supporting portion can be used to support processed substrates. As a result, the one-by-one hand can be used properly for two kinds of uses, and there is no need to individually prepare a one-by-one hand for unprocessed substrates and a one-by-one hand for processed substrates and no need to exchange these hands for each other, unlike the above-mentioned prior art. Accordingly, a hand for exchange is not needed, and substrate supporting portions can be allocated to unprocessed substrates and to processed substrates, respectively, without requiring a hand-exchanging time.

The substrate processing apparatus according to another aspect of the present invention includes a pod holding portion that holds a pod containing a plurality of substrates piled together, a substrate holding portion that holds a plurality of substrates, and the above-mentioned substrate conveying apparatus that conveys substrates between the pod held by the pod holding portion and the substrate holding portion.

According to this structure, substrate conveyance between the pod held by the pod holding portion and the substrate holding portion can be performed by batch conveyance using the batch hand or can be performed by one-by-one conveyance using the one-by-one hand. When switching between batch conveyance and one-by-one conveyance is performed, a hand-exchanging time is not required, and switching therebetween can be quickly performed. Therefore, substrate conveyance can be performed at higher speed, and, accordingly, the substrate processing speed can be improved.

Other elements, features, steps, characteristics and advantages of the present invention will become more apparent from the following detailed description of the preferred embodiments with reference to the attached drawings.

BRIEF DESCRIPTION OF THE DRAWINGS

FIG. 2B is an elevational view seen from arrow A1 of FIG. 2A.

FIG. 3A is a plan view of a posture changing mechanism, and FIG. 3B is an elevational view for explaining the internal structure of the posture changing mechanism.

FIG. 4 is an elevational view for explaining the structure of a pusher.

FIGS. 7A, 7B, and 7C are views for explaining the structure of an expelling chuck.

FIGS. 8A, 8B, and 8C are views for explaining the structure of a carry-in chuck.

FIG. 13A is a side view for explaining the structure of a one-by-one hand, the structure of a batch hand, and the structure of an advance-retreat driving mechanism that advances and retreats these hands.

DETAILED DESCRIPTION OF THE PREFERRED EMBODIMENTS

Figure 1:
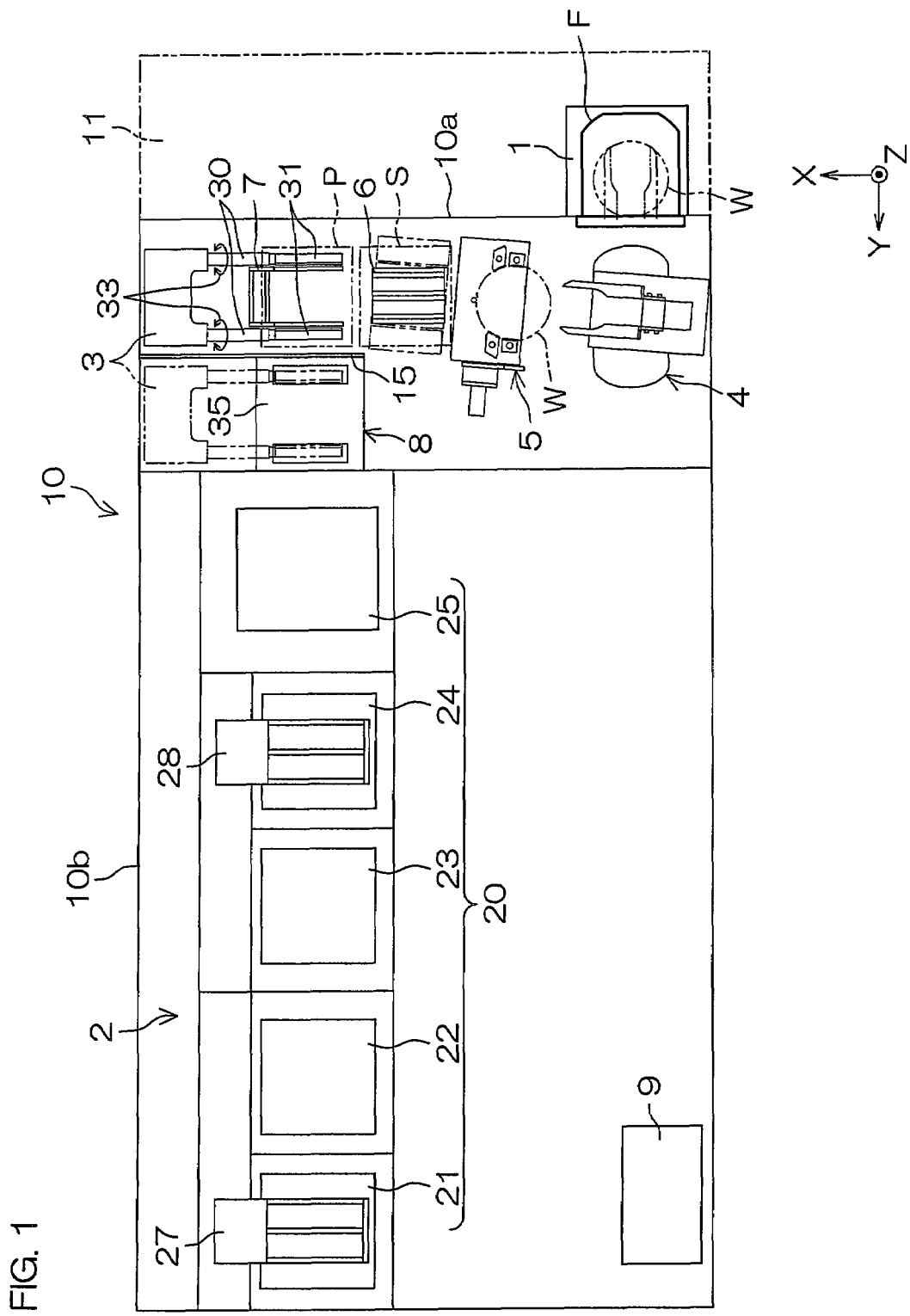
FIG. 1 is a schematic plan view for explaining the entire structure of a substrate processing apparatus according to an embodiment of the present invention.

FIG. 1 is a schematic plan view for explaining the entire structure of a substrate processing apparatus according to an embodiment of the present invention. The substrate processing apparatus 10 includes a FOUP (front opening unified pod) holding portion 1, a substrate processing section 2, a main transfer mechanism 3, a carry-in-and-out mechanism 4, a posture changing mechanism 5, a pusher 6, a delivery mechanism 7, a chuck washing unit 8, and a controller (control unit) 9.

The FOUP holding portion 1 is disposed at a corner of the substrate processing apparatus 10 having a substantially rectangular shape when viewed planarly. The FOUP holding portion 1 is a pod holding portion that holds a FOUP F serving as a pod containing a plurality of substrates W (for example, twenty-five substrates) piled in a Z direction (i.e., up-down direction, or vertical direction) each of which assumes a horizontal posture. An automatic FOUP conveying apparatus 11 shown by a phantom line is disposed so as to face a front surface 10a (which corresponds to a short side when viewed planarly) of the substrate processing apparatus 10. The automatic FOUP conveying apparatus 11 has a function to supply the FOUP F containing unprocessed substrates W to the FOUP holding portion 1, a function to supply the FOUP (empty FOUP) F, which should contain already-processed substrates W, to the FOUP holding portion 1, and a function to allow the FOUP F held by the FOUP holding portion 1 to recede therefrom in order to exchange the FOUP for another FOUP to be held by the FOUP holding portion 1. In this embodiment, the substrate W is a circular substrate such as a semiconductor wafer. For example, the semiconductor wafer has a notch indicating a crystal orientation at its peripheral edge.

The substrate processing section 2 includes a plurality of processing portions (processing units) 20 arranged in a Y direction (horizontal direction) along a side surface 10b (which corresponds to a long side when viewed planarly) of the substrate processing apparatus 10. The processing units 20 include a first chemical bath 21, a first rinse solution bath 22, a second chemical bath 23, a second rinse solution bath 24, and a dry processing portion 25. The first and second chemical bathes 21 and 23 store the same kinds of or different kinds of chemicals, respectively, and apply chemical processing onto a plurality of substrates W while immersing the substrates W in the chemicals in a batch manner. The first and second rinse solution bathes 22 and 24 store rinse solutions (for example, deionized water), respectively, and apply rinse processing onto the surfaces of a plurality of substrates (for example, up to fifty-two substrates) W while immersing the substrates W in the rinse solutions in a batch manner.

In this embodiment, the first chemical bath 21 and the first rinse solution bath 22 contiguous to the chemical bath 21 serve as a pair, and the second chemical bath 23 and the second rinse solution bath 24 contiguous to the chemical bath 23 serve as another pair. The processing units 20 further include a first lifter 27 serving as a dedicated transfer mechanism used to transfer substrates W, which have undergone chemical processing in the first chemical bath 21, from the first chemical bath 21 to the first rinse solution bath 22 and a second lifter 28 serving as a dedicated transfer mechanism used to transfer substrates W, which have undergone chemical processing in the second chemical bath 23, from the second chemical bath 23 to the second rinse solution bath 24. Each of the first and second lifters 27 and 28 includes a substrate supporting portion that supports a plurality of substrates (for example, up to fifty-two substrates) W in a state in which the substrates W are piled in an X direction (horizontal direction) in a vertical posture, an elevation driving mechanism that moves the substrate supporting portion upwardly and downwardly, and a traverse driving mechanism that laterally moves the substrate supporting portion in the Y direction. It should be noted that the X direction is a horizontal direction along the front surface 10a of the substrate processing apparatus 10, and is perpendicular to the Y direction.

According to this structure, the first lifter 27 receives the substrates W, which are piled in the X direction and each of which assumes a vertical posture, from the main transfer mechanism 3 in a batch manner, then lowers these substrates W into the first chemical bath 21, and immerses these substrates W in the chemical contained therein. Furthermore, the first lifter 27 remains on standby for a predetermined chemical processing time, then raises the substrates W from the chemical while raising the substrate supporting portion upwardly, then moves the substrate supporting portion toward the first rinse solution bath 22 laterally, then lowers the substrate supporting portion into the first rinse solution bath 22, and immerses the substrates W in the rinse solution contained therein. The first lifter 27 remains on standby for a predetermined rinse processing time, and raises the substrates W from the rinse solution while raising the substrate supporting portion. Thereafter, the substrates W are delivered from the first lifter 27 to the main transfer mechanism 3. Likewise, the second lifter 28 receives the substrates W, which are piled in the X direction and each of which assumes a vertical posture, from the main transfer mechanism 3 in a batch manner, then lowers these substrates W into the second chemical bath 23, and immerses these substrates W in the chemical contained therein. Furthermore, the second lifter 28 remains on standby for a predetermined chemical processing time, then raises the substrates W from the chemical while raising the substrate supporting portion upwardly, then moves the substrate supporting portion toward the second rinse solution bath 24 laterally, then lowers the substrate supporting portion into the second rinse solution bath 24, and immerses the substrates W in the rinse solution contained therein. The second lifter 28 remains on standby for a predetermined rinse processing time, and raises the substrates W from the rinse solution while raising the substrate supporting portion. Thereafter, the substrates W are delivered from the second lifter 28 to the main transfer mechanism 3 in a batch manner.

The dry processing portion 25 has a substrate holding mechanism that holds a plurality of substrates (for example, up to fifty-two substrates) W in a state in which these substrates W are piled in the X direction in a vertical posture, and is used to dry the substrates W by supplying an organic solvent (e.g., isopropyl alcohol) to the substrates W in a reduced-pressure atmosphere or by shaking off a liquid component adhering to the surface of the substrate W by means of a centrifugal force. The dry processing portion 25 can deliver the substrates W to and from the main transfer mechanism 3.

The main transfer mechanism 3 includes a pair of substrate chucks (clamping mechanism) 30 serving as a substrate-batch-holding unit that holds a plurality of substrates (for example, up to fifty-two substrates) W, which are piled in the X direction and each of which assumes a vertical posture, in a batch manner, a chuck driving mechanism that operates the substrate chucks 30, a traverse driving mechanism that horizontally moves (i.e., laterally moves) the substrate chucks 30 in the Y direction, and an elevation driving mechanism that moves the substrate chucks 30 upwardly and downwardly in the Z direction. The pair of substrate chucks 30 each has a shaft-like support guides 31 extending in the X direction. A plurality of substrate support grooves that support the substrates W assuming a vertical posture from below by accepting the substrates W are formed with intervals in an axial direction on the side where the pair of the support guides 31 face each other. The chuck driving mechanism increases and decreases the distance between the pair of support guides 31 by rotating the pair of substrate chucks 30 in the direction of arrow 33. Accordingly, the substrate chucks 30 perform an open-close operation for switching between a holding state in which the substrate W is held while being clamped and a release state in which the substrate W is released from clamping. This open-close operation and the up-and-down movement of the first and second lifters 27 and 28 make it possible to deliver the substrates W from the first and second lifters 27 and 28 to the substrate chucks 30 or vice versa. Furthermore, the main transfer mechanism 3 delivers a plurality of substrates W to and from the dry processing portion 25 in a batch manner in a state in which the substrates W are piled in the X direction in a vertical posture.

The main transfer mechanism 3 operates to receive a plurality of unprocessed substrates W piled in the X direction in a vertical posture at a substrate delivery position P and to expel a plurality of already-processed substrates W piled in the X direction in a vertical posture at the substrate delivery position P.

The chuck washing unit 8 is disposed between the substrate delivery position P and the processing units 20. The chuck washing unit 8 has a washing bath 35 the upper surface of which has a pair of openings into which the pair of substrate chucks 30 are inserted, respectively. In the washing tank 35, the substrate chucks 30 (especially, support guides 31) are washed by use of a cleaning solution. Before conveying the already-processed substrates W that have undergone dry processing in the dry processing portion 25, the main transfer mechanism 3 inserts the substrate chucks 30 into the washing bath 35 of the chuck washing unit 8. Thereafter, the substrate chucks 30 are washed in the washing bath 35, and then the main transfer mechanism 3 operates to receive the processed substrates W from the dry processing portion 25 in a batch manner. The main transfer mechanism 3 can narrow the guide-to-guide interval of the pair of support guides 31 disposed at the lower ends of the substrate chucks 30. Therefore, if the washing processing in the washing tank 35 is performed in a state in which the guide-to-guide interval of the pair of support guides 31 has been narrowed, the washing tank 35 can be reduced in size, and hence the footprint of the substrate processing apparatus 10 can be restricted.

A shutter 15 is disposed between the chuck washing unit 8 and the substrate delivery position P. When the main transfer mechanism 3 is moved from the substrate delivery position P toward the processing units 20, and when the main transfer mechanism 3 is moved from the side of the processing units 20 toward the substrate delivery position P, the shutter 15 is opened. Except for these points of time, the shutter 15 remains closed. Therefore, a chemical atmosphere on the side of the substrate processing section 2 is restricted or prevented from being leaked.

Figure 2A:
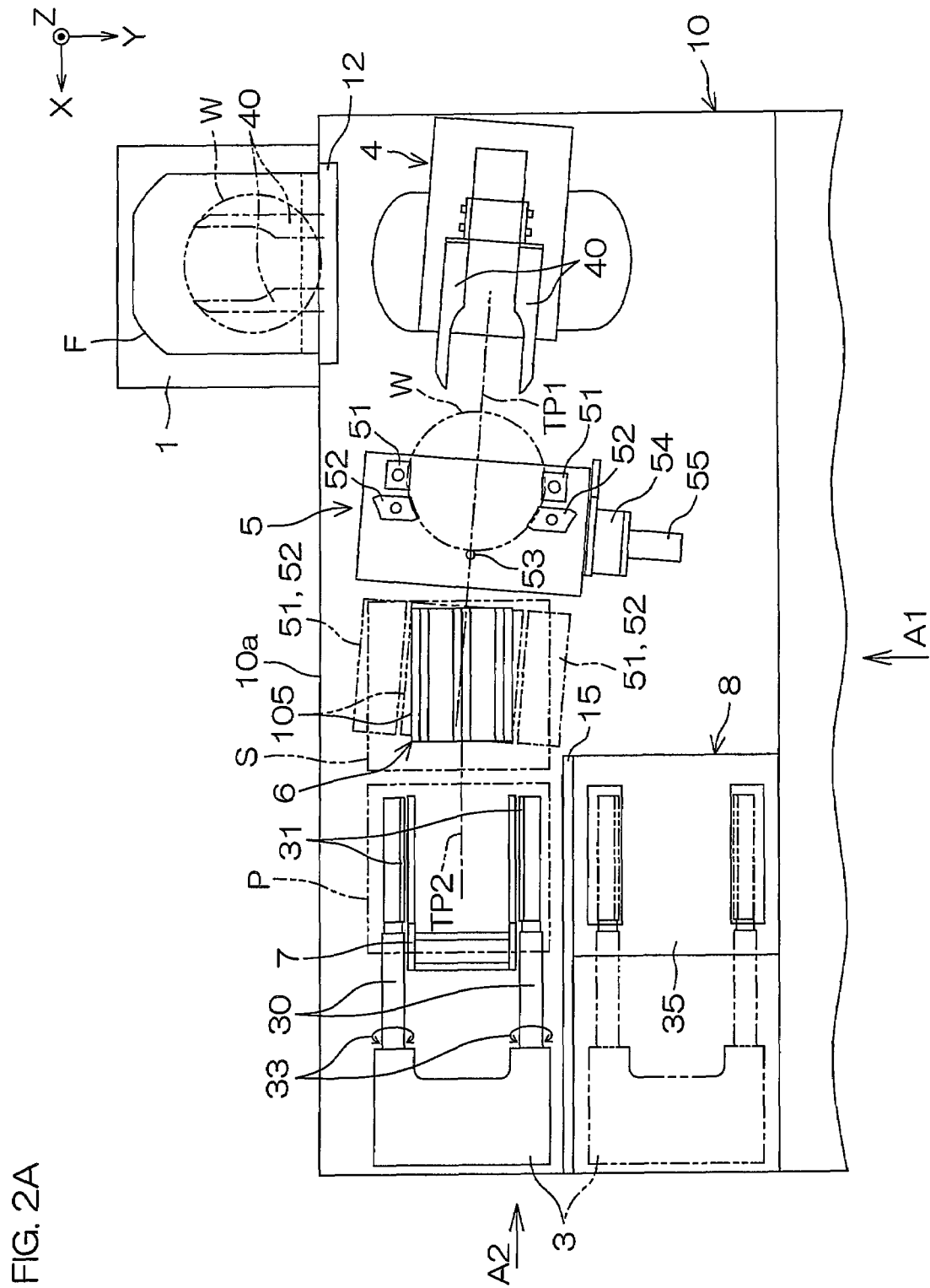
FIG. 2A is an enlarged plan view for explaining a structure relative to substrate conveyance between a FOUP (front opening unified pod) and a main transfer mechanism.

FIG. 2A is an enlarged plan view for explaining a structure relative to substrate conveyance between the FOUP F and the main transfer mechanism 3. The carry-in-and-out mechanism 4 faces the FOUP holding portion 1. An opener 12 that opens and closes a lid with which the front surface of the FOUP F is closed is disposed on the side of the carry-in-and-out mechanism 4 of the FOUP holding portion 1.

The posture changing mechanism 5 is disposed on the side of the substrate delivery position P of the carry-in-and-out mechanism 4. The pusher 6 is disposed on the side of the substrate delivery position P of the posture changing mechanism 5. The delivery mechanism 7 is disposed at the substrate delivery position P. The delivery mechanism 7 operates to deliver the substrates W from a substrate transfer position S, which is the position of the pusher 6, to the substrate delivery position P or vice versa.

A conveying path TP1 between the carry-in-and-out mechanism 4 and the pusher 6 and a conveying path TP2 between the pusher 6 and the substrate delivery position P intersect with each other at a predetermined angle (e.g., 170 degrees to 185 degrees). In more detail, the conveying path TP2 is parallel to the X direction, whereas the conveying path TP1 forms an oblique path that is inclined so as to become apart from the front surface 10a in proportion to an approach from the pusher 6 to the carry-in-and-out mechanism 4. The carry-in-and-out mechanism 4, the posture changing mechanism 5, and the pusher 6 are arranged along the conveying path TP1. The substrate transfer position S at which the pusher 6 is disposed and the substrate delivery position P are arranged along the conveying path TP2. Therefore, the pusher 6 is disposed at the intersection at which the conveying paths TP1 and TP2 intersect with each other.

This arrangement is useful in securing a hand stroke for the carry-in-and-out mechanism 4 to access the FOUP F in the Y direction and in reducing the footprint of the substrate processing apparatus 10. If the conveying path extending from the carry-in-and-out mechanism 4 to the substrate delivery position P is straight, the carry-in-and-out mechanism 4, the posture changing mechanism 5, the pusher 6, and the substrate delivery position P must be located on the straight line, and hence it will become difficult to perform an adjusting operation to secure its accuracy. On the other hand, in this embodiment, the conveying paths TP1 and TP2 are formed to intersect with each other at a predetermined angle. Therefore, what is required is to arrange the carry-in-and-out mechanism 4 and the posture changing mechanism 5 along the conveying path TP1, to arrange the pusher 6 and the substrate delivery position P along the conveying path TP2, and to arrange the pusher 6 at the intersection at which the conveying paths TP1 and TP2 intersect with each other. Therefore, an easy adjusting operation can be achieved.

FIG. 2B is an elevational view seen from arrow A1 of FIG. 2A. However, in FIG. 2B, the chuck washing unit 8 is not shown. The carry-in-and-out mechanism 4 is a substrate conveying apparatus according to an embodiment of the present invention, and includes a one-by-one hand 39 capable of holding a single substrate W, a batch hand 40 that is a substrates-holding hand capable of holding a plurality of substrates W piled together in a batch manner, a holding base (hand supporting portion) 41 that holds the hands 39 and 40 together, a rotation block 42, an elevation block 43 that supports the rotation block 42 so that the rotation block 42 can rotate around the vertical axis line, and a base portion 44 that supports the elevation block 43 so that the elevation block 43 can move upwardly and downwardly. The holding base 41 has a built-in advance-retreat driving mechanism 47 that allows the one-by-one hand 39 and the batch hand 40 to proceed and recede in the horizontal direction independently of each other. The rotation block 42 supports the holding base 41, and rotates around the vertical axis line by the function of the built-in rotation mechanism 45, and, as a result, allows the hands 39 and 40 to rotate around the vertical axis line along with the holding base 41. As a result of this rotation, the hands 39 and 40 can face the FOUP F or the posture changing mechanism 5. The base portion 44 has a built-in elevation mechanism 46 that moves the elevation block 43 upwardly and downwardly in the Z direction. The hands 39 and 40 can be moved upwardly and downwardly by the function of the elevation mechanism 46. As a result of the up-down movement and the advance-retreat operation performed by the advance-retreat driving mechanism 47, the hands 39 and 40 can transfer the substrates W into and from the FOUP F, and can deliver the substrates W to and from the posture changing mechanism 5.

The batch hand 40 has a plurality of hand elements (for example, twenty-five hand elements) piled together at the same intervals as the substrate-to-substrate intervals at which substrates W are held in the FOUP F. These hand elements make it possible to hold substrates W, such as twenty-five substrates, in a batch manner. Therefore, for example, twenty-five substrates W are transferred into and from the FOUP F in a batch manner, and are delivered to and from the posture changing mechanism 5 in a batch manner by using the batch hand 40.

The one-by-one hand 39 holds a single substrate W, and is used when substrates W, such as twenty-five substrates, and a test dummy substrate are simultaneously processed, or when substrates W are rearranged in order differing from the order of substrates W contained in the FOUP F. A single substrate W is transferred into and from the FOUP F, and is delivered to and from the posture changing mechanism 5 by using the one-by-one hand 39.

The posture changing mechanism 5 changes the posture of a substrate W from a horizontal posture to a vertical posture or vice versa. In more detail, the posture changing mechanism 5 receives a plurality of substrates W, which have been piled in the vertical direction and each of which assumes a horizontal posture, from the carry-in-and-out mechanism 4 in a batch manner, and changes the posture of these substrates W so that the substrates W are piled in the horizontal direction in a vertical posture. The substrates W assuming the vertical posture are delivered to the pusher 6. Furthermore, the posture changing mechanism 5 receives a plurality of substrates W, which have been piled in the horizontal direction and each of which assumes a vertical posture, from the pusher 6 in a batch manner, and changes the posture of these substrates W so that the substrates W are piled in the vertical direction in a horizontal posture. The substrates W assuming the horizontal posture are delivered to the carry-in-and-out mechanism 4.

The pusher 6 is an elevation mechanism having an elevation holding portion 105 that receives a plurality of substrates W, which have been piled in the horizontal direction in a vertical posture, from the posture changing mechanism 5 in a batch manner. In the substrate transfer position S, the pusher 6 can move the elevation holding portion 105 upwardly and downwardly in the Z direction, can rotate the elevation holding portion 105 around the vertical axis line, and can linearly move the elevation holding portion 105 in the X direction by a slight distance (e.g., 5 mm). In more detail, the elevation holding portion 105 changes its height to an origin height H10, to a first transfer height H11 higher than the origin height H10, and to a second transfer height H12 higher than the first transfer height H11.

The pusher 6 can deliver a plurality of substrates W to and from the posture changing mechanism 5 by the up-and-down movement of the elevation holding portion 105. The elevation holding portion 105 holds a plurality of substrates (for example, up to fifty-two substrates) W the number of which is twice as large as the number of substrates (for example, up to twenty-six substrates) that are changed in posture by the posture changing mechanism 5 at a time with a pitch (i.e., half pitch) that is half as large as the substrate holding pitch in the posture changing mechanism 5 (which is equal to the substrate holding pitch in the FOUP F).

For example, twenty-five substrates W are delivered from the posture changing mechanism 5 to the elevation holding portion 105, and then the elevation holding portion 105 is rotated 180 degrees. The rotational center axis of the elevation holding portion 105 is eccentric in the substrate arrangement direction by a half of the above-mentioned "half pitch" with respect to the center of a plurality of substrate holding positions. Therefore, the 180-degree rotation allows the twenty-five substrates W held thereby to move by a half pitch. In this state, another twenty-five substrates W are delivered from the posture changing mechanism 5 to the elevation holding portion 105. As a result, the twenty-five substrates W that have been delivered later are allowed to enter the spaces between the twenty-five substrates W that have been delivered earlier, and a batch of substrates the number of which is fifty in total are formed on the elevation holding portion 105. "Batch organization" that is the process of forming a batch by gathering a plurality of groups of substrates together is performed in this way. At this time, a pair of substrates W adjacent to another pair of substrates W reaches a state (a face-to-face state) in which the front surface (or back surface) of one of the pair of substrates W faces the front surface (or back surface) of the other substrate.

There is also a case where it is desired to perform processing in a state (a face-to-back state) in which the front surfaces of all substrates W are directed in the same direction and in which the front surface of one of the substrates W faces the back surface of a substrate W adjacent to this substrate. In this case, instead of the 180-degree rotation mentioned above, the elevation holding portion 105 is horizontally moved by a slight distance equal to the half pitch. Accordingly, batch organization in the face-to-back state can be performed.

For example, twenty-five of fifty substrates W held by the elevation holding portion 105 are delivered to the posture changing mechanism 5 when the substrates W are delivered from the pusher 6 to the posture changing mechanism 5. The twenty-five substrates W are changed to assume a horizontal posture, and are then delivered to the carry-in-and-out mechanism 4. Thereafter, the elevation holding portion 105 is subjected to a 180-degree rotation or to a half-pitch horizontal movement. In the state, the remaining twenty-five substrates W on the elevation holding portion 105 are delivered to the posture changing mechanism 5, are then changed to a horizontal posture, and are expelled by the carry-in-and-out mechanism 4. The fifty substrates W are divided into two substrate groups, each of which has twenty-five substrates W, in this way.

The delivery mechanism 7 includes an expelling mechanism 70, a carry-in mechanism 71, and an intermediary mechanism 72. These mechanisms 70, 71, and 72 have chucks 73, 74, and 75, respectively, each of which holds a plurality of substrates W piled in the horizontal direction (X direction) in a vertical posture in a batch manner.

The chuck 73 (hereinafter, referred to as the "expelling chuck 73") of the expelling mechanism 70 is disposed above the chuck 74 (hereinafter, referred to as the "carry-in chuck 74") of the carry-in mechanism 71. The expelling mechanism 70 is a first traversing mechanism that conveys substrates W from the substrate delivery position P to the substrate transfer position S (i.e., position of the pusher 6) by laterally (horizontally) moving the expelling chuck 73 serving as a first traverse holding portion in the X direction along a first traversing path 101 set at an expelling height H0. In other words, the expelling chuck 73 receives already-processed substrates W from the main transfer mechanism 3 at the expelling height H0 of the substrate delivery position P, and expels these substrates W at the expelling height H0 up to the substrate transfer position S. The pusher 6 receives these substrates W from the expelling chuck 73 by raising the elevation holding portion 105 up to the second transfer height H12.

The carry-in mechanism 71 is a second traversing mechanism that conveys substrates W from the substrate transfer position S to the substrate delivery position P by laterally (horizontally) moving the carry-in chuck 74 serving as a second traverse holding portion in the X direction along a second traversing path 102 set at a carry-in height H1 lower than the expelling height H0. In other words, the carry-in chuck 74 receives unprocessed substrates W from the elevation holding portion 105 of the pusher 6, then conveys these substrates W to the substrate delivery position P, and holds these substrates W at the carry-in height H1.

The intermediary mechanism 72 is an intermediary mechanism that receives substrates W from the carry-in chuck 74 and then raises these substrates W to a transfer height H2 located between the expelling height H0 and the carry-in height H1 by upwardly and downwardly moving a chuck 75 (hereinafter, referred to as an "intermediary chuck 75") serving as an intermediary holding portion in an area below the expelling height H0. The substrates W held by the intermediary chuck 75 at the transfer height H2 are received by the main transfer mechanism 3.

The intermediary mechanism 72 receives the substrates W from the carry-in chuck 74, and thereby a state is reached in which the carry-in chuck 74 can receive a following batch of substrates W from the pusher 6 without waiting for the operation of the main transfer mechanism 3. In other words, the intermediary chuck 75 provides, so to speak, a buffer position, and hence absorbs a timing gap between the operations of the carry-in-and-out mechanism 4, the posture changing mechanism 5, the pusher 6, etc., and the operation of the main transfer mechanism 3. Therefore, the carry-in chuck 74 can smoothly perform a substrate carrying-in operation. Especially when a substrate processing condition (so-called recipe) is changed, there is a case in which a waiting time is caused in the substrate delivery position P. However, the substrates W can be brought into a stand-by state in the intermediary chuck 75, and hence the waiting time caused in the operations of the carry-in-and-out mechanism 4, the posture changing mechanism 5, the pusher 6, etc., can be removed or shortened.

In the substrate delivery position P, a substrate-direction aligning mechanism 13 is disposed below the carry-in height H1 if necessary. The substrate-direction aligning mechanism 13 aligns the directions of substrates W forming a batch held by the carry-in chuck 74 at the carry-in height H1 of the substrate delivery position P (for example, notch directions of semiconductor wafers). The substrates W that have been subjected to substrate aligning processing by the substrate-direction aligning mechanism 13 are carried to the transfer height H2 by means of the intermediary chuck 75.

Figure 5:
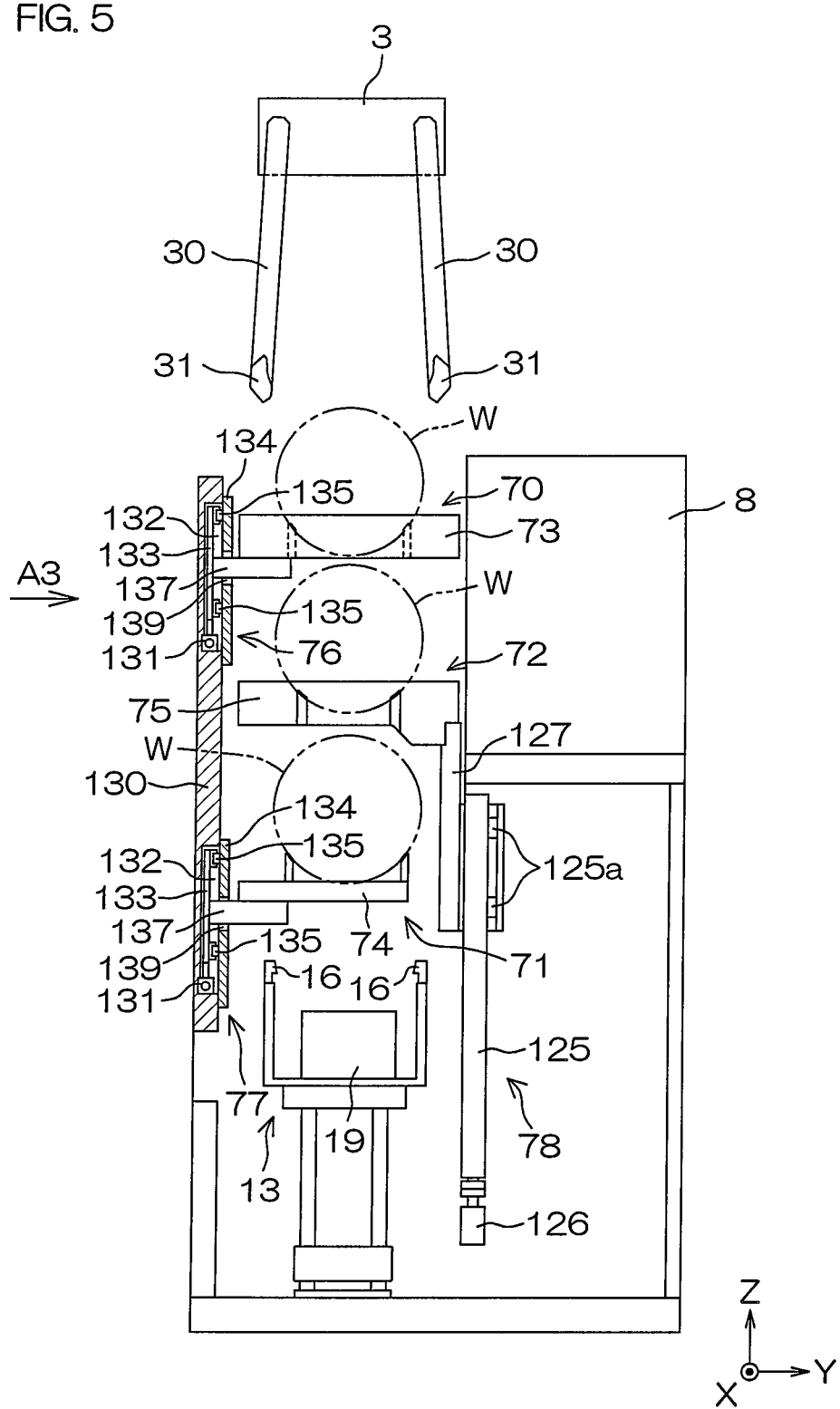
FIG. 5 is an elevational view for explaining a structure relative to a delivery mechanism, seen from the direction of arrow A2 of FIG. 2A.

The substrate-direction aligning mechanism 13 includes an aligning processing head 16 and an elevation mechanism 17 that moves the aligning processing head 16 upwardly and downwardly (see FIG. 5 in addition). The aligning processing head 16 includes a pair of substrate guides 18 disposed so as to face each other in the Y direction with an interval therebetween and a roller mechanism 19 disposed between the pair of substrate guides 18. The roller mechanism 19 (not shown in detail) includes a roller, which comes into contact with the lower peripheral edge of a plurality of substrates piled in the horizontal direction and which rotates each substrate W around the center, and an engagement member that engages with a notch formed at the peripheral edge of the substrate W and that regulates the rotation of the substrate W.

When substrate aligning processing is performed, the aligning processing head 16 is raised near the carry-in height H1, the substrates W held by the carry-in chuck 74 are then supported on the roller of the roller mechanism 19, and are raised by a slight distance from the carry-in chuck 74. When the roller mechanism 19 is operated in this state, the substrates W are rotated while being guided by the substrate guides 18. When the roller mechanism 19 is operated for a time required for one rotation of the substrate W, the notches of all substrates W engage with the engagement member, and are arranged in a straight line. As a result, the directions of the substrates W (crystal orientations if semiconductor wafers are used) are aligned. The substrate aligning processing is performed in this way, and then the aligning processing head 16 is lowered by the elevation mechanism 17, and the substrates W that have undergone the aligning processing are delivered to the carry-in chuck 74.

FIG. 3A is a plan view of the posture changing mechanism 5, and FIG. 3B is an elevational view for explaining the internal structure of the posture changing mechanism 5. The posture changing mechanism 5 includes a base 49 fixed to a frame of the substrate processing apparatus, a rotation block 50, a pair of first holding mechanisms 51 attached to the rotation block 50, a pair of second holding mechanisms 52 attached to the rotation block 50 in the same way, and a substrate regulating mechanism 53.

The rotation block 50 is attached so as to be capable of rotating around a rotational shaft 50a with respect to the base 49. The rotational shaft 50a has its shaft line direction along the horizontal direction. This shaft line direction falls within a plane perpendicular to the conveying path TP1. A motor 55 used to rotate the rotation block 50 around the rotational shaft 50a is attached to the base 49 through a gear head 54. Therefore, the postures of the first and second holding mechanisms 51 and 52 can be changed by driving the motor 55.

The pair of first holding mechanisms 51 includes a pair of rod-like horizontal holding members 56 disposed with an interval therebetween in the horizontal direction perpendicular to the conveying path TP1 and a supporting rod 57 fitted to each horizontal holding member 56. A pair of holding groove groups 58 and 59 are formed on the circumferential surface of the horizontal holding member 56 at opposite positions with the central axis therebetween. The holding groove group 58 and the holding groove group 59 have a plurality of holding grooves 58a and a plurality of holding grooves 59a, respectively. The holding grooves 58a and 59a are formed in a direction perpendicular to the longitudinal direction of the horizontal holding member 56. Furthermore, these holding grooves 58a and 59a are arranged in the longitudinal direction of the horizontal holding member 56 with predetermined pitches. This pitch is equal to a pitch with which the batch hand 40 of the carry-in-and-out mechanism 4 holds a plurality of substrates W, i.e., is equal to the substrate holding pitch in the FOUP F.

The pair of horizontal holding members 56 are attached to the rotation block 50 in a posture in which the horizontal holding members 56 are parallel to each other. When the pair of horizontal holding members 56 assume a posture along the vertical direction (Z direction), a plurality of substrates W assuming a horizontal posture can be supported from below by either the holding groove group 58 or the holding groove group 59. One (for example, the holding groove group 58) of the pair of holding groove groups 58 and 59 is used to hold unprocessed substrates W, whereas the other holding groove group (for example, the holding groove group 59) is used to hold already-processed substrates W. For example, when unprocessed substrates W delivered from the carry-in-and-out mechanism 4 are held, the holding groove groups 58 of the pair of horizontal holding members 56 are allowed to face each other. On the other hand, when processed substrates W delivered from the pusher 6 are held, the holding groove groups 59 of the pair of horizontal holding members 56 are allowed to face each other.

The pair of second holding mechanisms 52 has a pair of rod-like vertical holding members 60 disposed with an interval therebetween in the horizontal direction perpendicular to the conveying path TP1. These vertical holding members 60 are attached to the rotation block 50 in a posture parallel to the horizontal holding member 56. Each vertical holding member 60 includes a supporting rod 61 and a plurality of holding groove members 62 attached to the supporting rod 61. The holding groove members 62 are plate-like members fixed to the supporting rod 61 with predetermined pitches in the longitudinal direction of the supporting rod 61. This pitch is equal to the substrate holding pitch of the batch hand 40 in the carry-in-and-out mechanism 4. Each holding groove member 62 has a pair of holding grooves 63 and 64 formed in opposite end surfaces with the supporting rod 61 therebetween. The plurality of holding groove members 62 are arranged so that the holding grooves 63 and 64 are aligned in the longitudinal direction of the supporting rod 61. The holding grooves 63 and 64 are formed along a plane perpendicular to the longitudinal direction of the supporting rod 61.

The pair of vertical holding members 60 are attached to the rotation block 50 in a posture in which the vertical holding members 60 are parallel to each other. When the pair of vertical holding members 60 assume a posture along the horizontal direction, a plurality of substrates W assuming a vertical posture are supported from below by either the holding groove 63 or the holding groove 64. One (for example, the holding groove 63) of the pair of holding grooves 63 and 64 is used to hold unprocessed substrates W, whereas the other holding groove (for example, the holding groove 64) is used to hold already-processed substrates W. For example, when unprocessed substrates W delivered from the carry-in-and-out mechanism 4 are held, the holding grooves 63 of the holding groove members 62 held by the pair of supporting rods 61 are allowed to face each other. On the other hand, when processed substrates W delivered from the pusher 6 are held, the holding grooves 64 of the holding groove members 62 held by the pair of supporting rods 61 are allowed to face each other.

The rotation block 50 is rotated between a horizontal holding posture (posture shown in FIG. 3A and FIG. 3B) in which the first and second holding mechanisms 51, 52 and the substrate regulating mechanism 53 assume a vertical posture and a vertical holding posture (posture shown by the alternate long and two short dashes line in FIG. 2A and FIG. 2B) in which the first and second holding mechanisms 51, 52 and the substrate regulating mechanism 53 assume a horizontal posture. In the following description, the posture of the first holding mechanism 51, the posture of the second holding mechanism 52, and the posture of the substrate regulating mechanism 53 will be also referred to as a horizontal holding posture when the rotation block 50 assumes a horizontal holding posture, whereas the posture of the first holding mechanism 51, the posture of the second holding mechanism 52, and the posture of the substrate regulating mechanism 53 will be also referred to as a vertical holding posture when the rotation block 50 assumes a vertical holding posture. When the rotation block 50 assumes a horizontal holding posture, the peripheral edge of a substrate W assuming a horizontal posture is supported from below by the horizontal holding member 56 of the first holding mechanism 51 at two places facing each other. On the other hand, when the rotation block 50 assumes a vertical holding posture, the peripheral edge of a substrate W assuming a vertical posture is supported by the holding groove member 62 of the second holding mechanism 52 at two lower places.

When the rotation block 50 assumes a vertical holding posture, the second holding mechanism 52 is located below the first holding mechanism 51. The holding groove member 62 included in the second holding mechanism 52 is attached to the supporting rod 61 with a gap 65 wider than the thickness of a substrate W. The interval between the pair of supporting rods 61 is greater than the width (diameter if a circular substrate is used) of a substrate W. The interval between the bottoms of the holding grooves 58a and 59a facing each other of the pair of horizontal holding members 56 is greater than the width (diameter if a circular substrate is used) of a substrate W. Therefore, when substrates W are delivered to and from the pusher 6 in a state in which the first and second holding mechanisms 51 and 52 assume a vertical holding posture, the substrates W held at the position corresponding to the gap 65 pass through the space between the first and second holding mechanisms 51 and 52.

The substrate regulating mechanism 53 is a round-bar-like member disposed in parallel with the first and second holding mechanisms 51 and 52. The substrate regulating mechanism 53 is attached to the rotation block 50 so that the substrate regulating mechanism 53 is closer to the pusher 6 than to the second holding mechanism 52 when a horizontal holding posture is assumed. The substrate regulating mechanism 53 is movable in a direction in which the pair of second holding mechanisms 52 face each other. In other words, the substrate regulating mechanism 53 is movable between a regulating position (position shown by the solid line in FIG. 3A) in which contact with the peripheral end surface of a substrate W is achieved near an intermediate position between the pair of second holding mechanisms 52 and a receding position (position shown by the phantom line in FIG. 3A) in which interference with the substrate W does not occur. When the substrate regulating mechanism 53 is in the receding position, the substrate regulating mechanism 53 does not interfere with a substrate W when this substrate W moves in the direction in which the first and second holding mechanisms 51 and 52 are arranged (i.e., in the direction along the conveying path TP1).

Driving mechanisms that drive the first and second holding mechanisms 51, 52 and the substrate regulating mechanism 53, respectively, are housed in the rotation block 50.

The driving mechanism 81 for the first holding mechanism 51 includes a bearing 82 that supports the supporting rod 57 in a state in which the supporting rod 57 can rotate around the axis thereof, a motor 83 that provides a rotational force around the axis to the supporting rod 57, and a cylinder 85 that slides a support plate 84 supporting the motor 83 in the longitudinal direction of the supporting rod 57 by a predetermined stroke. The driving of the motor 83 makes it possible to select either the holding groove groups 58 or the holding groove groups 59 so as to hold substrates W while allowing the holding groove groups of the pair of first holding mechanisms 51 to face each other. Furthermore, the driving of the cylinder 85 makes it possible to move the positions of the holding grooves 58a and 59a in the longitudinal direction of the supporting rod 57 by a slight distance. Therefore, when the rotation block 50 is in a vertical holding posture, the surfaces of the holding grooves 58a and 59a can recede from the substrate W.

The driving mechanism 87 for the second holding mechanism 52 includes a rail 89 fixed onto the support plate 88, a movement base 90 that moves along the rail 89, and a bearing 91 attached to the movement base 90. The bearing 91 supports the supporting rod 61 of the second holding mechanism 52 so as to be rotatable around its axis line. The driving mechanism 87 additionally includes a motor 92 that provides a rotational force to the supporting rod 61. The motor 92 is attached to a surface on the side opposite to the bearing 91 in the movement base 90. The driving of the motor 92 makes it possible to select either the holding groove 63 or the holding groove 64 of the holding groove member 62 so as to hold substrates W. The rail 89 is disposed along a direction along which the first and second holding mechanisms 51 and 52 are arranged (i.e., along a direction parallel to the conveying path TP1). The movement base 90 that moves on the rail 89 is connected to a driving rod of the cylinder 94 through a connection member 93. Therefore, the second holding mechanism 52 moves along the rail 89 by driving the cylinder 94. As a result, when the rotation block 50 is in a horizontal holding posture, the second holding mechanism 52 can be allowed to proceed to or recede from substrates W held by the first holding mechanism 51 in a horizontal posture.

The driving mechanism 96 for the substrate regulating mechanism 53 includes a rail 97 disposed in parallel with a direction in which the pair of second holding mechanisms 52 face each other, a movement base 98 that moves along the rail 97, and an actuator 100 (formed of, for example, a ball screw mechanism) that moves the movement base 98 along the rail 97. A basal end of the substrate regulating mechanism 53 is connected to the movement base 98. The movement base 98 is connected to an operating part of the actuator 100 through a connection member 99. The substrate regulating mechanism 53 is moved between the regulating position and the receding position mentioned above by driving the actuator 100.

FIG. 4 is an elevational view for explaining the structure of the pusher 6. The pusher 6 has an elevation holding portion 105 that holds a plurality of substrates W in a state in which the substrates W are piled in the horizontal direction in a vertical posture with a half pitch. The elevation holding portion 105 is connected to an upper end of a rotary shaft portion 106 that rotates around the vertical axis line thereof. The rotary shaft portion 106 is rotatably supported by a traverse base 107. The traverse base 107 is supported by an elevation base 108. The elevation base 108 is connected to an operating member 11a of a linear actuator 110. The linear actuator 110 has a built-in ball screw mechanism and a built-in linear guide, and drives the operating member 110a upwardly and downwardly by receiving a driving force from a motor 111 connected to its upper end. The elevation base 108 is moved upwardly and downwardly thereby.

The elevation holding portion 105 is raised and lowered in an area including the origin height H10, the first transfer height H11, and the second transfer height H12 by moving the elevation base 108 upwardly and downwardly.

The traverse base 107 has a built-in rotation driving mechanism 112 that rotates the rotary shaft portion 106 around the vertical axis line thereof. This makes it possible to allow the elevation holding portion 105 to assume a posture along the conveying path TP1 (i.e., posture shown by the phantom line in FIG. 2A) or to assume a posture along the conveying path TP2 (i.e., posture shown by the solid line in FIG. 2A). Furthermore, to organize a face-to-face batch and disorganize such a batch, the direction of the elevation holding portion 105 (i.e., direction in which a plurality of substrates W are piled) can be reversed 180 degrees.

The elevation base 108 is provided with a pair of rails 113. The pair of rails 113 are disposed in a direction (horizontal direction) in which a plurality of substrates W held by the elevation holding portion 105 are piled. The traverse base 107 is movable on the rails 113. The elevation base 108 has a slide driving mechanism 114 that moves the traverse base 107 along the rails 113 by a slight distance (equal to a half pitch). The slide driving mechanism 114 includes, for example, a ball screw mechanism having a screw shaft and a ball nut screwed to the shaft. The traverse base 107 is connected to the ball nut through a connection member. According to this structure, in order to organize a face-to-back batch and disorganize such a batch, the elevation holding portion 105 can be horizontally moved by a distance equal to a half pitch.

The elevation holding portion 105 has a first guide 116 and a second guide 117, and is arranged to use these guides to hold unprocessed substrates W and processed substrates W, respectively. The first guide 116 has three supporting members 118 disposed in parallel along the horizontal direction. The second guide 117 has three supporting members 119 disposed in parallel along the horizontal direction. A plurality of substrate holding grooves (for example, fifty-two substrate holding grooves) are formed on each of the upper surfaces of the supporting members 118 and 119 with half pitches.

The second guide 117 is fixed to the upper end of the rotary shaft portion 106, whereas the first guide 116 is supported by an elevation shaft 120. The elevation shaft 120 is moved upwardly and downwardly by a slight distance by means of an up-and-down driving mechanism (not shown) built into the movement base 107. As a result, the substrate support height of the first guide 116 can be made greater than the substrate support height of the second guide 117, or, contrary to this, the substrate support height of the first guide 116 can be made smaller than the substrate support height of the second guide 117. Accordingly, one of the first and second guides 116 and 117 which has a greater substrate support height than the other can be used to support substrates W. Therefore, for example, the first guide 116 can be used to hold unprocessed substrates W received from the posture changing mechanism 5, whereas the second guide 117 can be used to hold processed substrates W received from the delivery mechanism 7.

FIG. 5 is an elevational view for explaining a structure relative to the delivery mechanism 7, seen from the direction of arrow A2 of FIG. 2A. The expelling mechanism 70 includes the expelling chuck 73 and a traversing mechanism 76 that laterally moves the expelling chuck 73 in the X direction. The carry-in mechanism 71 includes the carry-in chuck 74 and a traversing mechanism 77 that laterally moves the carry-in chuck 74 in the X direction. The intermediary mechanism 72 includes the intermediary chuck 75 and an elevation driving mechanism 78 that moves the intermediary chuck 75 upwardly and downwardly. The elevation driving mechanism 78 includes a linear actuator 125, which has a built-in ball screw and a built-in linear guide, and a motor 126 that provides a driving force to the linear actuator 125. The linear actuator 125 obtains a driving force from the motor 126, and moves an operating element 125a upwardly and downwardly. The intermediary chuck 75 is connected to the operating element 125a through a connection bracket 127.

Figure 6:
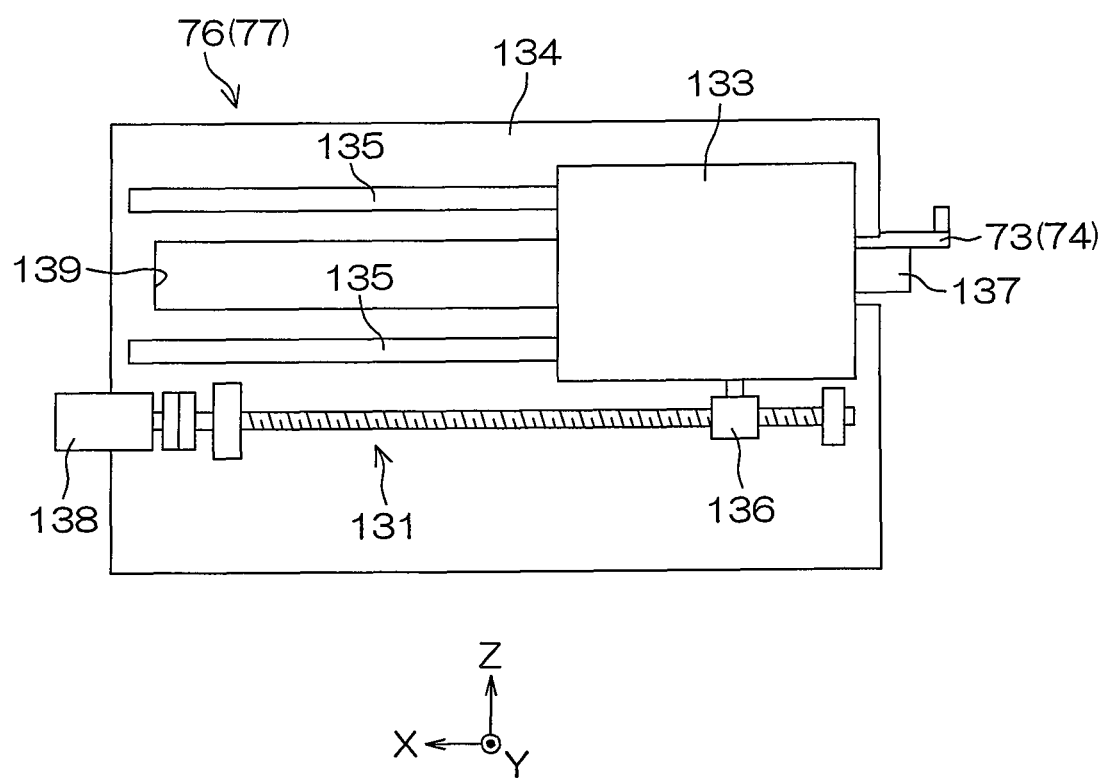
FIG. 6 is a side view for explaining the internal structure of a traversing mechanism of an expelling mechanism.

FIG. 6 is a side view for explaining the internal structure of the traversing mechanism 76 of the expelling mechanism 70, schematically showing the structure seen from the direction of arrow A3 of FIG. 5. A description will be hereinafter given with reference to not only FIG. 6 but also FIG. 5.

The traversing mechanism 76 includes a ball screw mechanism 131 built into a plate-like support block 130 attached to a frame on the side of the front surface 10a of the substrate processing apparatus 10 in a vertical posture, a movement plate 133 that horizontally moves in the X direction within an operating space 132 defined by excavating the support block 130 from the expelling-chuck side (73) above the ball screw mechanism 131 (see FIG. 5), a fixed plate 134 fixed to the support block 130 in such a way as to cover the operating space 132 from the expelling-chuck side (73), and a pair of upper and lower rails 135 disposed along the X direction (i.e., direction along the conveying path TP2) on a surface of the fixed plate 134 facing the operating space 132.

The movement plate 133 is connected to the rails 135, and is horizontally movable in the X direction along the rails 135. The movement plate 133 is connected to a ball nut 136 of the ball screw mechanism 131. Furthermore, the movement plate 133 is connected to the expelling chuck 73 through a connection member 137.

The fixed plate 134 has a cutout 139 formed along the movement path in the X direction of the connection member 137. Therefore, if the ball nut 136 is moved in the X direction by driving the motor 138 of the ball screw mechanism 131, the expelling chuck 73 can be moved in the X direction along with the movement plate 133.

The traversing mechanism 77 of the carry-in chuck 74 also has the same structure. Therefore, in FIG. 5, the same reference numerals are given to the corresponding parts of the traversing mechanism 77, and a description of such parts are omitted.

FIGS. 7A, 7B, and 7C are views for explaining the structure of the expelling chuck 73. FIG. 7A is a plan view, FIG. 7C is a side view seen in the −Y direction, and FIG. 7B is a rear view seen in the −X direction.

The expelling chuck 73 includes a pair of substrate guides 140, which extend in parallel with each other in the X direction and each of which is shaped like a cantilever beam, and a base portion 141 that supports these substrate guides 140 in a cantilever manner. The substrate guide 140 has a plurality of holding grooves formed in the upper surface of the substrate guide 140 that are used to support the lower edges of a plurality of substrates W piled in the horizontal direction in a vertical posture. The interval between the holding grooves is equal to a half pitch. The base portion 141 is an elongated member that extends in the Y direction and that has a cross section shaped like the letter C. A pair of cylinders 142 are held by the base portion 141 in a state in which operating rods face each other. A linear guide 143 is fixed to a side surface of the base portion 141 on the substrate-guide side (140) with extending in the Y direction. The pair of substrate guides 140 are attached to the linear guide 143 through a connection member 144. Accordingly, the pair of substrate guides 140 face each other in the Y direction at the same height position, and are movable in the Y direction.

The connection member 144 is connected to the basal end of the substrate guide 140, and an uprise wall portion 145 that uprises from the basal end is connected to the linear guide 143. Furthermore, a horizontal portion 146 horizontally extending from the upper end of the inner edge of the uprise wall portion 145 is connected to the operating rod of the cylinder 142 through a through-hole 147 of the base portion 141. The through-hole 147 is a long hole extending in the longitudinal direction of the base portion 141.

The pair of cylinders 142 are synchronously driven. The operating rods of these cylinders 142 extend and contract, and, as a result, the pair of substrate guides 140 can occupy a closed position (position shown by the solid line) in which the interval therebetween is narrowed and an open position (position shown by the phantom line) in which the interval therebetween is widened. Substrates W can be supported from below by bringing the substrate guides 140 into the closed position. Thus, the pair of cylinders 142 serves as a guide opening-and-closing unit for allowing the pair of substrate guides to perform switching between the closed position and the open position.

When the expelling chuck 73 is in a closed state by bringing the pair of substrate guides 140 into the closed position, the interval between the substrate guides 140 is wider than the width of the elevation holding portion 105 of the pusher 6. Therefore, in the substrate transfer position S (see FIG. 2A), in a state in which substrates W are held while the expelling chuck 73 is in a closed state, the elevation holding portion 105 of the pusher 6 can be raised to the second transfer height H12 through the space between the pair of substrate guides 140. Accordingly, the substrates W can be transferred from the expelling chuck 73 to the elevation holding portion 105 of the pusher 6.

When the expelling chuck 73 is in an open state by bringing the pair of substrate guides 140 into the open position, the interval between the substrate guides 140 is wider than the width of a substrate W (diameter if a circular substrate is used), and the substrate W can pass through the space between the substrate guides 140. Therefore, in the substrate transfer position S, if substrates W are transferred from the expelling chuck 73 to the elevation holding portion 105 of the pusher 6, and then the expelling chuck 73 is brought into an open state, the pusher 6 and the substrates W held thereby can be lowered through the space between the pair of substrate guides 140.

FIGS. 8A, 8B, and 8C are views for explaining the structure of the carry-in chuck 74. FIG. 8A is a plan view, FIG. 8C is a side view seen in the −Y direction, and FIG. 8B is a rear view seen in the −X direction.

The carry-in chuck 74 includes a pair of substrate guides 148, which extend in parallel with each other in the X direction at the same height position and each of which is shaped like a cantilever beam, and a base portion 149 connected to the basal ends of these substrate guides 148. The substrate guide 148 has a plurality of holding grooves formed in the upper surface of the substrate guide 148 that are used to support the lower edges of a plurality of substrates W piled in the horizontal direction in a vertical posture. The interval between the holding grooves is equal to a half pitch. The interval between the pair of substrate guides 148 is fixed, and is wider than the width of the elevation holding portion 105 of the pusher 6.

In the substrate transfer position S, when substrates W are transferred from the elevation holding portion 105 of the pusher 6 to the carry-in chuck 74, the elevation holding portion 105 holding these substrates W is placed at the first transfer height H11, and the carry-in chuck 74 is guided to a position below this height. The elevation holding portion 105 is allowed to pass through the space between the pair of substrate guides 148 from this state, and is lowered, and, as a result, the substrates W are transferred from the elevation holding portion 105 to the carry-in chuck 74.

Figure 9A:
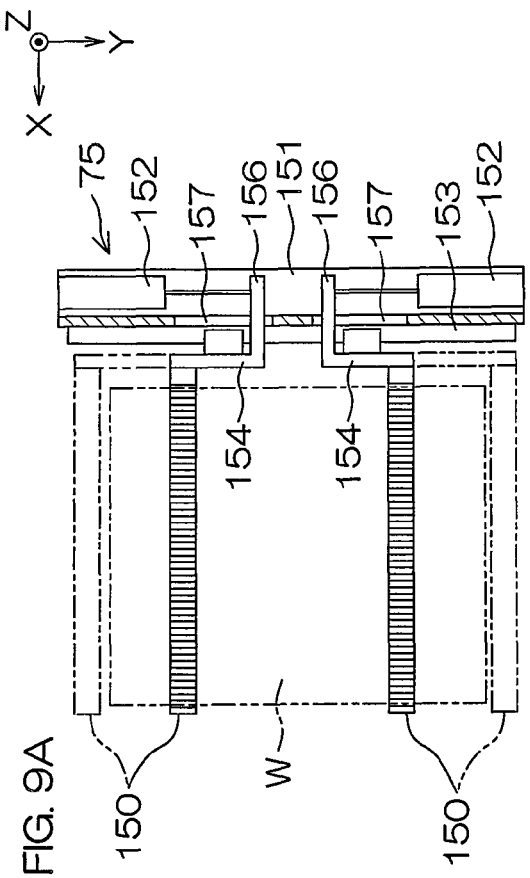
FIGS. 9A, 9B, and 9C are views for explaining the structure of an intermediary chuck.
Figure 9C:
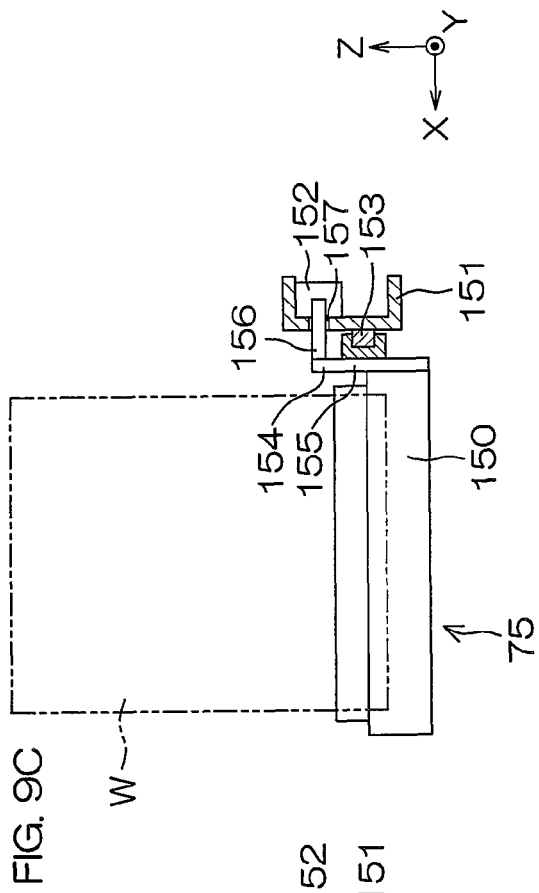
Figure 9B:
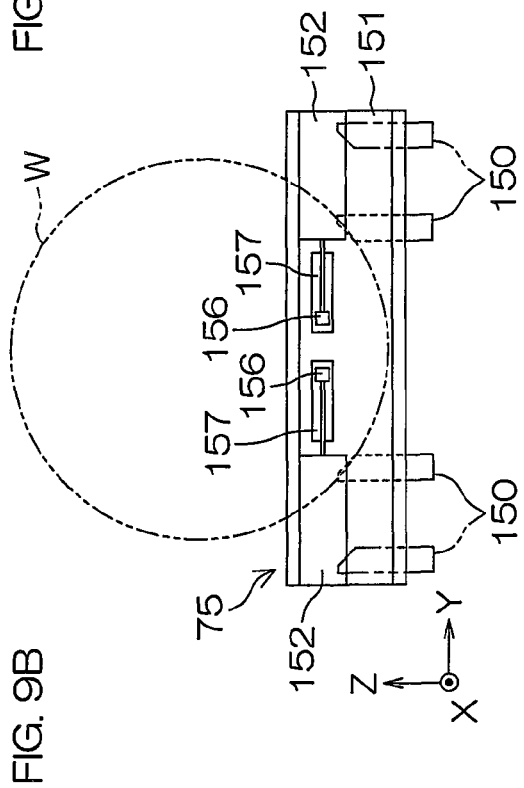

FIGS. 9A, 9B, and 9C are views for explaining the structure of the intermediary chuck 75. FIG. 9A is a plan view, FIG. 9C is a side view seen in the −Y direction, and FIG. 9B is a rear view seen in the −X direction.

The intermediary chuck 75 includes a pair of substrate guides 150, which extend in parallel with each other in the X direction and each of which is shaped like a cantilever beam, and a base portion 151 that supports these substrate guides 150 in a cantilever manner. The substrate guide 150 has a plurality of holding grooves formed in the upper surface of the substrate guide 150 that are used to support the lower edges of a plurality of substrates W piled in the horizontal direction in a vertical posture. The interval between the holding grooves is equal to a half pitch. The base portion 151 is an elongated member that extends in the Y direction and that has a cross section shaped like the letter C. A pair of cylinders 152 are held by the base portion 151 in a state in which operating rods face each other. A linear guide 153 is fixed to a side surface of the base portion 151 on the substrate-guide side (150) as extending in the Y direction. The pair of substrate guides 150 are attached to the linear guide 153 through a connection member 154. Accordingly, the pair of substrate guides 150 face each other in the Y direction at the same height position, and are movable in the Y direction.

The connection member 154 is connected to the basal end of the substrate guide 150, and an uprise wall portion 155 that uprises from the basal end is connected to the linear guide 153. Furthermore, a horizontal portion 156 horizontally extending from the upper end of the inner edge of the uprise wall portion 155 is connected to the operating rod of the cylinder 152 through a through-hole 157 of the base portion 151. The through-hole 157 is a long hole extending in the longitudinal direction of the base portion 151.

The pair of cylinders 152 are synchronously driven. The operating rods of these cylinders 152 extend and contract, and, as a result, the pair of substrate guides 150 can occupy a closed position (position shown by the solid line) in which the interval therebetween is narrowed and an open position (position shown by the phantom line) in which the interval therebetween is widened. Substrates W can be supported from below by bringing the substrate guides 150 into the closed position.

When the intermediary chuck 75 is in an open state by bringing the pair of substrate guides 150 into the open position, the interval between the substrate guides 150 is wider than the width of a substrate W (diameter if a circular substrate is used), and the substrate W can pass through the space between these substrate guides 150. Therefore, in the substrate delivery position P, if the intermediary chuck 75 is brought into an open state and is lowered when the carry-in chuck 74 holds the substrate W at the carry-in height H1, the substrate guides 150 can move to a place below the carry-in chuck 74 without causing interfere with the substrate W held by the carry-in chuck 74.

When the intermediary chuck 75 is in a closed state by bringing the pair of substrate guides 150 into the closed position, the interval between the pair of substrate guides 150 is narrower than the interval between the pair of substrate guides 148 of the carry-in chuck 74. Therefore, in the substrate delivery position P (see FIG. 2A), if the intermediary chuck 75 is brought into a closed state and is raised to the transfer height H2 from below the carry-in chuck 74 when the carry-in chuck 74 holds substrates W at the carry-in height H1, the substrates W can be delivered from the carry-in chuck 74 to the intermediary chuck 75.

Figure 10A:
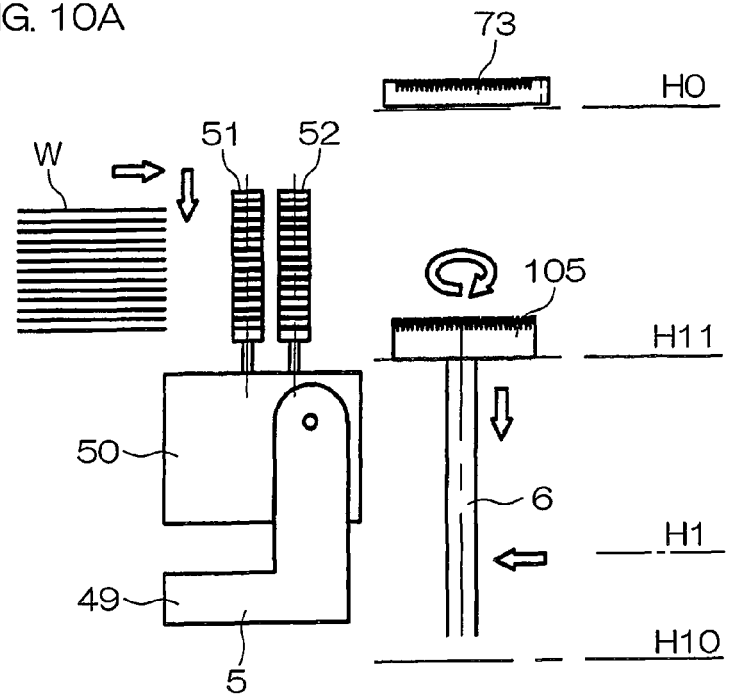
FIGS. 10A to 10Q are schematic explanatory views for explaining the flow of a substrate carrying-in operation.
Figure 10B:
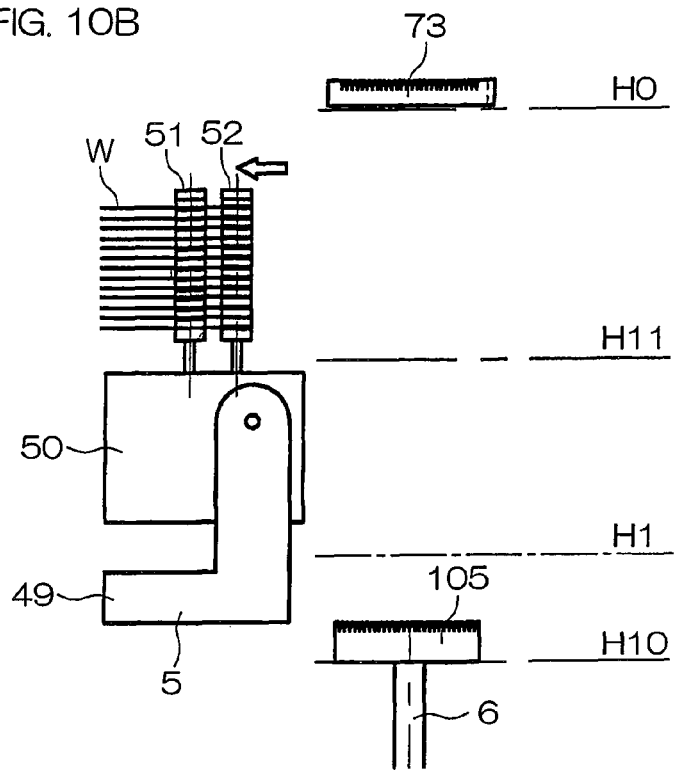
Figure 10C:
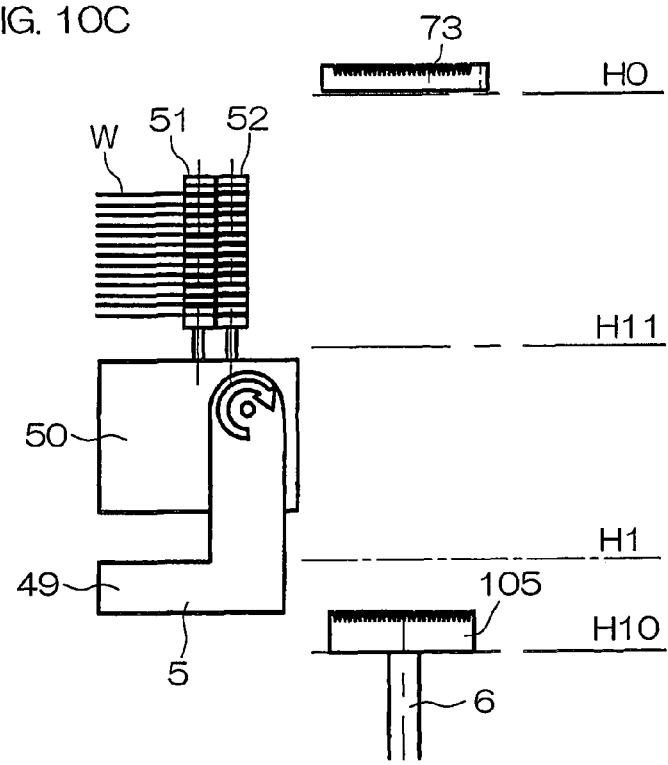
Figure 10D:
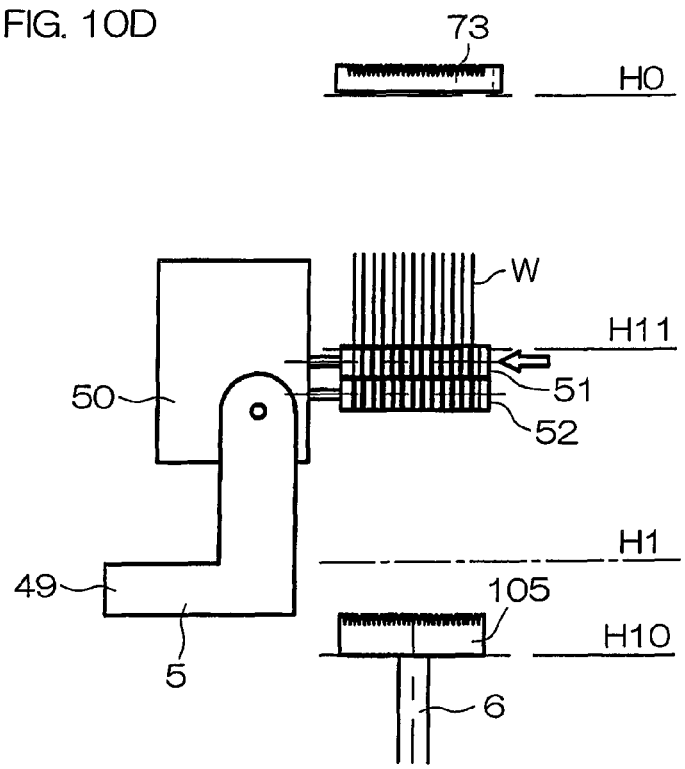
Figure 10E:
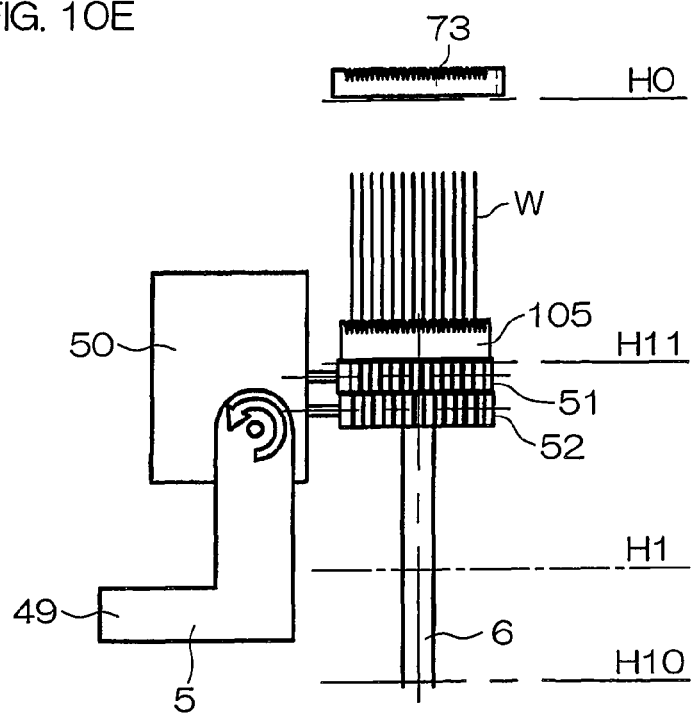
Figure 10F:
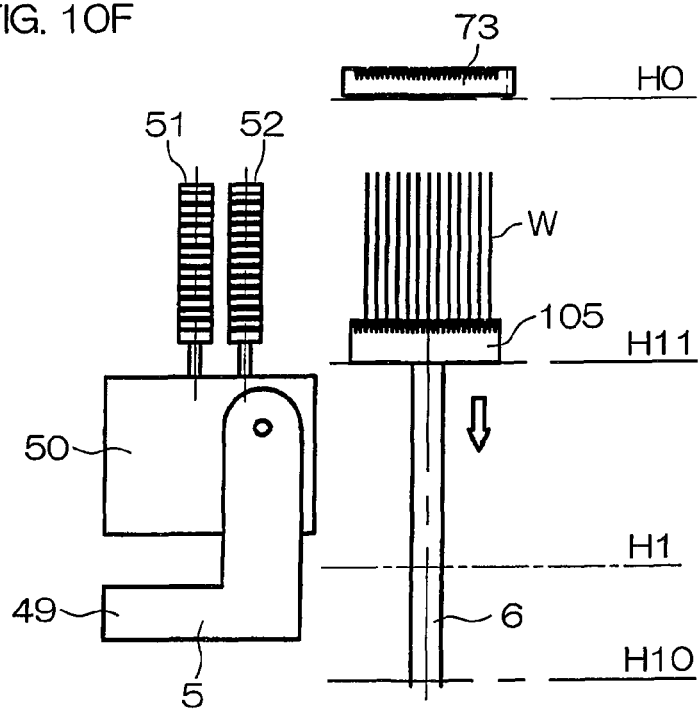
Figure 10G:
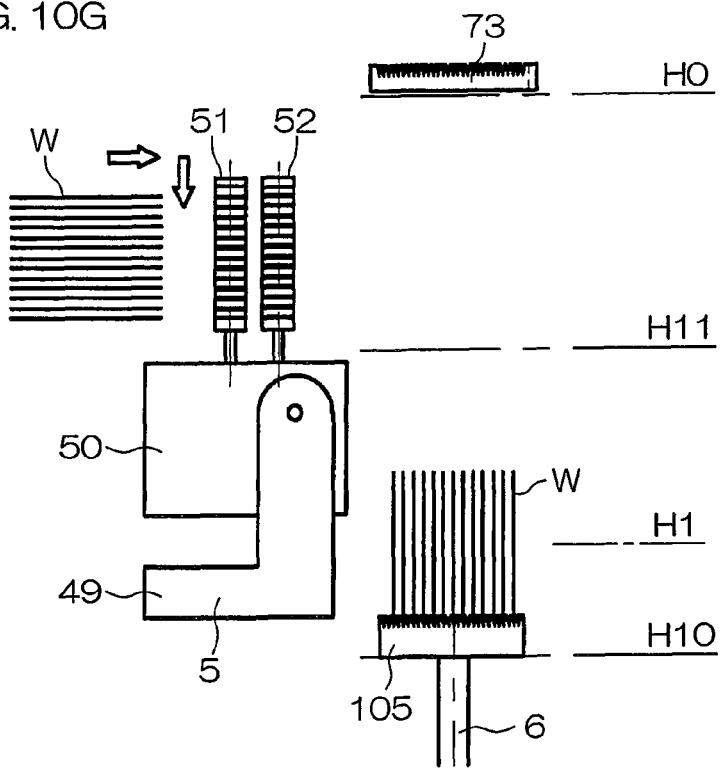
Figure 10H:
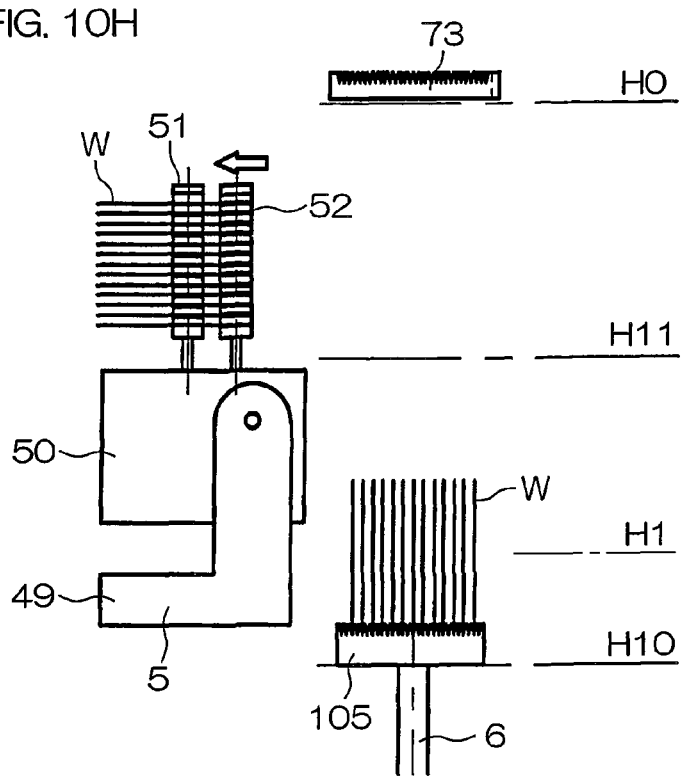
Figure 10I:
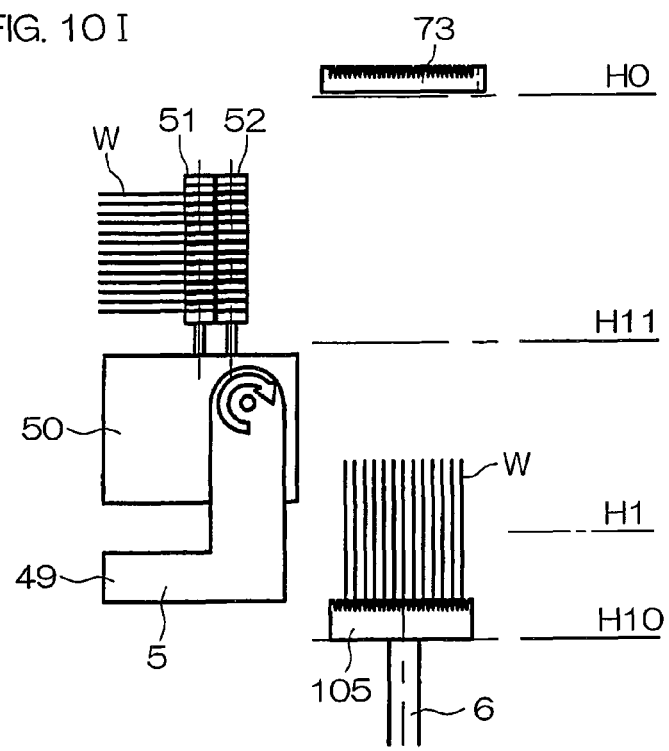
Figure 10J:
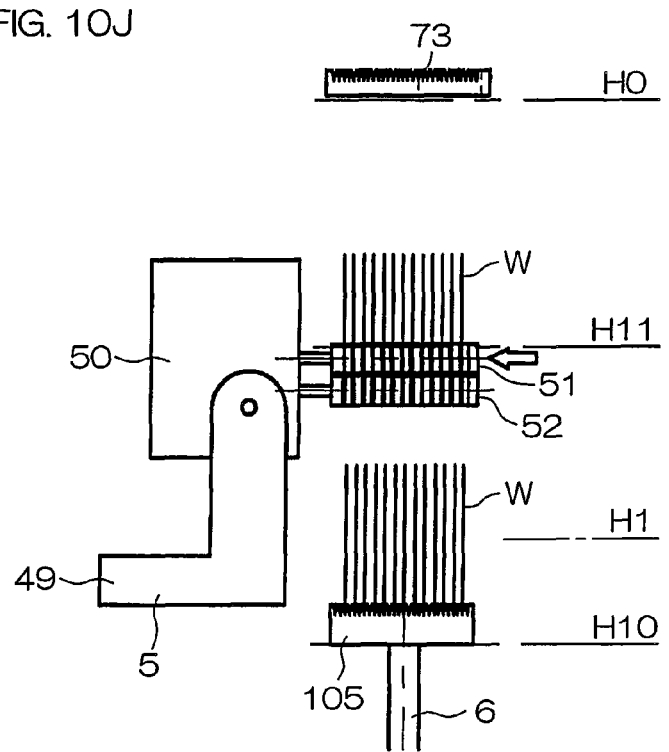
Figure 10K:
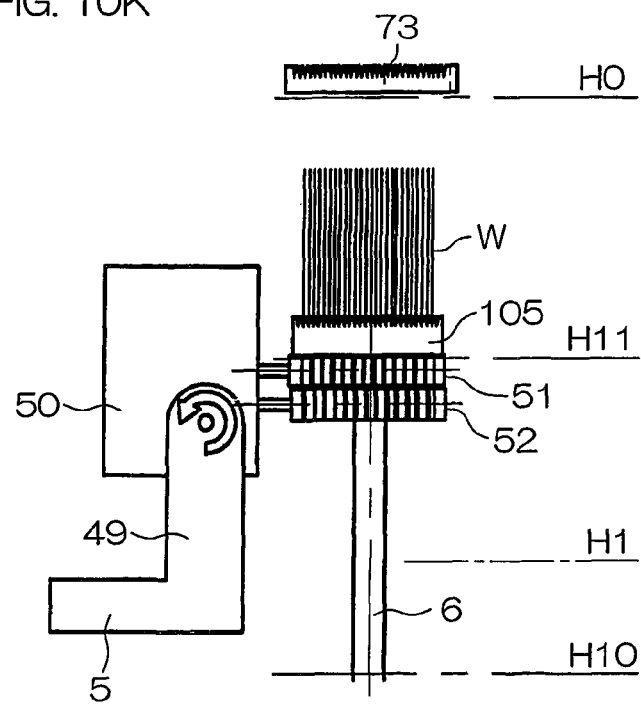
Figure 10L:
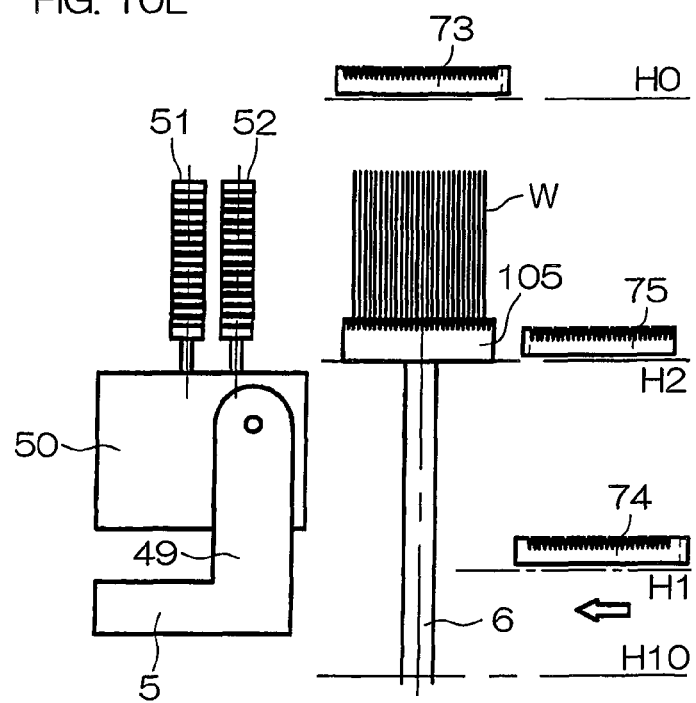
Figure 10M:
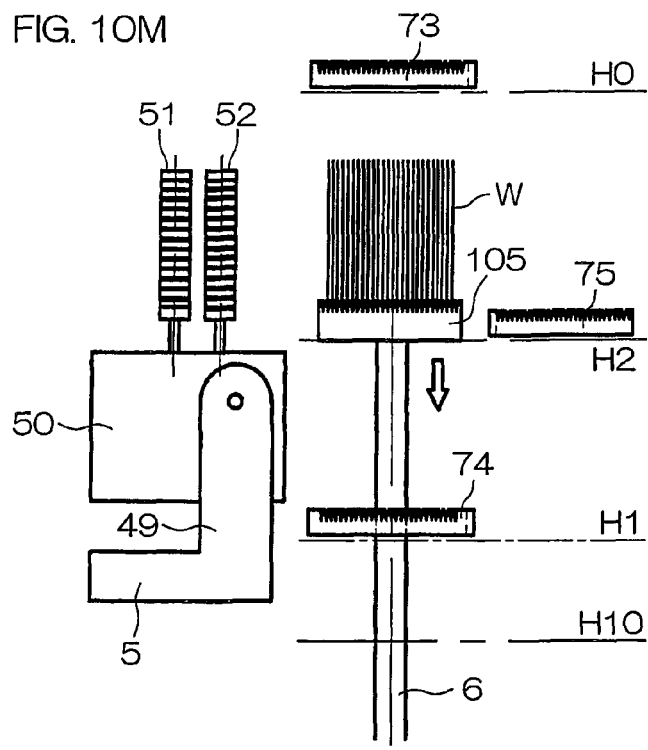
Figure 10N:
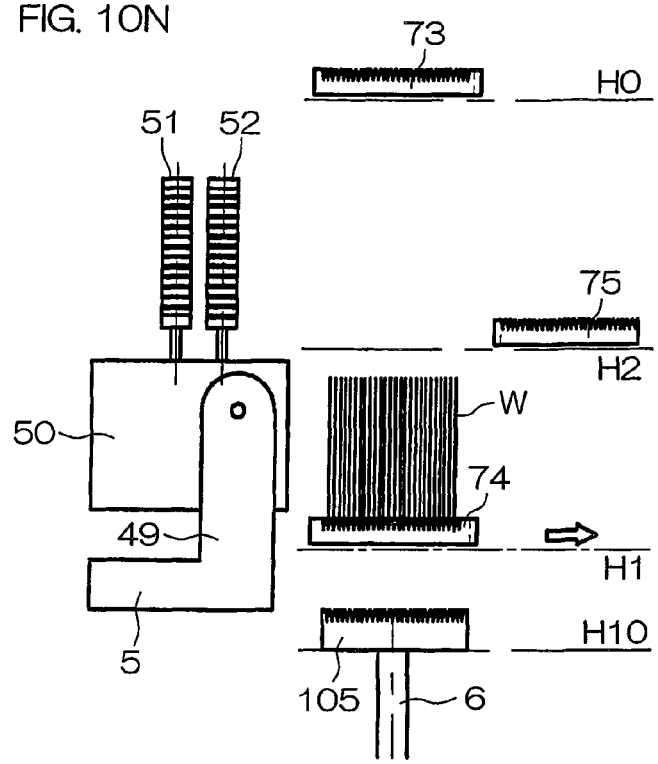
Figure 10O:
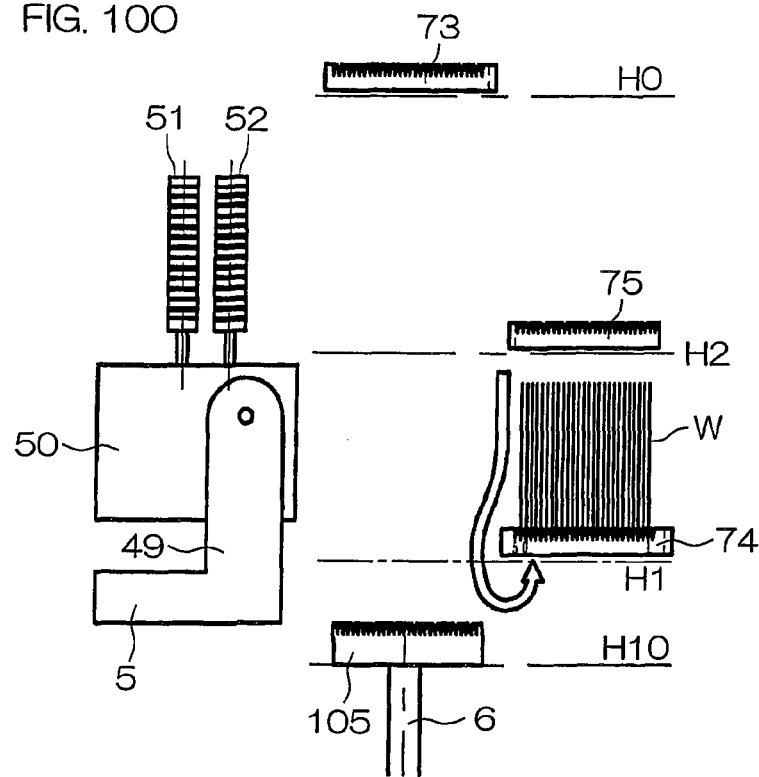
Figure 10P:
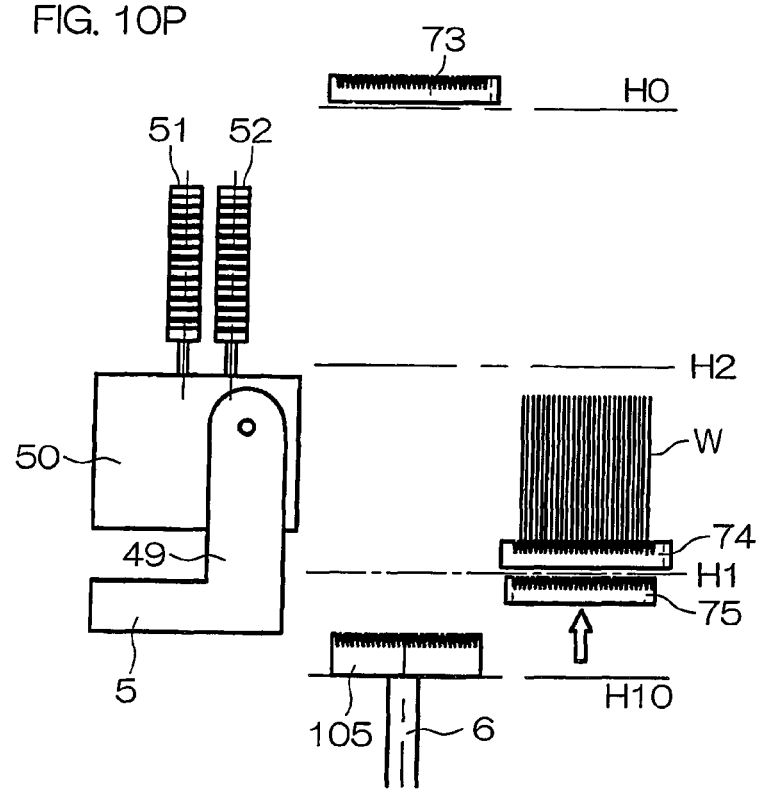
Figure 10Q:
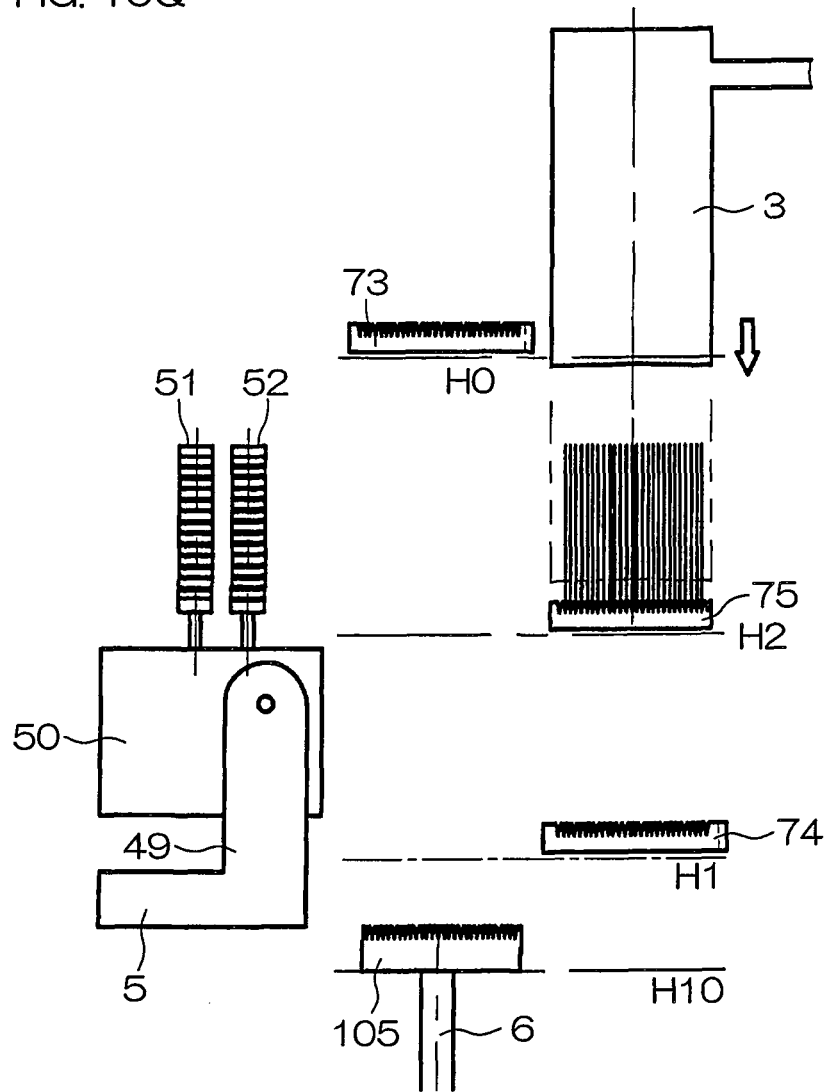

FIGS. 10A to 10Q are schematic explanatory views for explaining the flow of a substrate carrying-in operation. This substrate carrying-in operation can be achieved by allowing the controller 9 (see FIG. 1) to control the components, i.e., control the main transfer mechanism 3, the carry-in-and-out mechanism 4, the posture changing mechanism 5, the pusher 6, and the delivery mechanism 7.

As shown in FIG. 10A, the carry-in-and-out mechanism 4 takes out a plurality of unprocessed substrates W (for example, twenty-five unprocessed substrates W) from the FOUP F held by the FOUP holding portion 1 by use of the batch hand 40, and conveys the unprocessed substrates W toward the posture changing mechanism 5. At this time, the posture changing mechanism 5 is controlled to assume a horizontal holding posture, and the pair of first holding mechanisms 51 are controlled to assume a posture in which holding groove groups (for example, the holding groove groups 58) used for unprocessed substrates are allowed to face each other, and the pair of second holding mechanisms 52 are controlled to assume a posture in which holding grooves (for example, the holding grooves 63) used for unprocessed substrates are allowed to face each other. The pair of second holding mechanisms 52 are disposed in a retreat position (i.e., position shown by the phantom line in FIG. 3A) to which the mechanisms retreat on the side opposite to the carry-in-and-out mechanism 4 so as not to come into contact with the substrate W. The substrate regulating mechanism 53 is disposed in a receding position (i.e., position shown by the phantom line in FIG. 3A). On the other hand, the expelling chuck 73 is disposed above the elevation holding portion 105 of the pusher 6 (i.e., at a carry-out height H0 in the substrate transfer position S). Therefore, the expelling chuck 73 does not obstruct substrate delivery between the main transfer mechanism 3 and the intermediary mechanism 72. The elevation holding portion 105 of the pusher 6 is rotated to an original position (i.e., rotational position in which the first half of a batch is received), and is moved to the origin height H10 below the second holding mechanism 52 assuming a vertical support posture.

In this state, a plurality of substrates W, which is the first half of a batch, is delivered from the carry-in-and-out mechanism 4 to the posture changing mechanism 5 in a batch manner as shown in FIG. 10B. At this time, the first holding mechanism 51 of the posture changing mechanism 5 inserts each substrate W into the pair of holding grooves 58a facing each other in the horizontal direction, and supports a pair of peripheral edges facing each other of the substrate W from below.

Thereafter, in the posture changing mechanism 5, the second holding mechanism 52 is laterally moved so as to approach the first holding mechanism 51. As a result, the state of FIG. 10C is reached. At this time, the second holding mechanism 52 is in an advancing position (i.e., position shown by the solid line in FIG. 3A), and a state is reached in which the substrate W has been inserted in the holding groove 63 for unprocessed substrates of the holding groove member 62.

The rotation block 50 of the posture changing mechanism 5 is rotated from this state, and assumes a vertical support posture as shown in FIG. 10D. Accordingly, the substrates W are changed from a horizontal posture to a vertical posture, and a state is reached in which the peripheral edge on the lower side of the substrate W has been held by the second holding mechanism 52. The first holding mechanism 51 is moved toward the rotation block 50 along its axial direction in this state, and each holding groove 58a is allowed to recede from the substrates W.

Thereafter, the elevation holding portion 105 of the pusher 6 is raised to the first transfer height H11 (height at which unprocessed substrates are received) as shown in FIG. 10E. At this time, the elevation holding portion 105 rises while passing through the space between the first and second holding mechanisms 51 and 52, and, as a result, receives a plurality of substrates W from the second holding mechanism 52 in a batch manner. Accordingly, half a batch of substrates W are held by the elevation holding portion 105 in a vertical posture. At this time, the elevation holding portion 105 holds the substrates W by use of the first guide 116 for unprocessed substrates.

Thereafter, the rotation block 50 of the posture changing mechanism 5 is rotated into a horizontal holding posture as shown in FIG. 10F. The first holding mechanism 51 is moved along its axial direction in a direction receding from the rotation block 50, and is returned to the original position. Furthermore, the second holding mechanism 52 is returned to the retreat position (position shown by the phantom line in FIG. 3A). The posture changing mechanism 5 is returned to the horizontal holding posture, and then the pusher 6 rotates the elevation holding portion 105 around the vertical axis line by 180 degrees. Thereafter, the elevation holding portion 105 is lowered to the origin height H10.

Thereafter, as shown in FIGS. 10G to 10J, the same operation as in FIGS. 10A to 10D is performed with respect to the other group of unprocessed substrates W that is the remainder of the batch. Accordingly, for example, twenty-five substrates W are held by the second holding mechanism 52 of the posture changing mechanism 5 in a vertical posture, and, for example, the other twenty-five substrates W are held by the elevation holding portion 105 in a vertical posture therebelow. At this time, the pitch between the substrates W held by the posture changing mechanism 5 is equal to the pitch between the substrates W held by the elevation holding portion 105. These substrates W are parallel to each other. When viewed planarly, both substrate groups are equal to each other in the horizontal-direction position parallel to the substrate surface, and the horizontal-direction positions thereof perpendicular to the substrate surface are deviated by a half pitch.

When the elevation holding portion 105 of the pusher 6 is raised from this state to the first transfer height H11 as shown in FIG. 10K, substrates W are delivered from the second holding mechanism 52 of the posture changing mechanism 5 to the elevation holding portion 105, and a state is reached in which, for example, fifty substrates W are held on the elevation holding portion 105 with half pitches. Batch organization is completed in this way. When the elevation holding portion 105 rises, the substrates W held by the elevation holding portion 105 rise while passing through a gap 65 (see FIG. 3B) between the holding groove members 62 of the second holding mechanism 52. Therefore, these substrates W do not interfere with the second holding mechanism 52.

Thereafter, the rotation block 50 of the posture changing mechanism 5 is rotated into a horizontal holding posture as shown in FIG. 10L. The first holding mechanism 51 is moved toward the front-end side along the axial direction, and is returned to the original position, whereas the second holding mechanism 52 is returned to the retreat position (position shown by the phantom line in FIG. 3A).

Thereafter, as shown in FIG. 10M, the carry-in chuck 74 moves laterally (horizontally) along the second traversing path 102 (see FIG. 2B) at the carry-in height H1, and proceeds from the substrate delivery position P to a position below the elevation holding portion 105 in the substrate transfer position S. The elevation holding portion 105 is rotated around the vertical axis line so that the substrate arranging direction matches the conveying path TP2. The carry-in height H1 is greater than the origin height H10 of the elevation holding portion 105, and is smaller than the first transfer height H11.

From this state, the pusher 6 lowers the elevation holding portion 105 from the first transfer height H11 to the origin height H10 as shown in FIG. 10N. The interval between the pair of substrate guides 148 of the carry-in chuck 74 is narrower than the width of the substrate W, and is wider than the width of the elevation holding portion 105. Therefore, the elevation holding portion 105 descends while passing through the space between the pair of substrate guides 140 of the carry-in chuck 74, and, during this process, unprocessed substrates W (for example, fifty unprocessed substrates W) are delivered from the elevation holding portion 105 to the carry-in chuck 74 in a batch manner.

Thereafter, as shown in FIG. 10O, the carry-in chuck 74 moves laterally at the carry-in height H1, and moves from the substrate transfer position S to the substrate delivery position P. Thereafter, the intermediary chuck 75 moves to a position below the carry-in height H1, i.e., below the carry-in chuck 74. Prior to this movement to the position therebelow, the intermediary chuck 75 is controlled to reach an open state in which the interval between the pair of substrate guides 150 has been opened. As a result, the interval therebetween becomes wider than the diameter of the substrate W. Therefore, the intermediary chuck 75 can move to the position below the carry-in chuck 74 without causing interference with the substrates W held by the carry-in chuck 74.

When the intermediary chuck 75 moves to the position below the carry-in chuck 74 in this way as shown in FIG. 10P, the intermediary chuck 75 is brought into a closed state in which the interval between the pair of substrate guides 150 has been narrowed. At this time, the pair of substrate guides 150 are located more inside than the pair of substrate guides 148 of the carry-in chuck 74.

From this state, the intermediary chuck 75 is raised to the transfer height H2 as shown in FIG. 10Q. During this raising process, the substrates W (for example, fifty substrates W) held by the carry-in chuck 74 are delivered to the intermediary chuck 75 in a batch manner. Thereafter, the substrates W held by the intermediary chuck 75 are received by the main transfer mechanism 3, and are conveyed to the substrate processing section 2.

When an aligning operation to align the directions of the substrates W is performed by the substrate-direction aligning mechanism 13, the aligning processing head 16 of the substrate-direction aligning mechanism 13 is raised from the state of FIG. 10O before lowering the intermediary chuck 75. Thereafter, aligning processing in which the directions of the substrates W are aligned is performed in a state in which the substrates W held by the carry-in chuck 74 have been raised by a slight distance. Thereafter, the substrates W that have undergone the aligning processing are delivered to the carry-in chuck 74 again by lowering the aligning processing head 16.

If the intermediary chuck 75 does not hold the substrates W in a state in which the carry-in chuck 74 has proceeded to the position of the pusher 6 (i.e., to the substrate transfer position S), the intermediary chuck 75 may be lowered from the state of FIG. 10N beforehand, and then the carry-in chuck 74 may be allowed to recede to the substrate delivery position P. If so, the intermediary chuck 75 can be lowered while maintaining the closed state, and hence the operation can be simplified.

FIGS. 11A to 11K are schematic explanatory views for explaining the flow of a substrate carrying-out operation. This substrate carrying-out operation can be achieved by allowing the controller 9 (see FIG. 1) to control the components, i.e., control the main transfer mechanism 3, the carry-in-and-out mechanism 4, the posture changing mechanism 5, the pusher 6, and the delivery mechanism 7.

Figure 11A:
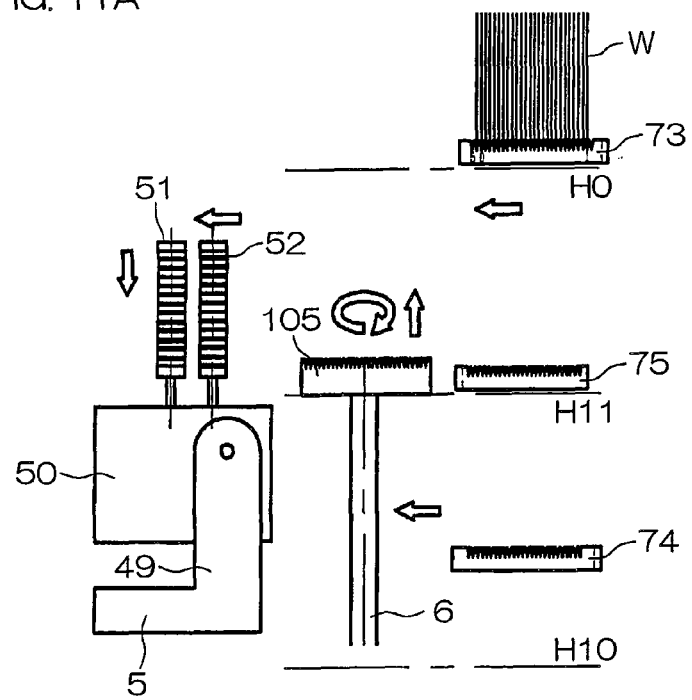
FIGS. 11A to 11K are schematic explanatory views for explaining the flow of a substrate carrying-out operation.

Substrates W that have been processed by the substrate processing section 2 are conveyed by the main transfer mechanism 3, and are delivered to the expelling chuck 73. Usually, the expelling chuck 73 is located above the elevation holding portion 105 of the pusher 6 (in the substrate transfer position S) so as not to disturb the access of the main transfer mechanism 3 to the intermediary chuck 75. Therefore, when already-processed substrates Ware expelled by the main transfer mechanism 3, the expelling chuck 73 moves laterally (horizontally) along the first traversing path 101 (see FIG. 2B) at the expelling height H0, and moves to the substrate delivery position P. After this movement, the processed substrates W are delivered from the main transfer mechanism 3 to the expelling chuck 73, and, as a result, the state of FIG. 11A is reached.

At this time, the posture changing mechanism 5 is controlled to assume a horizontal holding posture. The pair of first holding mechanisms 51 are controlled to assume a posture in which holding groove groups (for example, the holding groove groups 59) used for processed substrates are allowed to face each other, whereas the pair of second holding mechanisms 52 are controlled to assume a posture in which holding grooves (for example, the holding grooves 64) used for processed substrates are allowed to face each other. The pair of first holding mechanisms 51 are controlled to be located near the rotation block 50 along the axial direction (i.e., in the position in which an interval can be secured with respect to the substrates W held by the second holding mechanism 52 in a vertical posture). Furthermore, the pair of second holding mechanisms 52 are located in the advancing position (position shown by the solid line in FIG. 3A) in which the second holding mechanisms 52 have approached the first holding mechanism 51. The substrate regulating mechanism 53 is located in the receding position. The elevation holding portion 105 of the pusher 6 is controlled so that the substrate holding position of the second guide 117 used to hold processed substrates is located above the substrate holding position of the first guide 116 used to hold unprocessed substrates.

Figure 11B:
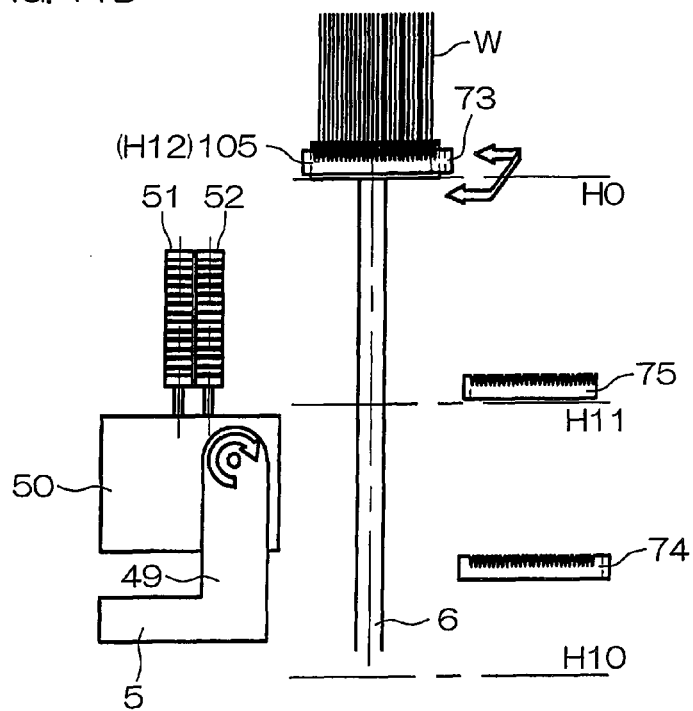
Figure 11E:
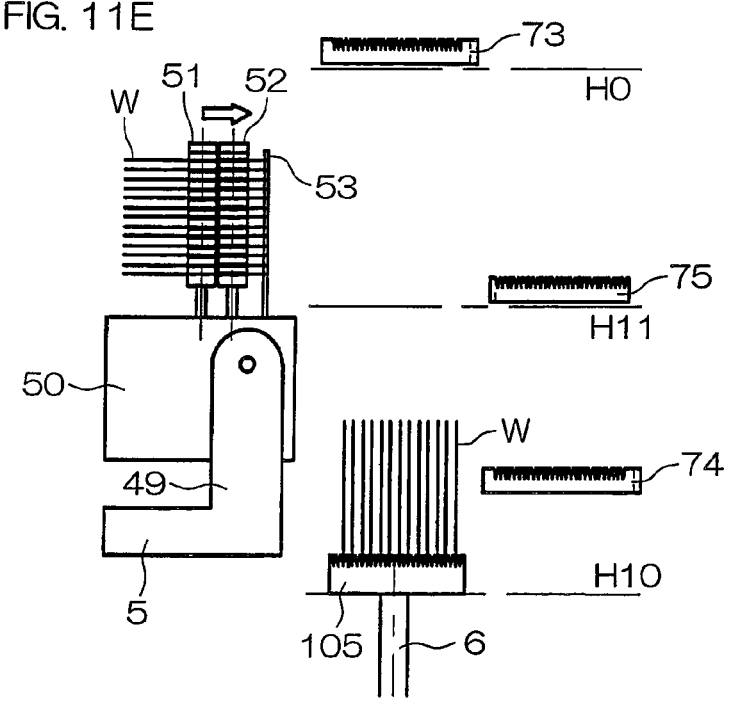

From this state, the expelling chuck 73 moves laterally at the expelling height H0, and moves to a position above the elevation holding portion 105 of the pusher 6 (in the substrate transfer position S) as shown in FIG. 11B. Thereafter, the elevation holding portion 105 rises to the position of the expelling chuck 73 (the second transfer height H12), and receives already-processed substrates W from the expelling chuck 73 in a batch manner. Until this substrate-receiving operation is completed, the expelling chuck 73 is in a closed state in which the interval between the pair of substrate guides 140 has been narrowed. In this closed state, the interval between the pair of substrate guides 140 is wider than the width of the elevation holding portion 105, and is narrower than the width (diameter) of the substrate W. Therefore, the elevation holding portion 105 passes through the space between the pair of substrate guides 140, then rises to the second transfer height H12, and receives the substrates W from the expelling chuck 73.

After the elevation holding portion 105 receives the processed substrates W from the expelling chuck 73, the expelling chuck 73 is controlled to reach an open state, and the interval between the pair of substrate guides 140 is made wider than the width (diameter) of the substrate W. Accordingly, it becomes possible for the elevation holding portion 105 to descend while avoiding the interference between the substrates W held thereby and the expelling chuck 73.

From this state, the rotation block 50 of the posture changing mechanism 5 is rotated and brought into a vertical holding posture as shown in FIG. 11c. Thereafter, the elevation holding portion 105 of the pusher 6 passes through the spaces between the pair of first holding mechanisms 51 and between the pair of second holding mechanisms 52, and descends to the origin height H10 as shown in FIG. 11D. During this process, half a batch of substrates W is delivered from the elevation holding portion 105 to the second holding mechanism 52. At this time, the other half passes through the gap 65 between the holding groove members 62 of the second holding mechanism 52, and remains held by the elevation holding portion 105. Batch disorganization is performed in this way. When the substrates W are located below the expelling chuck 73, the elevation holding portion 105 is rotated around the vertical axis line before the substrates W reach the first holding mechanism 51, whereby the arranging direction of the substrates W held by the elevation holding portion 105 is matched with the conveying path TP1.

Thereafter, the first holding mechanism 51 is moved toward the front-end side along the axial direction, and preparation is made for supporting the substrates W in a horizontal posture. Thereafter, the rotation block 50 of the posture changing mechanism 5 is rotated and brought into a horizontal holding posture as shown in FIG. 1E. As a result, the substrates W reach a state of being held by the first holding mechanism 51 in a horizontal posture. Furthermore, the substrate regulating mechanism 53 is moved to a regulating position to regulate the substrates W. In this state, the second holding mechanism 52 is retreated to the retreat position (position shown by the phantom line in FIG. 3A). If there are substrates W following the second holding mechanism 52 at this time, the movement of such substrates W is regulated by the substrate regulating mechanism 53. Therefore, the substrates W remain held by the first holding mechanism 51.

Figure 11F:
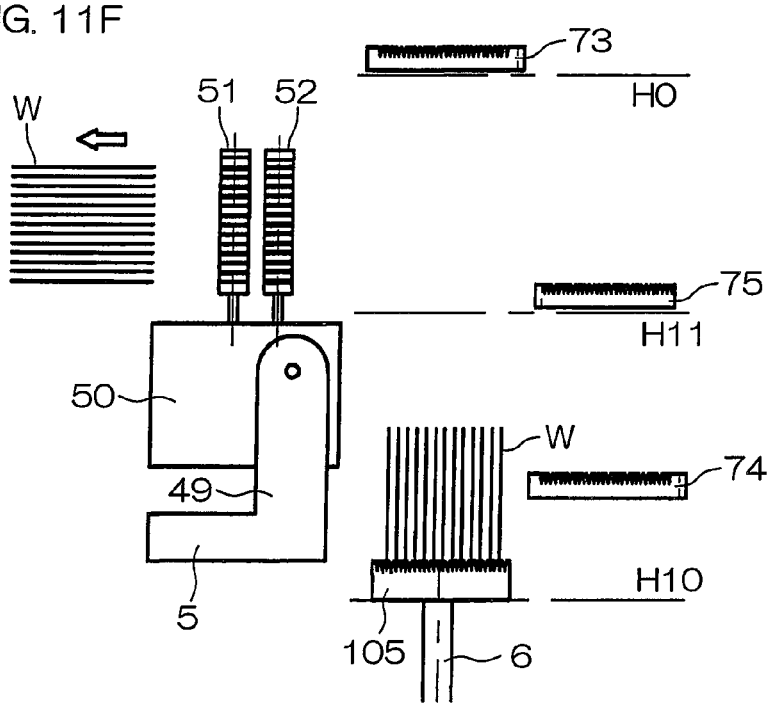

Thereafter, as shown in FIG. 11F, the substrates W held by the first holding mechanism 51 are carried out in a batch manner by the batch hand 40 of the carry-in-and-out mechanism 4, and are contained in a FOUP F held by the FOUP holding portion 1.

Figure 11G:
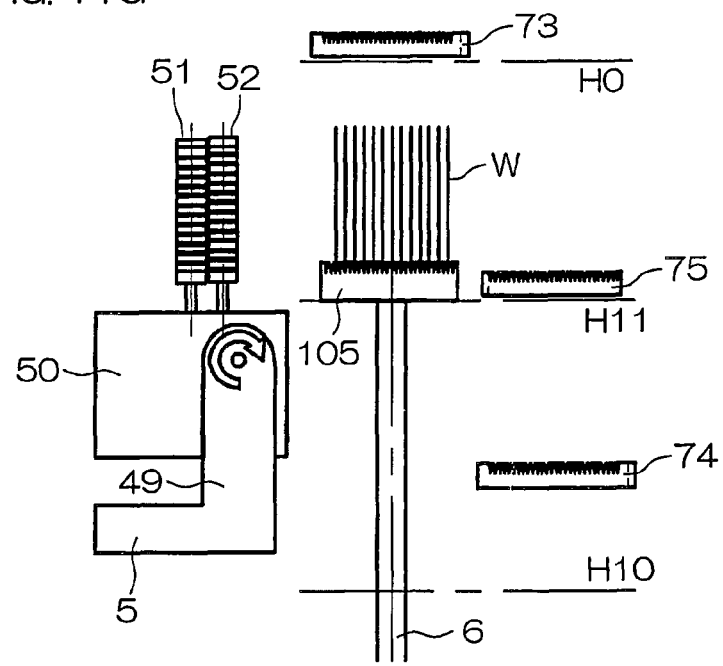

Thereafter, as shown in FIG. 11G, the pair of first holding mechanisms 51 are moved toward the basal-end side along the axial direction, and it becomes possible to secure a space to the substrates W when the substrates W are held by the second holding mechanism 52 in a vertical posture. Furthermore, the pair of second holding mechanisms 52 are located in the advancing position (position shown by the solid line in FIG. 3A) in which the second holding mechanisms have approached the first holding mechanism 51. The substrate regulating mechanism 53 is located in the receding position. The pusher 6 raises the elevation holding portion 105.

Figure 11H:
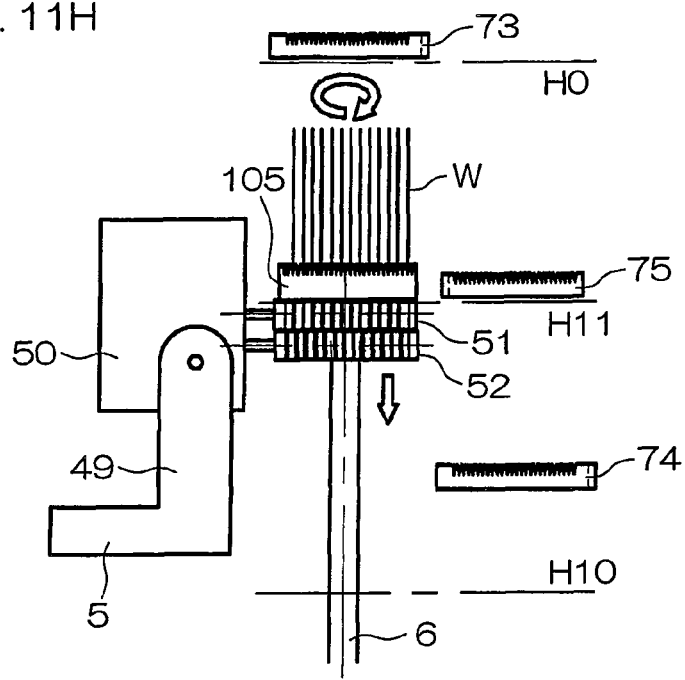
Figure 11:
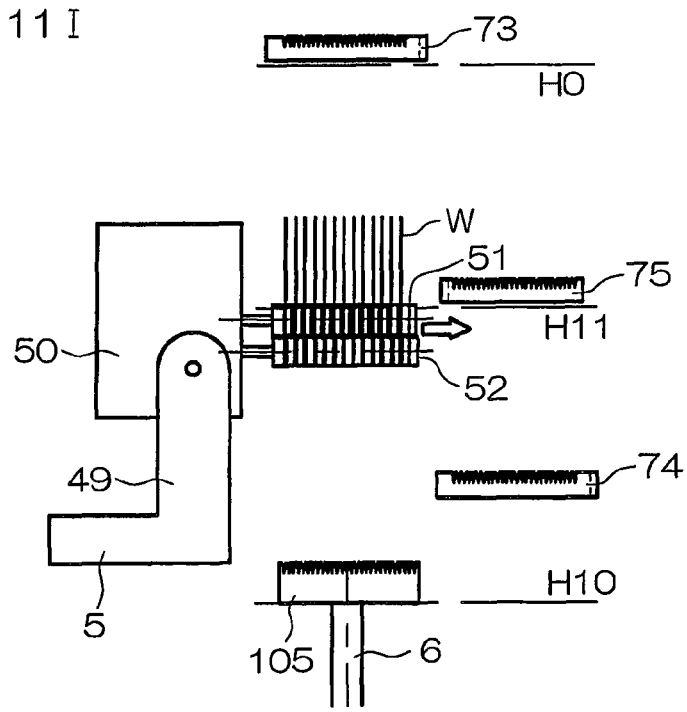

From this state, the posture changing mechanism 5 rotates the rotation block 50 so as to assume a vertical holding posture as shown in FIG. 11H. Thereafter, the pusher 6 rotates the elevation holding portion 105 around the vertical axis line by 180 degrees above the first and second holding mechanisms 51 and 52. As a result, the positions of the substrates W held by the elevation holding portion 105 are matched with the substrate holding position of the second holding mechanism 52.

Thereafter, as shown in FIG. 11I, the pusher 6 lowers the elevation holding portion 105 to the origin height H10. During this process, the substrates W held by the elevation holding portion 105 are delivered to the second holding mechanism 52 in a batch manner. After the substrates W are delivered to the second holding mechanism 52, the first holding mechanism 51 is moved toward the front-end side along the axial direction, is then brought into a state that enables contact with the surface of the substrate W, and is prepared to hold the substrates W horizontally.

Figure 11J:
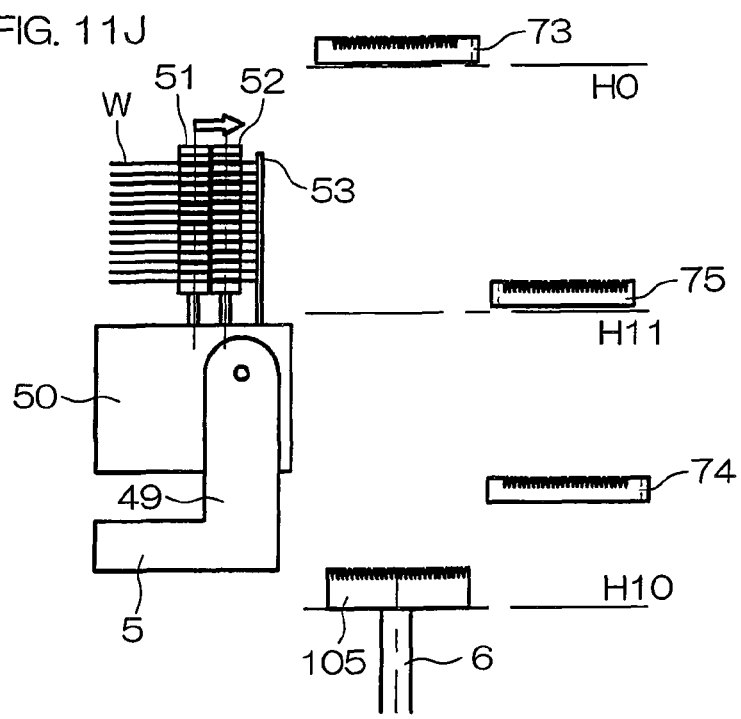

Thereafter, as shown in FIG. 11J, the rotation block 50 of the posture changing mechanism 5 is rotated and brought into a horizontal holding posture. As a result, the substrates W reach a state of being held by the first holding mechanism 51 in a horizontal posture. Furthermore, the substrate regulating mechanism 53 is moved to a regulating position to regulate the substrates W. In this state, the second holding mechanism 52 is retreated to the retreat position (position shown by the phantom line in FIG. 3A). If there are substrates W following the second holding mechanism 52 at this time, the movement of such substrates W is regulated by the substrate regulating mechanism 53. Therefore, the substrates W remain held by the first holding mechanism 51.

Thereafter, as shown in FIG. 11K, the substrates W held by the first holding mechanism 51 are carried out in a batch manner by the batch hand 40 of the carry-in-and-out mechanism 4, and are contained in a FOUP F held by the FOUP holding portion 1. This FOUP F differs from the FOUP F that contains a batch of substrates W serving as the first half.

As described above, according to this embodiment, processed substrates W are conveyed from the substrate delivery position P to the substrate transfer position S by use of the expelling chuck 73 that moves laterally along the first traversing path 101, whereas unprocessed substrates W are conveyed from the substrate transfer position S to the substrate delivery position P by use of the carry-in chuck 74 that moves laterally along the second traversing path 102 located below the first traversing path 101. Accordingly, substrate conveyance between the substrate transfer position S and the substrate delivery position P can be performed by two systems, and hence the main transfer mechanism 3 can expel the processed substrates W even while the unprocessed substrates W are being carried into the substrate delivery position P. Therefore, the substrate processing speed can be improved. Additionally, since the first and second traversing paths 101 and 102 lie on each other in the up-down direction, two different conveying paths can be provided while restricting the footprint of the substrate processing apparatus 10.

In order to form the conveying path between the substrate transfer position S and the substrate delivery position P as a two-system conveying path, one possible solution may be to provide a pair of pushers and to laterally move the pair of pushers between the substrate transfer position S and the substrate delivery position P. However, if a structure formed according to this solution is employed, the footprint of the substrate processing apparatus 10 will increase greatly, and, in addition, a great increase in cost will be caused by providing a pair of pushers having an intricate structure.

On the other hand, in the structure according to this embodiment, the first and second traversing paths 101 and 102 are disposed as mentioned above, and hence the footprint can be restricted. In addition, what is required of the expelling chuck 73 and the carry-in chuck 74 is to move laterally. Therefore, the structure required to drive these components is not so complicated, and, accordingly, an increase in cost is small. Therefore, it is possible to secure two different conveying paths with a low-cost structure and to improve the substrate processing speed.

Additionally, in this embodiment, the intermediary chuck 75 that moves upwardly and downwardly is disposed in the substrate delivery position P, and a so-called buffer position is secured thereby. This structure makes it possible to prevent stagnation in substrate conveyance and to contribute to an improvement in the substrate processing speed. Still additionally, the intermediary chuck 75 is merely required to move upwardly and downwardly as a necessary function, and is not required to move laterally. Therefore, the structure of the driving mechanism is not complex. Therefore, it is possible to secure a buffer position with a low-cost structure and to improve the substrate processing speed.

Figure 12:
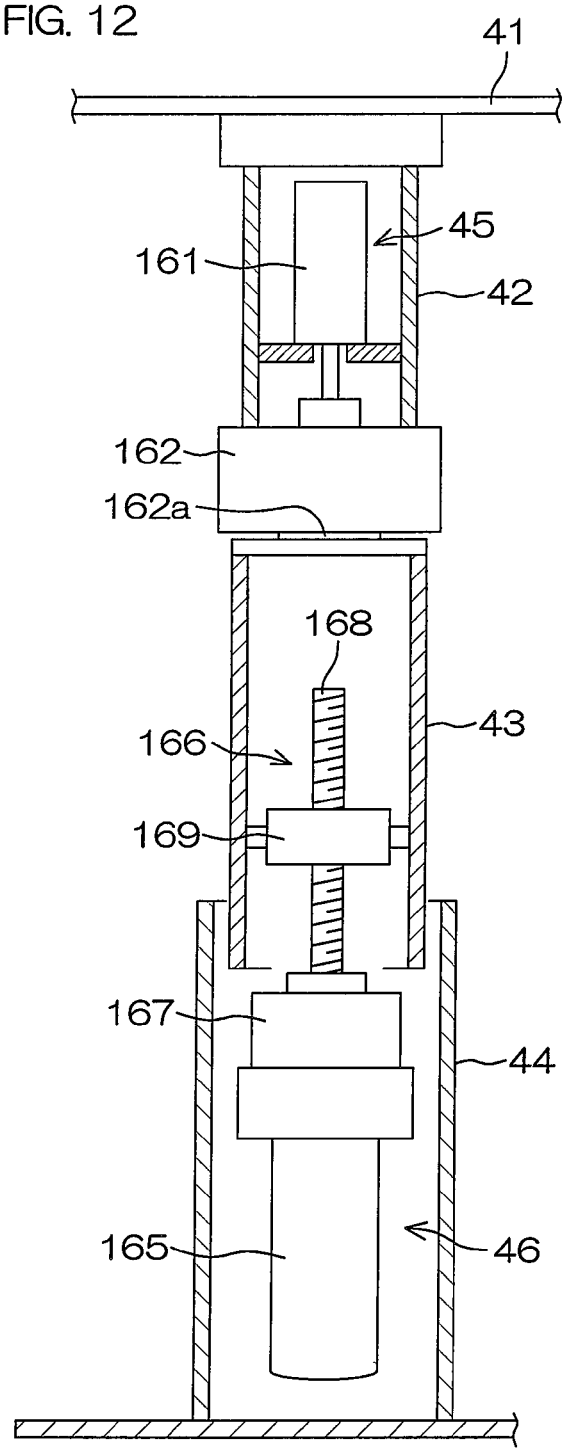
FIG. 12 is a sectional view for explaining a structure relative to the rotation and the up-and-down movement of a carry-in-and-out mechanism.

FIG. 12 is a sectional view for explaining a structure relative to the rotation and the up-and-down movement of the carry-in-and-out mechanism 4. The holding base 41 is fixed to the upper end of the rotation block 42. The rotation block 42 is attached to the elevation block 43 so that the rotation block 42 can rotate around the vertical axis line. The elevation block 43 is attached to the base portion 44 so that the elevation block 43 can move upwardly and downwardly in the Z direction. The rotation mechanism 45 is built into the rotation block 42. The base portion 44 is provided with the elevation mechanism 46.

The rotation block 42 is formed in a cylindrical shape. The rotation mechanism 45 includes a motor 161 fixed inside the rotation block 42 and a gear head 162 to which a driving force of the motor 161 is input. The gear head 162 is connected to the lower end of the rotation block 42. An output shaft 162*a* of the gear head 162 is connected to the upper end of the elevation block 43.

According to this structure, when the motor 161 is driven, its driving force is transmitted to the elevation block 43 through the gear head 162. The elevation block 43 is connected to the base portion 44 in a non-rotational state. Therefore, the gear head 162 and the rotation block 42 connected to this head are rotated around the vertical axis line by a reaction force transmitted from the elevation block 43.

The elevation mechanism 46 includes a motor 165 and a ball screw mechanism 166. The motor 165 is housed in the base portion 44, and is fixed to the base portion 44. A driving force of the motor 165 is transmitted to a screw shaft 168 of the ball screw mechanism 166 through a gear head 167. The screw shaft 168 is disposed along the vertical direction. A ball nut 169 is screwed to the screw shaft 168. The ball nut 169 is connected to the elevation block 43. The up-and-down movement of the elevation block 43 in the Z direction is guided by a linear guide (not shown).

According to this structure, the ball nut 169 can be moved upwardly and downwardly by driving the motor 165, and, in accordance with this movement, the elevation block 43 and the rotation block 42 held by this block can be moved upwardly and downwardly. The holding base 41 supported by the rotation block 42 can be moved upwardly and downwardly in this way, and hence the one-by-one hand 39 and the batch hand 40 supported by the holding base 41 can be moved upwardly and downwardly.

Figure 13B:
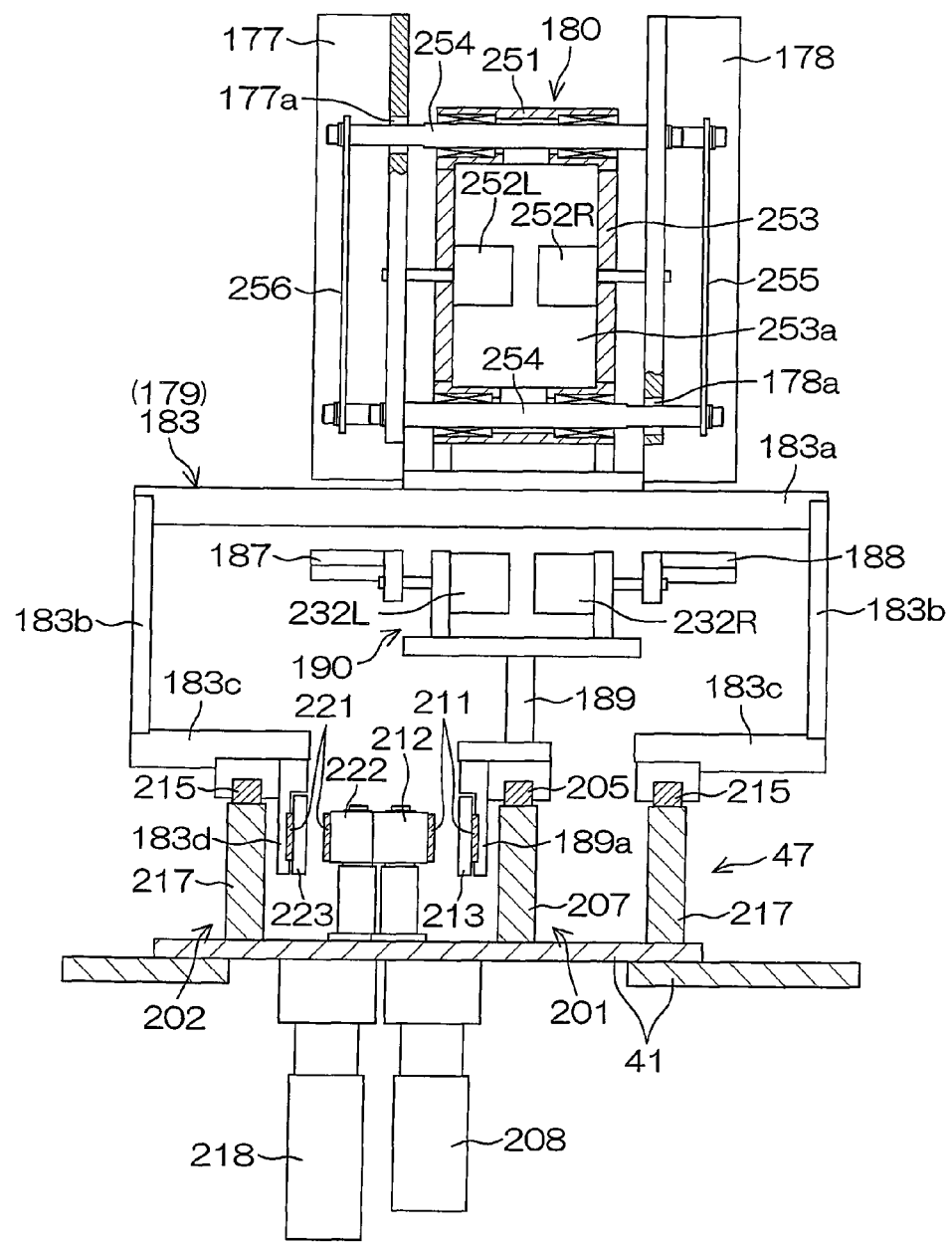
FIG. 13B is a rear view seen from the direction of arrow A4 of FIG. 13A.

FIG. 13A is a side view for explaining the structure of the one-by-one hand 39, the structure of the batch hand 40, and the structure of the advance-retreat driving mechanism 47 that advances and retreats these hands. FIG. 13B is a rear view seen from the direction of arrow A4 of FIG. 13A. The batch hand 40 includes a hand element group 175. The hand element group 175 is formed of a plurality of hand elements 176 piled in the Z direction. Each hand element 176 extends in the horizontal direction, and faces to another one of the hand elements 176 in another horizontal direction perpendicular to the extending direction of the hand element 176. The pair of hand elements 176 facing each other in the horizontal direction can support a single substrate W from below in a horizontal posture. The array pitch of the hand elements 176 in the Z direction is equal to the array pitch of the substrate housing positions in the FOUP F.

A left hand element 176 is supported in a cantilever manner by a left support block 177 (not shown in FIG. 13A). A right hand element 176 is supported in a cantilever manner by a right support block 178. The left support block 177 supports one side of the pair of hand elements 176 facing each other in the horizontal direction in a state of being piled in the Z direction. The right support block 178 supports the other side of the pair of hand elements in a state of being piled in the Z direction. These right and left support blocks 177 and 178 are connected to a hand opening-closing mechanism 180. The hand opening-closing mechanism 180 is further connected to the holding base 41 through an advancing-retreating bracket 179.

The one-by-one hand 39 is disposed below the batch hand 40. More accurately, when both the batch hand 40 and the one-by-one hand 39 are in the retreat position, these hands are disposed in a state of lying on each other in the Z direction.

The one-by-one hand 39 has a pair of hand elements 186 that are same as the hand elements 176 of the batch hand 40. In other words, the pair of hand elements 186 extend in the horizontal direction, and face each other in another horizontal direction perpendicular to the extending direction of the hand elements 186. The pair of hand elements 186 can support a single substrate W from below in a horizontal posture. One of the pair of hand elements 186 is supported in a cantilever manner by a left hand supporting member 187, whereas the other hand element 186 is supported in a cantilever manner by a right hand supporting member 188. These right and left hand supporting members 187 and 188 are connected to a hand opening-closing mechanism 190. The hand opening-closing mechanism 190 is connected to the holding base 41 through an advancing-retreating bracket 189.

The advancing-retreating bracket 179 for the batch hand 40 includes a supporting portion 182 that supports the hand opening-closing mechanism 180 and a connection portion 183 that has its top surface to which the supporting portion 182 is fixed and that has substantially the shape of the letter C directed laterally when viewed back. The connection portion 183 is formed so as to contain the hand opening-closing mechanism 190 when the one-by-one hand 39 is in the retreat position, and is formed so as to avoid interference with the one-by-one hand 39, etc., when the one-by-one hand 39 or the batch hand 40 proceeds and recedes. In more detail, the connection portion 183 includes a top part 183*a* to which the supporting portion 182 is fixed, a pair of side parts 183*b* that are disposed beside the one-by-one hand 39 and that hang down from both side edges of the top surface part 183a, and a pair of bottom parts 183c that project in a mutually-approaching direction from the lower edges of the pair of side parts 183b. A movement space in which the advancing-retreating bracket 189 for the one-by-one hand 39 moves is secured between the pair of bottom parts 183c.

Figure 14:
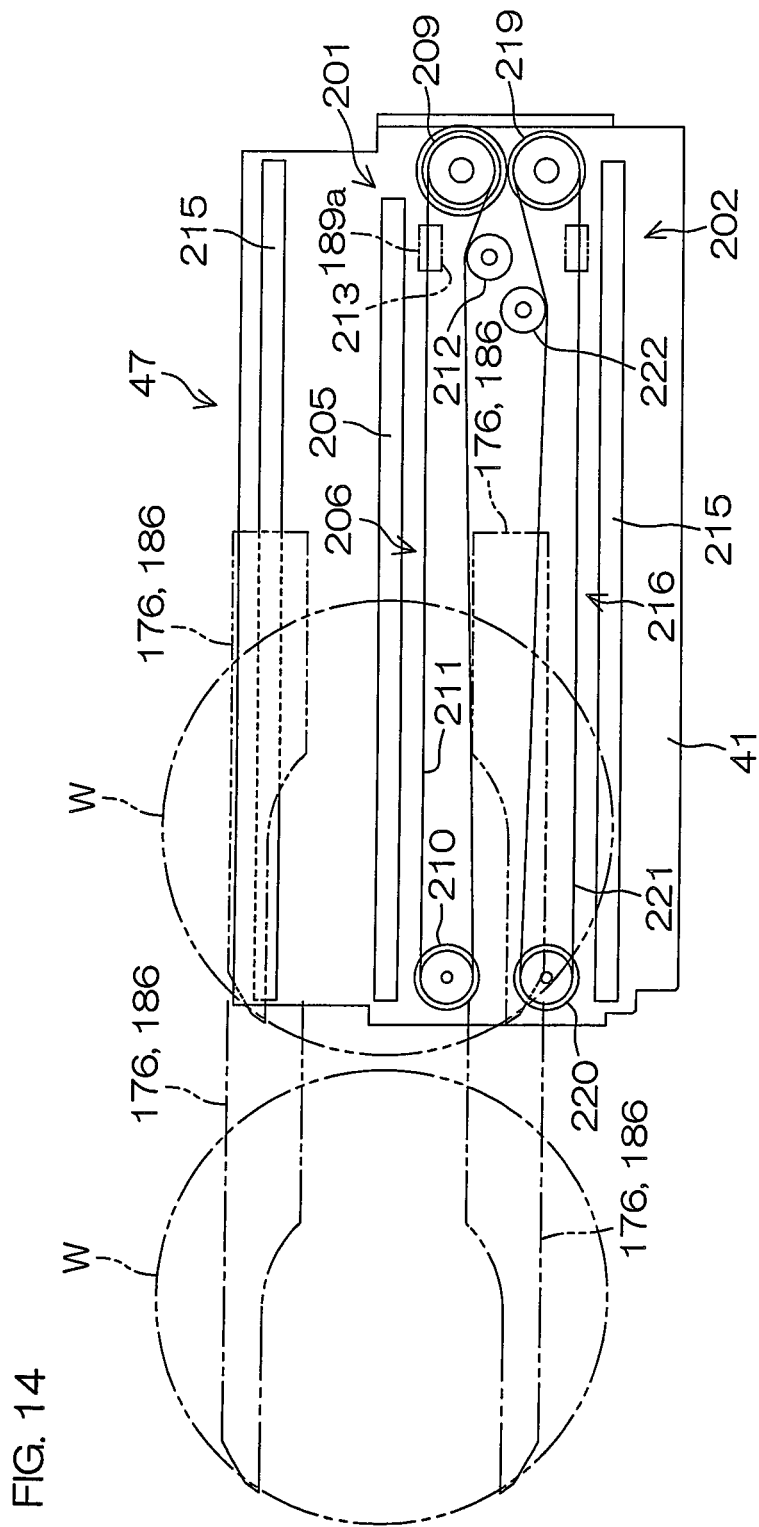
FIG. 14 is a schematic plan view for explaining the structure of a one-by-one-hand advancing-retreating mechanism and the structure of a batch-hand advancing-retreating mechanism.

FIG. 14 is a schematic plan view for explaining the structure of the advance-retreat driving mechanism 47. A description will be hereinafter given with reference to not only FIG. 14 but also FIGS. 13A and 13B.

The advance-retreat driving mechanism 47 includes a one-by-one-hand advancing-retreating mechanism 201 that advances and retreats the one-by-one hand 39 and a batch-hand advancing-retreating mechanism 202 that advances and retreats the batch hand 40.

The one-by-one-hand advancing-retreating mechanism 201 includes a linear guide 205 and a belt driving mechanism 206. The linear guide 205 is disposed to extend in parallel with the extending direction of the hand element 186, and is fixed to the upper end surface of a plate-like supporting member 207 erected on the inner bottom surface of the holding base 41. The belt driving mechanism 206 includes a motor 208, a driving pulley 209, a driven pulley 210, a belt 211, and an idle pulley 212. The motor 208 is fixed to the lower surface side of the holding base 41. The driving pulley 209 is disposed on the upper surface of the bottom wall of the holding base 41, and can receive a driving force from the motor 208. The driven pulley 210 is disposed to face the driving pulley 209 in a direction parallel to the linear guide 205. The belt 211 is wound and laid between the driving pulley 209 and the driven pulley 210. The idle pulley 212 is in contact with the belt 211 from the outer-peripheral side so as to apply a tensile force to the belt 211. The advancing-retreating bracket 189 for the one-by-one hand 39 is connected to the linear guide 205, and can be rectilinearly moved by being guided by the linear guide 205. A belt fixing portion 189a is disposed at the lower end of the advancing-retreating bracket 189. The belt fixing portion 189a clamps the belt 211 in cooperation with a belt presser 213.

When the motor 208 is driven, the driving pulley 209 rotates, and, in accordance with this rotation, the belt 211 moves in a circle. As a result, a driving force is given to the advancing-retreating bracket 189, and, accordingly, the advancing-retreating bracket 189 is rectilinearly moved while being guided by the linear guide 205. Therefore, the one-by-one hand 39 supported by the advancing-retreating bracket 189 through the hand opening-closing mechanism 190 can be advanced and retreated.

The batch-hand advancing-retreating mechanism 202 includes a pair of right and left linear guides 215 and a belt driving mechanism 216. The pair of linear guides 205 are parallel with each other, and extend in parallel with the extending direction of the hand element 176. The pair of linear guides 205 are respectively fixed to the upper end surfaces of the pair of supporting members 217 each of which is shaped like a plate and each of which is erected on the inner bottom surface of the holding base 41. The belt driving mechanism 216 includes a motor 218, a driving pulley 219, a driven pulley 220, a belt 221, and an idle pulley 222. The motor 218 is fixed to the lower surface of the holding base 41. The driving pulley 219 is disposed on the upper surface of the bottom wall of the holding base 41, and can receive a driving force from the motor 218. The driven pulley 220 is disposed to face the driving pulley 219 in a direction parallel to the linear guide 215. The belt 221 is wound and laid between the driving pulley 219 and the driven pulley 220. The idle pulley 222 is in contact with the belt 221 from the outer-peripheral side so as to apply a tensile force to the belt 221. The advancing-retreating bracket 179 for the batch hand 40 has the connection portion 183 whose bottom parts 183c serving as a pair are connected to the pair of linear guides 215, respectively, and this bracket 179 can be rectilinearly moved by being guided by the linear guide 215. A belt fixing portion 183d hangs down from the inner edge of one of the bottom parts 183c of the connection portion 183. The belt fixing portion 183d clamps the belt 221 in cooperation with a belt presser 223.

When the motor 218 is driven, the driving pulley 219 rotates, and, in accordance with this rotation, the belt 221 moves in a circle. As a result, a driving force is given to the advancing-retreating bracket 179, and, accordingly, the advancing-retreating bracket 179 is rectilinearly moved while being guided by the linear guide 215. Therefore, the batch hand 40 supported by the advancing-retreating bracket 179 through the hand opening-closing mechanism 180 can be advanced and retreated.

The linear guides 205 and 215 are fixed onto the holding base 41 in parallel with each other, and, accordingly, the one-by-one hand 39 and the batch hand 40 proceed and recede in a direction parallel to each other. In this embodiment, the paths along which the one-by-one hand 39 and the batch hand 40 proceed and recede lie on each other in the up-down direction, and, in their retreat positions, the one-by-one hand 39 and the batch hand 40 have a positional relationship established by lying on each other up and down. In more detail, the path along which the one-by-one hand 39 proceeds and recedes is located below the proceeding-receding path of the batch hand 40, and, when both hands 39 and 40 are in the retreat position, the one-by-one hand 39 is located just under the batch hand 40. Therefore, the rotating radius of the carry-in-and-out mechanism 4 can be reduced by controlling the hands 39 and 40 so that the hands 39 and 40 occupy the retreat position when the holding base 41 is rotated. Therefore, the installation space of the carry-in-and-out mechanism 4 can be reduced, and, in accordance with this, the footprint of the substrate processing apparatus 10 can be restricted.

Figure 15:
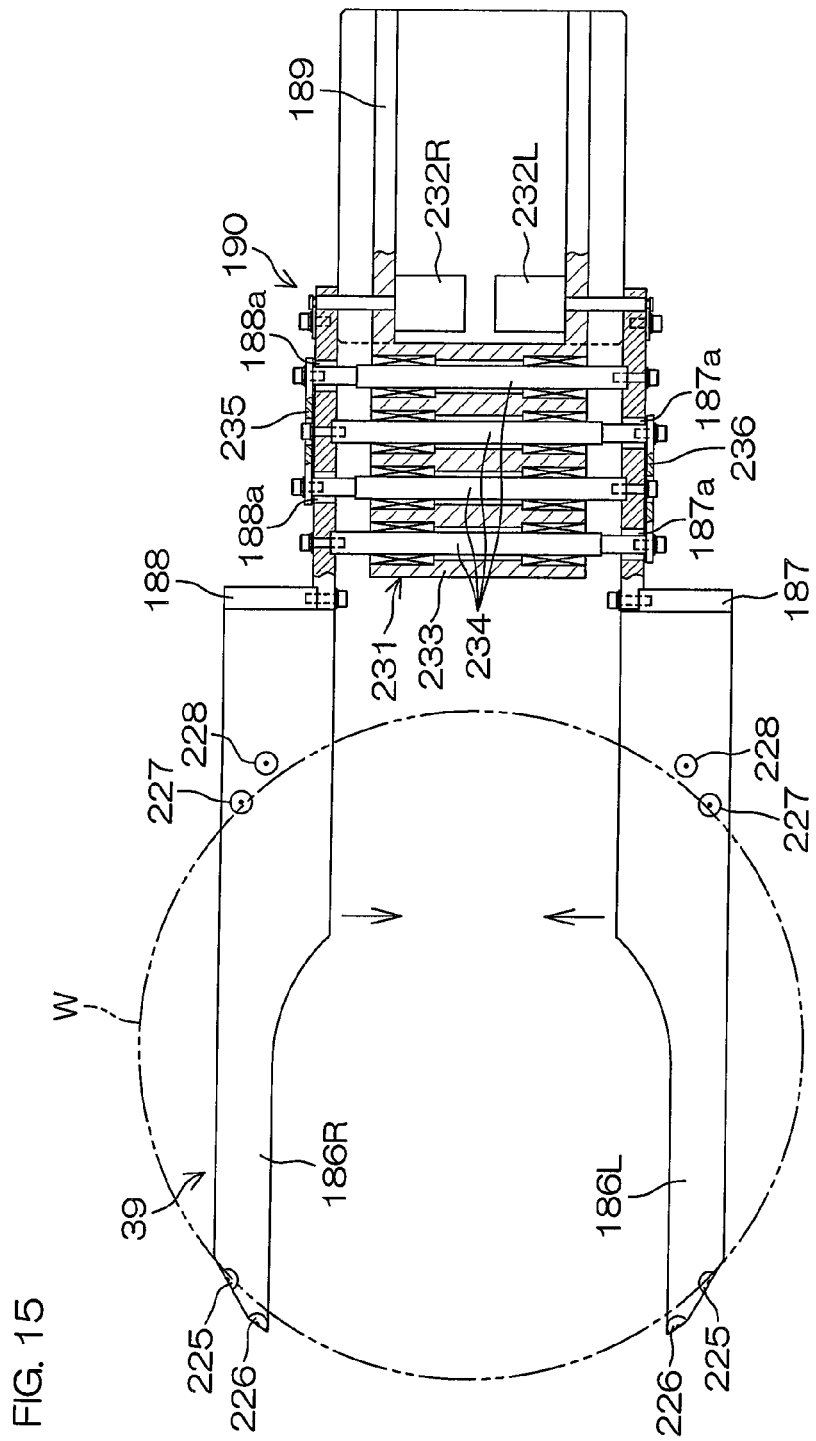
FIG. 15 is a sectional view for explaining the structure of the one-by-one hand and the structure of a hand opening-closing mechanism.

FIG. 15 is a sectional view for explaining the structure of the one-by-one hand 39 and the structure of the hand opening-closing mechanism 190. A description will be hereinafter given with reference to not only FIG. 15 but also FIGS. 13A and 13B.

The pair of hand elements 186 disposed to face each other in the horizontal direction will be distinguished from each other and be referred to as the "left hand element 186L" and the "right hand element 186R." The left hand element 186L is supported in a cantilever manner by the left hand supporting member 187, whereas the right hand element 186R is supported in a cantilever manner by the right hand supporting member 188.

Each of the forward edges of the left and right hand elements 186L and 186R has the shape of an oblique side (accurately, a bent oblique side that is bent at a halfway point) retreating toward the basal-end side correspondingly to the progress toward the outside. An inner substrate guide 225 serving as a first substrate supporting portion and an outer substrate guide 226 serving as a second substrate supporting portion are disposed at this forward edge. The inner substrate guide 225 has a shorter distance from the center of a substrate W being held by the one-by-one hand 39 than the outer substrate guide 226. In other words, with respect to the center of the substrate W, the inner substrate guide 225 is located relatively inside, whereas the outer substrate guide 226 is located relatively outside.

An inner substrate guide 227 and an outer substrate guide 228 serving as a first substrate supporting portion and a second substrate supporting portion are disposed on the upper surfaces of the basal ends of the hand elements 186L and 186R, respectively. With respect to the center of the substrate W, the inner substrate guide 227 is located relatively inside, whereas the outer substrate guide 228 is located relatively outside.

Figure 16:
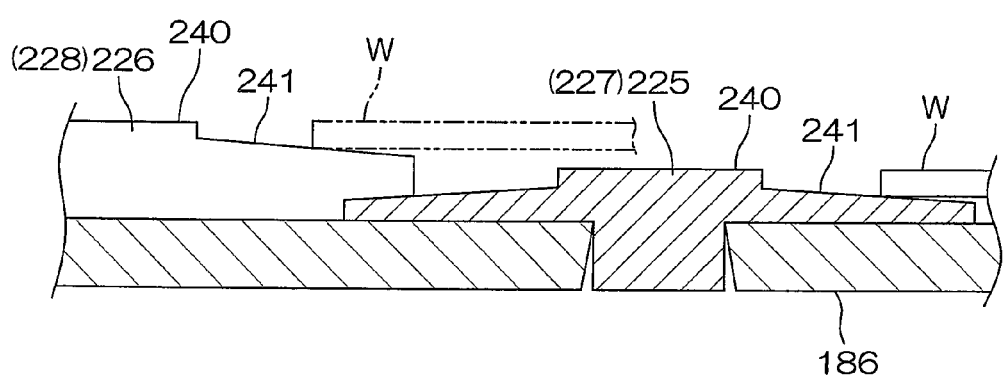
FIG. 16 is a partially enlarged cross-sectional view for explaining the structure of a substrate guide mounted on the hand.

Each of the substrate guides 225 to 228 is formed in a circular shape (however, the substrate guides 225 and 226 on the front-end side are each formed in a semicircular shape) when viewed planarly, and, as shown in FIG. 16, a cylindrical projecting portion 240 is formed at the center. The periphery of the projecting portion has the shape of a conical-surface-like oblique surface 241 that becomes lower correspondingly to the progress toward the outside. The peripheral edge of the substrate W comes into point contact with this oblique surface 241. The horizontal movement of the substrate W is regulated by the circumferential surface of the projecting portion 240.

The outer substrate guides 226 and 228 are formed to be generally higher than the inner substrate guides 225 and 227. In other words, the substrate holding height by the outer substrate guides 226 and 228 is greater than the substrate holding height by the inner substrate guides 225 and 227. More specifically, when a substrate W is held by the outer substrate guides 226 and 228, the height of the lower surface of the substrate W becomes greater than the height of the projecting portion 240 of the inner substrate guides 225 and 227. Therefore, the substrate W does not come into contact with the inner substrate guides 225 and 227.

With respect to the mutually-facing direction of the left and right hand elements 176L and 176R (i.e., opened-closed direction of the hand elements), the inner substrate guides 225 and 227 are located outside the outer substrate guides 226 and 228. Therefore, in an open state (state shown in FIG. 15) in which the interval between the left and right hand elements 186L and 186R is made relatively wide, the substrate W is held by the inner substrate guides 225 and 227, and the outer substrate guides 226 and 228 are located outside the outer peripheral edge of the substrate W, and hence do not come into contact with the substrate W. On the other hand, in a closed state in which the interval between the left and right hand elements 186L and 186R is made relatively narrow, the substrate W is held by the outer substrate guides 226 and 228, and the inner substrate guides 225 and 227 are located below the lower surface of the substrate W, and do not come into contact with the substrate W. Therefore, either the inner substrate guides 225 and 227 or the outer substrate guides 226 and 228 can be selected to hold the substrate W by opening and closing the left and right hand elements 186L and 186R.

In this embodiment, the operation of the hand opening-closing mechanism 190 is controlled so that, when unprocessed substrates W are conveyed, the one-by-one hand 39 is brought into a closed state, and the substrates W are supported by the outer substrate guides 226 and 228 and so that, when processed substrates W are conveyed, the one-by-one hand 39 is brought into an open state, and the substrates W are supported by the inner substrate guides 225 and 227. Of course, the correspondence relationship between unprocessed and processed substrates W and the open and closed states of the one-by-one hand 39 may be reversed so that the unprocessed substrates W are supported by the inner substrate guides 225 and 227 and so that the processed substrates W are held by the outer substrate guides 226 and 228.

The hand opening-closing mechanism 190 includes an opening-and-closing guide portion 231, a left cylinder 232L, and a right cylinder 232R. The opening-and-closing guide portion 231 includes a guide base 233 and four guide shafts 234 inserted in the guide base 233. The four guide shafts 234 are inserted in the guide base 233 along the horizontal direction parallel to the opened-closed direction of the hand element 186. These guide shafts 234 are arranged along the advance-retreat direction of the one-by-one hand 39. Each of alternate two guide shafts 234 of the four guide shafts 234 has its end connected to an arm that projects behind the left hand supporting member 187, and has the other end inserted in a through-hole 188a formed in an arm that projects behind the right hand supporting member 188. These ends passing through the through-holes 188a, respectively, are connected to each other with a connection plate 235. Each of the remaining two guide shafts 234 has its end connected to the right hand supporting member 188, and has the other end inserted in a through-hole 187a formed in the left hand supporting member 187. These ends passing through the through-holes 187a, respectively, are connected to each other with a connection plate 236.

The left and right cylinders 232L and 232R are held by the advancing-retreating bracket 189 holding the guide base 233. The operating rods of the cylinders 232L and 232R are connected to arms that project behind the left and right hand supporting members 187 and 188, respectively.

According to this structure, the hand supporting members 187 and 188 proceed to or recede from each other while being guided by the opening-and-closing guide portion 231 by driving the cylinders 232L and 232R. Accordingly, the one-by-one hand 39 can be brought into a closed state by narrowing the interval between the left and right hand elements 186L and 186R, and can be brought into an open state by widening the interval therebetween.

Figure 17:
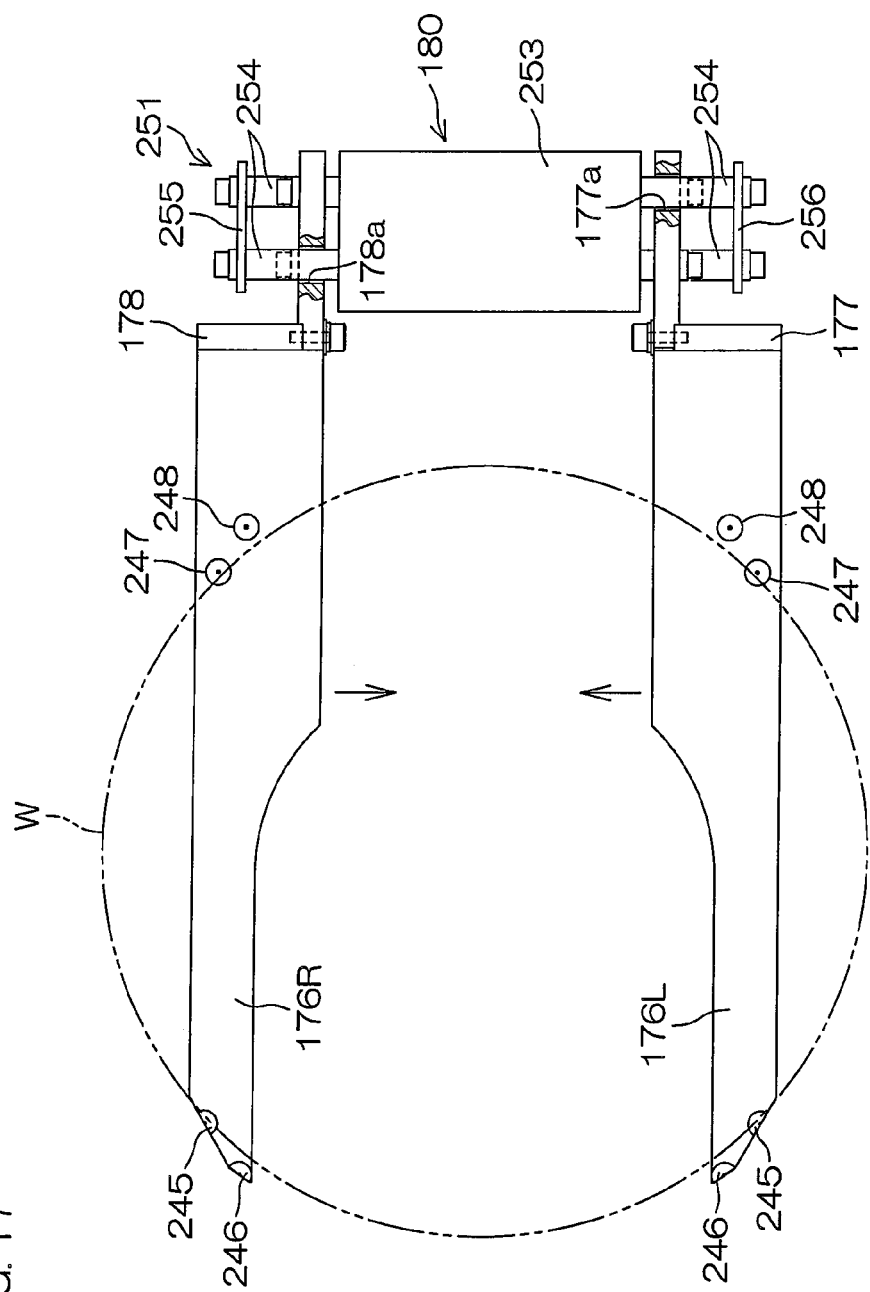
FIG. 17 is a plan view for explaining the structure of the batch hand and the structure of a hand opening-closing mechanism.

FIG. 17 is a plan view for explaining the structure of the batch hand 40, etc. A description will be hereinafter given with reference to not only FIG. 17 but also FIGS. 13A and 13B.

The hand element group 175 of the batch hand 40 has the hand elements 176 disposed so as to serve as pairs and to face each other in the horizontal direction. The pair of hand elements 176 disposed to face each other in the horizontal direction will be distinguished from each other and be referred to as the "left hand element 176L" and the "right hand element 176R." The left hand element 176L is supported in a cantilever manner by the left support block 177, whereas the right hand element 176R is supported in a cantilever manner by the right support block 178.

Each of the forward edges of the left and right hand elements 176L and 176R has the shape of an oblique side (accurately, a bent oblique side that is bent at a halfway point) retreating toward the basal-end side correspondingly to the progress toward the outside. An inner substrate guide 245 and an outer substrate guide 246 are disposed at this forward edge. The inner substrate guide 245 has a shorter distance from the center of a substrate W being held by the hand elements 176L and 176R than the outer substrate guide 246. In other words, with respect to the center of the substrate W, the inner substrate guide 245 is located relatively inside, whereas the outer substrate guide 246 is located relatively outside. An inner substrate guide 247 and an outer substrate guide 248 are disposed on the upper surfaces of the basal ends of the hand elements 176L and 176R, respectively. With respect to the center of the substrate W, the inner substrate guide 247 is located relatively inside, whereas the outer substrate guide 248 is located relatively outside.

The substrate guides 245 to 248 are the same in structure as the above-mentioned substrate guides 225 to 228 disposed on the one-by-one hand 39. In detail, each of the substrate guides 245 to 248 is formed in a circular shape (however, the substrate guides 245 and 246 on the front-end side are each formed in a semicircular shape) when viewed planarly, and a cylindrical projecting portion is formed at the center. The periphery of the projecting portion has the shape of a conical-surface-like oblique surface that becomes lower correspondingly to the progress toward the outside. The peripheral edge of the substrate W comes into point contact with this oblique surface. The horizontal movement of the substrate W is regulated by the circumferential surface of the projecting portion.

The outer substrate guides 246 and 248 are formed to be generally higher than the inner substrate guides 245 and 247. In other words, the substrate holding height by the outer substrate guides 246 and 248 is greater than the substrate holding height by the inner substrate guides 245 and 247. More specifically, when a substrate W is held by the outer substrate guides 246 and 248, the height of the lower surface of the substrate W becomes greater than the height of the projecting portion of the inner substrate guides 245 and 247. Therefore, the substrate W does not come into contact with the inner substrate guides 245 and 247.

With respect to the mutually-facing direction of the left and right hand elements 176L and 176R (i.e., opened-closed direction of the hand elements), the inner substrate guides 245 and 247 are located outside the outer substrate guides 246 and 248. Therefore, in an open state in which the interval between the left and right hand elements 176L and 176R is made relatively wide, the substrate W is held by the inner substrate guides 245 and 247, and the outer substrate guides 246 and 248 are located outside the outer peripheral edge of the substrate W, and hence do not come into contact with the substrate W. On the other hand, in a closed state in which the interval between the left and right hand elements 176L and 176R is made relatively narrow, the substrate W is held by the outer substrate guides 246 and 248, and the inner substrate guides 245 and 247 are located below the lower surface of the substrate W, and do not come into contact with the substrate W. Therefore, either the inner substrate guides 245 and 247 or the outer substrate guides 246 and 248 can be selected to hold the substrate W by opening and closing the left and right hand elements 176L and 176R.

In this embodiment, the operation of the hand opening-closing mechanism 180 is controlled so that, when unprocessed substrates W are conveyed, the batch hand 40 is brought into a closed state, and the substrates W are supported by the outer substrate guides 246 and 248 and so that, when processed substrates W are conveyed, the batch hand 40 is brought into an open state, and the substrates W are supported by the inner substrate guides 245 and 247. Of course, the correspondence relationship between unprocessed and processed substrates W and the open and closed states of the batch hand 40 may be reversed so that the unprocessed substrates W are supported by the inner substrate guides 245 and 247 and so that the processed substrates W are held by the outer substrate guides 246 and 248.

The hand opening-closing mechanism 180 includes an opening-and-closing guide portion 251, a left cylinder 252L, and a right cylinder 252R. The opening-and-closing guide portion 251 includes a guide base 253 and four guide shafts 254 inserted in this guide base 253. The guide base 253 is formed in the shape of a rectangular parallelepiped that is long in the up-down direction. The four guide shafts 254 are inserted in the guide base 253 along the horizontal direction parallel to the opened-closed direction of the hand elements 176L and 176R. These guide shafts 254 are disposed at positions corresponding to four vertexes of a rectangle, respectively, when viewed sidewardly (see FIG. 13A). Each of two guide shafts 254 disposed at diagonal positions of the rectangle has its end connected to a rear projection of the left support block 177, and has the other end inserted in a through-hole 178a formed in a rear projection of the right support block 178. The ends passing through the through-holes 178a, respectively, are connected to each other with a connection plate 255. Each of the remaining two guide shafts 254 disposed at the other diagonal positions of the rectangle has its end connected to the rear projection of the right support block 178, and has the other end inserted in a through-hole 177a formed in the rear projection of the left support block 177. The ends passing through the through-holes 177a, respectively, are connected to each other with a connection plate 256.

The guide base 253 has a rectangular opening 253a formed at the middle when viewed backwardly. The left and right cylinders 252L and 252R are fixed to both side surfaces of the opening 253a, respectively. The operating rods of these cylinders 252L and 252R are connected to the left and right support blocks 177 and 178, respectively.

According to this structure, the cylinders 252L and 252R are driven, and, as a result, the support blocks 177 and 178 proceed to or recede from each other while being guided by the opening-and-closing guide portion 251. Therefore, the batch hand 40 can be brought into an open state by widening the interval between the left and right hand elements 176L and 176R, whereas the batch hand 40 can be brought into a closed state by narrowing the interval between the left and right hand elements 176L and 176R.

Next, operation examples of the carry-in-and-out mechanism 4 will be described. The operation of the carry-in-and-out mechanism 4 is achieved by allowing the controller 9 to control the elements of the carry-in-and-out mechanism 4, especially, control the rotation mechanism 45, the elevation mechanism 46, the one-by-one-hand advancing-retreating mechanism 201, and the batch-hand advancing-retreating mechanism 202.

A first operation example (batch conveyance) will be described in which twenty-five unprocessed substrates W are contained in a FOUP F, and are conveyed to the posture changing mechanism 5 in a batch manner.

The carry-in-and-out mechanism 4 rotates the holding base 41 by means of the rotation mechanism 45, and allows the batch hand 40 to face the FOUP F. In this state, the batch-hand advancing-retreating mechanism 202 advances the batch hand 40 toward the FOUP F, and allows the hand elements 176 to enter the space below the substrates W contained in the FOUP F. At this time, the batch hand 40 is in a closed state (i.e., state in which the substrates W are supported by the outer substrate guides 246 and 248). Thereafter, the holding base 41 is raised by a slight distance (which is equal to, for example, the pitch between the substrate holding positions in the FOUP F) by the function of the elevation mechanism 46. Accordingly, the batch hand 40 is raised, and the twenty-five substrates W contained in the FOUP F are scooped out in a batch manner. In this state, the batch-hand advancing-retreating mechanism 202 retreats the batch hand 40. Accordingly, the twenty-five substrates W in the FOUP F are carried out in a batch manner.

Thereafter, the holding base 41 is rotated by the rotation mechanism 45, and the batch hand 40 is allowed to face the posture changing mechanism 5. In this state, the batch-hand advancing-retreating mechanism 202 advances the batch hand 40 toward the posture changing mechanism 5, and allows a plurality of substrates W to enter a plurality of holding grooves of the first holding mechanism 51, respectively. At this time, the pair of first holding mechanisms 51 are controlled to assume a posture in which holding groove groups for unprocessed substrates face each other. Thereafter, the holding base 41 is lowered by a slight distance (which is equal to, for example, the pitch between the holding grooves of the first holding mechanism 51) by the function of the elevation mechanism 46. Accordingly, the batch hand 40 is lowered, and the twenty-five substrates W contained in the FOUP F are delivered from the batch hand 40 to the first holding mechanism 51 in a batch manner. In this state, the batch-hand advancing-retreating mechanism 202 retreats the batch hand 40. Accordingly, the batch conveyance from the FOUP F to the posture changing mechanism 5 is completed.

A second operation example (batch conveyance) will be described in which twenty-five processed substrates W are held by the posture changing mechanism 5, and are conveyed to the FOUP F in a batch manner.

The carry-in-and-out mechanism 4 rotates the holding base 41 by means of the rotation mechanism 45, and allows the batch hand 40 to face the posture changing mechanism 5. In this state, the batch-hand advancing-retreating mechanism 202 advances the batch hand 40 toward the posture changing mechanism 5, and allows the hand elements 176 to enter the space below the substrates W respectively held by the holding grooves of the first holding mechanism 51. At this time, the pair of first holding mechanisms 51 allow holding groove groups used for unprocessed substrates to face each other. Furthermore, the batch hand 40 is in an open state (i.e., state in which the substrates W are supported by the inner substrate guides 245 and 247). Thereafter, the holding base 41 is raised by a slight distance (which is equal to, for example, the pitch between the holding grooves of the first holding mechanism 51) by the function of the elevation mechanism 46. Accordingly, the batch hand 40 is raised, and the twenty-five substrates W held by the first holding mechanism 51 are scooped out in a batch manner. In this state, the batch-hand advancing-retreating mechanism 202 retreats the batch hand 40. Accordingly, the twenty-five substrates W are carried out from the first holding mechanism 51 in a batch manner.

Thereafter, the holding base 41 is rotated by the rotation mechanism 45, and the batch hand 40 is allowed to face the FOUP F. In this state, the batch-hand advancing-retreating mechanism 202 advances the batch hand 40 toward the FOUP F, and allows a plurality of substrates W to enter a place slightly above the substrate holding height in the FOUP F. Thereafter, the holding base 41 is lowered by a slight distance (which is equal to, for example, the pitch between the substrate holding positions in the FOUP F) by the function of the elevation mechanism 46. Accordingly, the batch hand 40 is lowered, and the twenty-five substrates W are delivered from the batch hand 40 to substrate-holding shelves provided in the FOUP F in a batch manner. In this state, the batch-hand advancing-retreating mechanism 202 retreats the batch hand 40. Accordingly, the batch conveyance from the posture changing mechanism 5 to the FOUP F is completed.

A third operation example (one-by-one conveyance) will be described in which unprocessed substrates W contained in a FOUP F are conveyed to the posture changing mechanism 5 one by one.

The carry-in-and-out mechanism 4 rotates the holding base 41 by means of the rotation mechanism 45, and allows the one-by-one hand 39 to face the FOUP F. Furthermore, the holding base 41 is raised or lowered by the function of the elevation mechanism 46, and, accordingly, the height of the one-by-one hand 39 is controlled so as to be a height below a position in which a substrate W to be conveyed is housed in the FOUP F. The height is below the housed position of the substrate W by a slight distance (i.e., distance shorter than the interval between the substrate housing positions in the FOUP F). In this state, the one-by-one-hand advancing-retreating mechanism 201 advances the one-by-one hand 39 toward the FOUP F, and allows the one-by-one hand 39 to enter the space below the to-be-conveyed substrate W. At this time, the one-by-one hand 39 is in a closed state (i.e., state in which the substrate W is supported by the outer substrate guides 226 and 228). Thereafter, the holding base 41 is raised by a slight distance (which is equal to, for example, the pitch between the substrate holding positions in the FOUP F) by the function of the elevation mechanism 46. Accordingly, the one-by-one hand 39 is raised, and the single substrate W in the FOUP F is scooped out. In this state, the one-by-one-hand advancing-retreating mechanism 201 retreats the one-by-one hand 39. Accordingly, the single substrate W in the FOUP F is carried out.

Thereafter, the holding base 41 is rotated by the rotation mechanism 45, and the one-by-one hand 39 is allowed to face the posture changing mechanism 5. Furthermore, if necessary, the holding base 41 is raised or lowered by the function of the elevation mechanism 46, and, as a result, the height of the one-by-one hand 39 is changed. Therefore, the substrate W held by the one-by-one hand 39 can be delivered to a holding groove, which has an arbitrary height, of the first holding mechanism 51.

Thereafter, the one-by-one-hand advancing-retreating mechanism 201 advances the one-by-one hand 39 toward the posture changing mechanism 5, and allows the single substrate W to enter any one (which is a holding groove corresponding to the height of the one-by-one hand 39) of the plurality of holding grooves of the first holding mechanism 51. At this time, the pair of first holding mechanisms 51 are controlled to assume a posture in which holding groove groups for unprocessed substrates face each other.

Thereafter, the holding base 41 is lowered by as light distance (which is equal to, for example, the pitch between the holding grooves of the first holding mechanism 51) by the function of the elevation mechanism 46. Accordingly, the one-by-one hand 39 is lowered, and the single substrate W is delivered from the one-by-one hand 39 to the first holding mechanism 51. In this state, the one-by-one-hand advancing-retreating mechanism 201 retreats the one-by-one hand 39. Accordingly, the one-by-one conveyance from the FOUP F to the posture changing mechanism 5 is completed.

A plurality of substrates W can be conveyed from the FOUP F to the posture changing mechanism 5 by repeatedly performing this one-by-one conveyance. At this time, a substrate W held in an arbitrary substrate-holding position in the FOUP F can be conveyed to a holding groove having an arbitrary height of the first holding mechanism 51. Therefore, substrates W can be held by the first holding mechanism 51 in an array state differing from the array state of substrates W contained in the FOUP F. More specifically, substrates W can be held by the first holding mechanism 51 in order differing from the order in which substrates W are arranged in the FOUP F. Additionally, if substrates W (for example, several substrates) less than twenty-five are held with uneven intervals in the FOUP F, these substrates W can be held by the first holding mechanism 51 with even intervals. Still additionally, if several substrates W are held at the intermediate position in the FOUP F, these substrates W can be arranged collectively at the upper positions or the lower positions of the first holding mechanism 51.

A fourth operation example (one-by-one conveyance) will be described in which processed substrates W held by the posture changing mechanism 5 are conveyed to the FOUP F one by one.

The carry-in-and-out mechanism 4 rotates the holding base 41 by means of the rotation mechanism 45, and allows the one-by-one hand 39 to face the posture changing mechanism 5. Furthermore, the holding base 41 is raised or lowered by the function of the elevation mechanism 46, and, accordingly, the height of the one-by-one hand 39 is controlled so as to be a height below the housed position of a to-be-conveyed substrate W held by the first holding mechanism 51 of the posture changing mechanism 5. The height is below the housed position by a slight distance (i.e., distance shorter than the interval between the holding grooves of the first holding mechanism 51). In this state, the one-by-one-hand advancing-retreating mechanism 201 advances the one-by-one hand 39 toward the posture changing mechanism 5, and allows the one-by-one hand 39 to enter the space below the to-be-conveyed substrate W. At this time, the pair of first holding mechanisms 51 are controlled to assume a posture in which holding groove groups for processed substrates are allowed to face each other. Furthermore, the one-by-one hand 39 is in an open state (i.e., state in which the substrate W is supported by the inner substrate guides 225 and 227).

Thereafter, the holding base 41 is raised by a slight distance (which is equal to, for example, the pitch between the holding grooves of the first holding mechanism 51) by the function of the elevation mechanism 46. Accordingly, the one-by-one hand 39 is raised, and the single substrate W is scooped out from the first holding mechanism 51. In this state, the one-by-one-hand advancing-retreating mechanism 201 retreats the one-by-one hand 39. Accordingly, the single substrate W is carried out from the first holding mechanism 51.

Thereafter, the holding base 41 is rotated by the rotation mechanism 45, and the one-by-one hand 39 is allowed to face the FOUP F. Furthermore, if necessary, the holding base 41 is raised or lowered by the function of the elevation mechanism 46, and, as a result, the height of the one-by-one hand 39 is changed. Therefore, the substrate W held by the one-by-one hand 39 can be delivered to a substrate holding shelf, which has an arbitrary height, of the FOUP F.

Thereafter, the one-by-one-hand advancing-retreating mechanism 201 advances the one-by-one hand 39 toward the FOUP F, and allows the single substrate W to enter any one (which is a substrate holding shelf corresponding to the height of the one-by-one hand 39) of the plurality of substrate holding shelves in the FOUP F.

Thereafter, the holding base 41 is lowered by a slight distance (which is equal to, for example, the pitch between the substrate holding positions in the FOUP F) by the function of the elevation mechanism 46. Accordingly, the one-by-one hand 39 is lowered, and the single substrate W is delivered from the one-by-one hand 39 to the substrate holding shelf of the FOUP F. In this state, the one-by-one-hand advancing-retreating mechanism 201 retreats the one-by-one hand 39. Accordingly, the one-by-one conveyance from the posture changing mechanism 5 to the FOUP F is completed.

A plurality of substrates W can be conveyed from the posture changing mechanism 5 to the FOUP F by repeatedly performing this one-by-one conveyance. At this time, a substrate W held by an arbitrary holding groove of the first holding mechanism 51 can be conveyed to a substrate holding shelf having an arbitrary height of the FOUP F. Therefore, substrates W can be housed in the FOUP F in an array state differing from the array state of substrates W in the first holding mechanism 51. More specifically, substrates W can be housed in the FOUP F in order differing from the order in which substrates W are arranged in the first holding mechanism 51. For example, if unprocessed substrates W are conveyed to the first holding mechanism 51 while changing the arrangement of the unprocessed substrates W in the FOUP F as described in the third operation example, these substrates W can be processed, and then the substrates W that have undergone the processing can be returned to the FOUP F in the original array state.

A fifth operation example will be described in which batch conveyance and one-by-one conveyance are combined together.

For example, there is a case in which twenty-five unprocessed substrates W are taken out from one FOUP F and are conveyed to the posture changing mechanism 5, whereas a single unprocessed substrate W (for example, dummy test substrate) is taken out from another FOUP F and is conveyed to the posture changing mechanism 5, and, as a result, twenty-six substrates W in total are held by the posture changing mechanism 5.

In this case, first, the twenty-five unprocessed substrates W are conveyed from the one FOUP F to the posture changing mechanism 5 by means of batch conveyance using the batch hand 40 described in the first operation example. Thereafter, the single unprocessed substrate W is conveyed from the other FOUP F to the posture changing mechanism 5 by means of one-by-one conveyance using the one-by-one hand 39 described in the third operation example.

Another operation example can be performed as follows. In this example, twenty-five unprocessed substrates W are carried out in a batch manner from one FOUP F by use of the batch hand 40, and a single unprocessed substrate W is carried out from another FOUP F by use of the one-by-one hand 39, and, accordingly, twenty-six unprocessed substrates W in total are held by the carry-in-and-out mechanism 4. Thereafter, preferably, the one-by-one hand 39 and the batch hand 40 are rotated by the rotation mechanism 45 until these hands face the posture changing mechanism 5, and then the twenty-five substrates W are carried into the posture changing mechanism 5 in a batch manner using the batch hand 40, and the remaining single substrate W is carried into the posture changing mechanism 5 by use of the one-by-one hand 39.

On the other hand, there is a case in which twenty-six processed substrates W are held by the posture changing mechanism 5, and twenty-five of the twenty-six processed substrates W are contained in one FOUP F, whereas the remaining single substrate W (for example, dummy test substrate) is contained in another FOUP F.

In this case, first, the twenty-five processed substrates W are conveyed from the posture changing mechanism 5 to the one FOUP F by means of batch conveyance using the batch hand 40 described in the second operation example. Thereafter, the single processed substrate W is conveyed from the posture changing mechanism 5 to the other FOUP F by means of one-by-one conveyance using the one-by-one hand 39 described in the fourth operation example.

Another operation example can be performed as follows. In this example, twenty-five processed substrates W are carried out in a batch manner from the posture changing mechanism 5 by use of the batch hand 40, and the remaining single processed substrate W is carried out therefrom by use of the one-by-one hand 39, and, accordingly, twenty-six processed substrates W in total are held by the carry-in-and-out mechanism 4. Thereafter, preferably, the one-by-one hand 39 and the batch hand 40 are rotated by the rotation mechanism 45 until these hands face a FOUP F, and then the twenty-five substrates W are carried into one of the FOUP F in a batch manner using the batch hand 40, and the remaining single substrate W is carried into another FOUP F by use of the one-by-one hand 39.

Switching between batch conveyance and one-by-one conveyance may be performed according to the number of substrates contained in a FOUP F held by the FOUP holding portion 1. For example, if unprocessed substrates W the number of which exceeds a predetermined number are contained in a FOUP F, batch conveyance according to the first operation example may be performed, and, on the other hand, if unprocessed substrates W the number of which is less than a predetermined number are contained in a FOUP F, one-by-one conveyance according to the third operation example may be performed. Of course, even if twenty-five substrates W are contained in the FOUP F, one-by-one conveyance according to the third operation example may be applied in order to change the arranging order of the substrates W.

As described above, according to this embodiment, the one-by-one-hand advancing-retreating mechanism 201 and the batch-hand advancing-retreating mechanism 202 are held together by the holding base 41, and the one-by-one hand 39 and the batch hand 40 are advanced and retreated independently of each other by these mechanisms. Additionally, the holding base 41 is rotated by the rotation mechanism 45 around the vertical axis line, and is raised and lowered by the elevation mechanism 46, and, accordingly, the rotation mechanism 45 and the elevation mechanism 46 are shared by the one-by-one hand 39 and the batch hand 40.

The thus formed structure makes it possible to perform quick switching between batch conveyance by use of the batch hand 40 and one-by-one conveyance by use of the one-by-one hand 39, and hence a time for exchange the hands for each other is not required. Additionally, the structure is not formed to require the synchronous driving of a plurality of shafts for the horizontal conveyance of substrates W like a vertical articulated arm type robot, and hence substrates W can be conveyed at higher speed. Therefore, the substrate processing speed can be improved.

Additionally, there is no need to use a conveying mechanism having a complex structure like a vertical articulated arm type robot, and there is no need to use a hand exchange unit, and hence the structure can be simplified, and costs can be reduced in accordance with this simplification. As mentioned above, there is no need to use a hand exchange unit, and hence it is also possible to contribute to a reduction in the footprint of the substrate processing apparatus.

Additionally, the one-by-one hand 39 can properly use the substrate guides 225, 227 and 226, 228 for unprocessed substrates W and processed substrates W, respectively, by changing the interval between the two hand elements 186 disposed apart from each other in the horizontal direction. Therefore, because the exchange of the hands is not required, it is possible to contribute to an increase in speed of substrate processing.

Although the embodiment of the present invention has been described as above, the present invention can be embodied in other forms. For example, although the intermediary mechanism 72 is disposed in the above-mentioned embodiment, this intermediary mechanism 72 may be omitted. In this case, unprocessed substrates W conveyed to the substrate delivery position P by means of the carry-in chuck 74 will be delivered directly to the main transfer mechanism 3 from the carry-in chuck 74.

Additionally, although the expelling chuck 73 is disposed above the carry-in chuck 74 in the above-mentioned embodiment, the above-below relationship between the expelling chuck 73 and the carry-in chuck 74 may be reversed.

Additionally, although the batch hand 40 is disposed above the one-by-one hand 39 in the above-mentioned embodiment, the above-below relationship between the batch hand 40 and the one-by-one hand 39 may be reversed.

Additionally, although an example has been described in which the present invention is applied to the carry-in-and-out mechanism 4 that performs substrate W conveyance between the FOUP F and the posture changing mechanism 5 in the above-mentioned embodiment, the substrate conveying apparatus of the present invention may be applied to substrate conveyance that is performed between substrate-conveyance places other than between the FOUP and the posture changing mechanism.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The present application corresponds to Japanese Patent Application Nos. 2008-234273, 2008-234274, and filed in the Japan Patent Office on Sep. 12, 2008, Sep. 12, 2008, and Jul. 14, 2009, respectively, and the entire disclosures of the applications are incorporated herein by reference.

What is claimed is:

1. A substrate processing apparatus defining therein a horizontal and a vertical direction, comprising:
    a substrate processing section that processes a plurality of substrates assuming a vertical posture in a batch manner;
    a first traversing mechanism that horizontally moves a first traverse holding portion along a first traversing path between a substrate transfer position and a substrate delivery position, the first traversing path having a first end disposed vertically above the substrate transfer position and a second end disposed vertically above the substrate delivery position in plan view, the first traverse holding portion holding a plurality of substrates assuming a vertical posture in a batch manner;
    a second traversing mechanism that horizontally moves a second traverse holding portion along a second traversing path disposed vertically below the first traversing path, thereby overlapping the first traversing path in the vertical direction between the substrate transfer position and the substrate delivery position, the second traversing path having a third end disposed vertically above the substrate transfer position and a fourth end disposed vertically above on the substrate delivery position, the second traversing path entirely overlapping the first traversing path in the vertical direction between the third end and the fourth end, the second traverse holding portion holding a plurality of substrates assuming a vertical posture in a batch manner;
    an elevation mechanism that raises and lowers an elevation holding portion in the substrate transfer position, the elevation holding portion holding a plurality of substrates assuming a vertical posture in a batch manner; and
    a main transfer mechanism that conveys a plurality of substrates assuming a vertical posture in a batch manner between the substrate delivery position and the substrate processing section.

2. The substrate processing apparatus according to claim 1, further comprising:
    a posture changing mechanism, the posture changing mechanism changing a plurality of substrates assuming a horizontal posture from the horizontal posture to a vertical posture in a batch manner and then delivering the plurality of substrates to the elevation mechanism located in the substrate transfer position, the posture changing mechanism receiving a plurality of substrates held in a vertical posture by the elevation mechanism located in the substrate transfer position in a batch manner and then changing the plurality of substrates from the vertical posture to a horizontal posture.

3. The substrate processing apparatus according to claim 2, further comprising:
   a pod holding portion that holds a pod containing a plurality of substrates assuming a horizontal posture; and
   a carry-in-and-out mechanism that transfers a plurality of substrates assuming a horizontal posture into and from the pod held by the pod holding portion in a batch manner, and that delivers the plurality of substrates assuming the horizontal posture to and from the posture changing mechanism in a batch manner.

4. The substrate processing apparatus according to claim 3, wherein a first substrate conveying path between the carry-in-and-out mechanism and the elevation mechanism and a second substrate conveying path between the elevation mechanism and the substrate delivery position intersect with each other at a predetermined angle, and wherein the elevation mechanism is disposed at an intersection of the first substrate conveying path and the second substrate conveying path.

5. The substrate processing apparatus according to claim 4, wherein the carry-in-and-out mechanism includes:
   a batch hand that holds a plurality of substrates assuming a horizontal posture;
   a hand advancing-retreating mechanism that advances and retreats the batch hand in a horizontal direction; and
   a rotation mechanism that rotates the batch hand around a vertical axis line,
   wherein a hand advance-retreat direction taken when the batch hand accesses the pod held by the pod holding portion is a horizontal direction perpendicular to the second substrate conveying path.

6. The substrate processing apparatus according to claim 5, wherein the elevation mechanism includes a rotation driving mechanism that rotates the elevation holding portion around a vertical axis line between a first posture in which a plurality of substrates assuming a vertical posture are held along the first substrate conveying path and a second posture in which a plurality of substrates assuming a vertical posture are held along the second substrate conveying path.

7. The substrate processing apparatus according to claim 1, wherein the elevation mechanism raises and lowers the elevation holding portion in the vertical direction to a position for delivering a plurality of substrates assuming a vertical posture from the elevation holding portion to the second traverse holding portion in a batch manner; and to a position for allowing the elevation holding portion to receive the plurality of substrates assuming a vertical posture that are held by the first traverse holding portion in a batch manner.

8. The substrate processing apparatus according to claim 1, further comprising an intermediary mechanism that raises and lowers an intermediary holding portion that holds a plurality of substrates in a batch manner in the substrate delivery position.

9. The substrate processing apparatus according to claim 8, wherein the intermediary mechanism delivers a plurality of substrates to and from the second traverse holding portion in a batch manner by raising and lowering the intermediary holding portion in the substrate delivery position.

10. The substrate processing apparatus according to claim 9, wherein the main transfer mechanism delivers a plurality of substrates to and from the first traverse holding portion and to and from the intermediary holding portion in the substrate delivery position in a batch manner.

11. The substrate processing apparatus according to claim 1, further comprising a substrate-direction aligning mechanism that is disposed below the second traversing path in the substrate delivery position, and that aligns directions of a plurality of substrates.

12. The substrate processing apparatus according to claim 11, wherein the substrate-direction aligning mechanism aligns directions of the substrates being held by the second traverse holding portion in the substrate delivery position.

13. The substrate processing apparatus according to claim 1, wherein the first traverse holding portion includes:
   a pair of substrate guides parallel to each other, and
   a guide opening-and-closing unit for changing an interval between the pair of substrate guides between an open state in which the interval therebetween is wider than a width of the substrate and a closed state in which the interval therebetween is narrower than the width of the substrate and is wider than a width of the elevation holding portion.

* * * * *